(12) United States Patent
Maenishi

(10) Patent No.: US 8,407,889 B2
(45) Date of Patent: Apr. 2, 2013

(54) COMPONENT MOUNTING CONDITION DETERMINATION METHOD

(75) Inventor: Yasuhiro Maenishi, Saga (JP)

(73) Assignee: Panasonic Corporation, Osaka (JP)

( * ) Notice: Subject to any disclaimer, the term of this patent is extended or adjusted under 35 U.S.C. 154(b) by 3 days.

(21) Appl. No.: 12/281,794

(22) PCT Filed: Mar. 2, 2007

(86) PCT No.: PCT/JP2007/054611
§ 371 (c)(1),
(2), (4) Date: Sep. 5, 2008

(87) PCT Pub. No.: WO2007/105608
PCT Pub. Date: Sep. 20, 2007

(65) Prior Publication Data
US 2009/0044401 A1    Feb. 19, 2009

(30) Foreign Application Priority Data

Mar. 7, 2006  (JP) ................................. 2006-061884
Mar. 15, 2006  (JP) ................................. 2006-070871

(51) Int. Cl.
*H05K 3/30* (2006.01)
*H05K 3/34* (2006.01)
(52) U.S. Cl. .......................................... 29/832; 29/834
(58) Field of Classification Search .............. 29/832, 29/739, 743, 834
See application file for complete search history.

(56) References Cited

U.S. PATENT DOCUMENTS

| | | | | |
|---|---|---|---|---|
| 5,961,168 A | * | 10/1999 | Kanno | ........................ 294/185 |
| 6,006,425 A | | 12/1999 | Fukukura et al. | |
| 6,384,360 B1 | * | 5/2002 | Masuo et al. | ................. 209/573 |
| 6,996,440 B2 | * | 2/2006 | Maenishi et al. | ............... 700/28 |
| 7,023,197 B2 | * | 4/2006 | Jung | ........................ 324/757.01 |
| 2003/0131468 A1 | * | 7/2003 | Yasuda | ............................ 29/739 |
| 2004/0073322 A1 | * | 4/2004 | Maenishi et al. | ............... 700/28 |
| 2005/0125993 A1 | * | 6/2005 | Madsen et al. | ................... 29/739 |
| 2006/0047353 A1 | * | 3/2006 | Maenishi et al. | ............. 700/100 |

FOREIGN PATENT DOCUMENTS

| | | |
|---|---|---|
| CN | 1184761 | 6/1998 |
| CN | 1585599 | 2/2005 |

(Continued)

OTHER PUBLICATIONS

International Search Report issued Jul. 23, 2007 in the International (PCT) Application of which the present application is the U.S. National Stage.

*Primary Examiner* — David Angwin
(74) *Attorney, Agent, or Firm* — Wenderoth, Lind & Ponack, L.L.P.

(57) ABSTRACT

A component mounting condition determination method is used in a component mounter of mounting components onto a board using a mounting head having plural suction nozzles, and includes: a maximum suction component number determination step (Loop A, S11 to S16) of determining the maximum number of components to be suctioned by the mounting head so as to be greater than an upper limit of a suction power within which the suction nozzles do not drop components even when the mounting head moves at a predetermined speed; and a task determination step (S18 to S20) of determining a task which is a group of components to be mounted in one iteration of a series of operations that includes suctioning, transporting, and mounting components by the mounting head, based on the determined maximum number of components.

6 Claims, 52 Drawing Sheets

FOREIGN PATENT DOCUMENTS

| | | |
|---|---|---|
| EP | 1 542 524 | 6/2005 |
| EP | 1 634 680 | 3/2006 |
| JP | 06-310898 | 11/1994 |
| JP | 8-111597 | 4/1996 |
| JP | 8-162798 | 6/1996 |
| JP | 09-023089 | 1/1997 |
| JP | 10-256792 | 9/1998 |
| JP | 11-330788 | 11/1999 |
| JP | 2000-277996 | 10/2000 |
| JP | 2002-050900 | 2/2002 |
| JP | 3473730 | 12/2003 |
| JP | 2004-6530 | 1/2004 |
| JP | 2004-006530 | * 1/2004 |
| JP | 2004006530 | * 1/2004 |
| JP | 2004-71830 | 3/2004 |
| JP | 2005-123487 | 5/2005 |
| WO | 2004/106010 | 12/2004 |

* cited by examiner

|  | SX | SA | S | M |
|---|---|---|---|---|
| Number of suction components 0 | -85 | -85 | -85 | -85 |
| Number of suction components 1 | -81 | -77 | -70 | -52 |
| Number of suction components 2 | -79 | -72 | -59 | -33 |
| Number of suction components 3 | -78 | -65 | -49 | -24 |
| Number of suction components 4 | -77 | -59 | -41 | -17 | unit:kPa

FIG. 14

| Component name | Maximum number of suction components |
|---|---|
| A | 2 |
| B | 5 |
| C | 3 |
| D | 4 |
| E | 8 |
| ⋮ | ⋮ |

| Component name | (Component external view) | Component size (mm) | | | Two-dimensional recognition method | Suction nozzle | Tact (seconds) | Head speed level |
|---|---|---|---|---|---|---|---|---|
| | | X | Y | L | | | | |
| 0603CR | | 0.6 | 0.3 | 0.25 | | SX | 0.086 | 1 |
| 1005CR | | 1.0 | 0.5 | 0.3-0.5 | | SA | | |
| 1608CR | | 1.6 | 0.8 | 0.4-0.8 | | S | 0.094 | |
| 2012CR | | 2.0 | 1.25 | 0.4-0.8 | | | | |
| 3216CR | | 3.2 | 1.6 | 0.4-0.8 | | | | |
| 4TR | | 2.8 | 2.8 | 1.1 | Reflection | Cylindrical chip | 0.11 | |
| 6TR | | 4.3 | 4.5 | 1.5 | | | | |
| 1TIP | | 2.0 | φ1.0 | - | | | | |
| 2TIP | | 3.6 | φ1.4 | - | | | | |
| 1CAP | | 3.8 | 1.9 | 1.6 | | S | | |
| 2CAP | | 4.7 | 2.6 | 2.1 | | | | |
| 3CAP | | 6.0 | 3.2 | 2.5 | | M | | |
| 4CAP | | 7.3 | 4.3 | 2.8 | | | | |
| SCAP | | 4.3 | 4.3 | 6.0 | | | | |
| LCAP | | 6.6 | 6.6 | 6.0 | | | | |
| LLCAP | | 10.3 | 10.3 | 10.5 | | ML | | |
| 1VOL | | 4.5 | 3.8 | 1.6-2.4 | | M | 0.13 | 2 |
| 2VOL | | 3.7 | 3.0 | 1.6 | | | | |
| 3VOL | | 4.8 | 4.0 | 3.0 | | | | |

FIG. 20

| Component type | Use data | Determination formula | | | | Head speed level |
|---|---|---|---|---|---|---|
| General box-type | Thickness T | | < T <= | 0.8 | | 1 |
| | Thickness T | 0.8 | < T <= | 1.2 | | 3 |
| | Thickness T | 1.2 | < T <= | 2 | | 5 |
| | Thickness T | 2 | < T <= | | | 6 |
| Square chip resistor | Thickness T | | < T <= | 0.8 | | 1 |
| | Thickness T | 0.8 | < T <= | 1.2 | | 3 |
| | Thickness T | 1.2 | < T <= | 2 | | 5 |
| | Thickness T | 2 | < T <= | | | 6 |
| Square chip capacitor | Thickness T | | < T <= | 0.8 | | 1 |
| | Thickness T | 0.8 | < T <= | 1.2 | | 3 |
| | Thickness T | 1.2 | < T <= | 2 | | 5 |
| | Thickness T | 2 | < T <= | | | 6 |
| Tantalum capacitor /internal electrode component | Volume V | | < T <= | 10 | | 1 |
| | Volume V | 10 | < T <= | 50 | | 3 |
| | Volume V | 50 | < T <= | 90 | | 3 |
| | Volume V | 90 | < T <= | | | 6 |
| Aluminum electrolytic capacitor | Volume V | | < T <= | 280 | | 5 |
| | Volume V | 280 | < T <= | | | 10 |
| Internal cylinder chip | Volume V | | < T <= | 8 | | 7 |
| | Volume V | 8 | < T <= | | | 10 |
| Transistor/external electrode component | Volume V | | < T <= | 6 | | 1 |
| | Volume V | 6 | < T <= | 20 | | 3 |
| | Volume V | 20 | < T <= | | | 6 |
| QFP/SOP | Volume V | | < T <= | 50 | | 3 |
| | Volume V | 50 | < T <= | 500 | | 6 |
| | Volume V | 500 | < T <= | 1000 | | 7 |
| | Volume V | 1000 | < T <= | 2000 | | 9 |
| | Volume V | 2000 | < T <= | | | 11 |
| PLCC/SOJ/LCC | Volume V | | < T <= | 50 | | 3 |
| | Volume V | 50 | < T <= | 500 | | 4 |
| | Volume V | 500 | < T <= | 1000 | | 6 |
| | Volume V | 1000 | < T <= | 2000 | | 8 |
| | Volume V | 2000 | < T <= | | | 10 |

FIG. 49

| Component name | (Component external view) | Component size (mm) | | | Two-dimensional recognition method | Suction nozzle | Tact (seconds) | Speed XY | Maximum number of suction components |
|---|---|---|---|---|---|---|---|---|---|
| | | X | Y | L | | | | | |
| 0603CR | | 0.6 | 0.3 | 0.25 | Reflection | SX | 0.086 | 1 | 10 |
| 1005CR | | 1.0 | 0.5 | 0.3-0.5 | | SA | | | 10 |
| 1608CR | | 1.6 | 0.8 | 0.4-0.8 | | S | 0.094 | | 10 |
| 2012CR | | 2.0 | 1.25 | 0.4-0.8 | | | | | 10 |
| 3216CR | | 3.2 | 1.6 | 0.4-0.8 | | | | | 9 |
| 4TR | | 2.8 | 2.8 | 1.1 | | | | | 10 |
| 6TR | | 4.3 | 4.5 | 1.5 | | | | | 9 |
| 1TIP | | 2.0 | φ1.0 | - | | Cylindrical chip | 0.11 | | 8 |
| 2TIP | | 3.6 | φ1.4 | - | | | | | 6 |
| 1CAP | | 3.8 | 1.9 | 1.6 | | S | | | 6 |
| 2CAP | | 4.7 | 2.6 | 2.1 | | | | | 5 |
| 3CAP | | 6.0 | 3.2 | 2.5 | | M | | | 6 |
| 4CAP | | 7.3 | 4.3 | 2.8 | | | | | 5 |
| SCAP | | 4.3 | 4.3 | 6.0 | | | | | 4 |
| LCAP | | 6.6 | 6.6 | 6.0 | | | | | 4 |
| LLCAP | | 10.3 | 10.3 | 10.5 | | ML | | | 6 |
| 1VOL | | 4.5 | 3.8 | 1.6-2.4 | | M | 0.13 | 2 | 3 |
| 2VOL | | 3.7 | 3.0 | 1.6 | | | | | 3 |
| 3VOL | | 4.8 | 4.0 | 3.0 | | | | | 4 |

| Leakage parameter | Degree of head speed change |
|---|---|
| 0 | Unchanged |
| 1 | Decreased 10% |
| 2 | Decreased 20% |
| ⋮ | ⋮ |
| 5 | Decreased 50% |
| ⋮ | ⋮ |

| Component name | (Component external view) | Component size (mm) | | | Two-dimensional recognition method | Suction nozzle | Tact (seconds) | Head speed | Post-change head speed |
|---|---|---|---|---|---|---|---|---|---|
| | | X | Y | L | | | | | |
| 0603CR | | 0.6 | 0.3 | 0.25 | | SX | 0.086 | 1 | 2 |
| 1005CR | | 1.0 | 0.5 | 0.3-0.5 | | SA | | | 2 |
| 1608CR | | 1.6 | 0.8 | 0.4-0.8 | | S | 0.094 | | 3 |
| 2012CR | | 2.0 | 1.25 | 0.4-0.8 | | | | | 2 |
| 3216CR | | 3.2 | 1.6 | 0.4-0.8 | | | | | 1 |
| 4TR | | 2.8 | 2.8 | 1.1 | | | | | 1 |
| 6TR | | 4.3 | 4.5 | 1.5 | | | | | 1 |
| 1TIP | | 2.0 | φ1.0 | - | | Cylindrical chip | 0.11 | | 2 |
| 2TIP | | 3.6 | φ1.4 | - | | | | | 2 |
| 1CAP | | 3.8 | 1.9 | 1.6 | Reflection | S | | | 1 |
| 2CAP | | 4.7 | 2.6 | 2.1 | | | | | 3 |
| 3CAP | | 6.0 | 3.2 | 2.5 | | | | | 2 |
| 4CAP | | 7.3 | 4.3 | 2.8 | | M | | | 2 |
| SCAP | | 4.3 | 4.3 | 6.0 | | | | | 3 |
| LCAP | | 6.6 | 6.6 | 6.0 | | | | | 2 |
| LLCAP | | 10.3 | 10.3 | 10.5 | | ML | | | 3 |
| 1VOL | | 4.5 | 3.8 | 1.6-2.4 | | | | | 3 |
| 2VOL | | 3.7 | 3.0 | 1.6 | | M | 0.13 | 2 | 4 |
| 3VOL | | 4.8 | 4.0 | 3.0 | | | | | 4 |

| Suction pressure (P) / Head speed level | P≧50kPa | 50kPa>P≧40kPa | 40kPa>P≧30kPa | 30kPa>P≧20kPa |
|---|---|---|---|---|
| 1 | 1 | 1 | 2 | 3 |
| 2 | 2 | 2 | 3 | 4 |
| 3 | 3 | 3 | 4 | 4 |
| 4 | 4 | 4 | NA | NA |

420a

NA : No suction

FIG. 63

| Gap area (a) | Head speed level |
|---|---|
| $0 \leqq a < 20mm^2$ | 1 |
| $20mm^2 \leqq a < 30mm^2$ | 2 |
| ⋮ | ⋮ |

COMPONENT MOUNTING CONDITION DETERMINATION METHOD

TECHNICAL FIELD

The present invention relates to a component mounting condition determination method, in particular to a component mounting condition determination method for use in a component mounter which mounts components onto a board.

BACKGROUND ART

The component mounter, which mounts electric components onto a board such as a printed wiring board, optimizes an order of mounting target components in order to produce the board in the shorter period of tact time (mounting duration). As an example of this optimization method, it is suggested a method of suctioning as many components as possible at once and mounting the suctioned components onto a board using a mounting head. This method provides an order of mounting components with good production efficiency (For example, refer to Patent Reference 1: Japanese Patent Application Laid-Open Publication No. 2002-50900).

However, the conventional method of optimizing an order of mounting components determines the order of mounting components without considering a decrease in suction power of the mounting heads to suction the respective components. In other words, suction nozzles hold the components while suctioning the components in vacuum. However, for example, in the case where a diameter of a suction nozzle is too large for the size of a component, a gap appears between the component and the suction nozzle. When the gap appears, air is leaked from the gap, causing a decrease in the suction power of the suction nozzle to suction the component.

The method disclosed in the Patent Reference 1 determines an order of mounting components without considering the decrease in the suction power due to the air leakage. Therefore, there is a problem that a suctioned component may be dropped or a suction position of the component is misaligned when the mounting head moves, after a suction state of the component is recognized by a camera.

A phenomenon of dropping components due to air leakage shall be described with reference to FIG. 1 and FIG. 2.

FIG. 1 is a schematic diagram of a mounting head. A mounting head 8 includes four suction nozzles 12a to 12d. The suction nozzles 12a to 12d are connected to a vacuum room 11 which is placed in the mounting head 8. The vacuum room 11 is also connected to a vacuum generation apparatus 16, which vacuums air in the vacuum room 11 so as to make the vacuum room 11 in a vacuumed state. Accordingly, the suction nozzles 12a to 12d which are connected to the vacuum room 11 can suction respective components 14a to 14d by air-vacuum.

Furthermore, vacuum pressures necessary for suctioning the components 14a to 14d are respectively −20 kPa, −30 kPa, −15 kPa, and −20 kPa as shown in FIG. 1.

FIG. 2 is a graphic chart which shows a relationship between the number of components to be suctioned and a vacuum pressure in the vacuum room 11. Here, the vacuum pressure is a gauge pressure when an atmospheric pressure is 0 kPa. As shown in FIG. 2, when the suction nozzles 12a to 12d do not suction any components, all valves of the suction nozzles 12a to 12d are being closed. Therefore, the vacuum pressure in the vacuum room 11 is −40 kPa. On the other hand, as components are sequentially suctioned one by one, air leakage occurs due to a gap between the suctioned component and a suction nozzle. Therefore, the vacuum pressure in the vacuum room 11 is gradually increased from −40 kPa. When four components are suctioned, the vacuum pressure in the vacuum room 11 is higher than −30 kPa. In order to hold the component 14b, the vacuum pressure of less than or equal to −30 kPa is required. Consequently, the suction nozzle 12b can no longer suction the component 14b by air-vacuum, and drops the component 14b. When the component 14b is dropped, the valve of the suction nozzle 12b is kept open so that air bursts out from the suction nozzle 12b. Therefore, the vacuum pressure in the vacuum room 11 is further increased, causing the suction nozzles 12a and 12d to drop the components 14a and 14d. When the components 14a and 14d are dropped, the vacuum pressure in the vacuum room 11 is further increased, causing the suction nozzle 12c to also drop the components 14c. As a result, all components are dropped.

Furthermore, when only three components are suctioned, the vacuum pressure indicates a value which is less than −30 kPa but closer to −30 kPa. Therefore, the suction power of the suction nozzle 12b to suction the component 14b is insufficient, causing a positional misalignment of the component 14b or a drop of the component 14b when the mounting head moves.

Note that, FIG. 3 and FIG. 4 are diagrams, each showing, for each size of a suction nozzle, a relationship between the number of components to be suctioned and a vacuum pressure in the vacuum room 11. FIG. 3 and FIG. 4 are respectively a table and a graphic chart showing the relationship. The inner diameters of suction nozzles are larger in order of SX, SA, S, and M. As shown in FIG. 3 and FIG. 4, an increase in the vacuum pressures along with an increase in the number of components to be suctioned is greater for a suction nozzle with a larger inner diameter. This is because a gap appeared between the component and the suction nozzle when the component is suctioned is greater as the inner diameter of the suction nozzle is larger.

DISCLOSURE OF INVENTION

In order to solve the above-identified problems, an object of the present invention is to provide a component mounting condition determination method of determining component mounting conditions for mounting components at an accurate positional precision and in a short mounting duration even in the case where the power of suctioning the components are decreased due to air leakage.

In order to achieve the aforementioned object, the component mounting condition determination method according to the present invention is a component mounting condition determination method for use in a component mounter which mounts components onto a board using a mounting head having plural suction nozzles. The component mounting condition determination method includes a component mounting condition determination step of obtaining parameters regarding suction power of the respective suction nozzles to suction the components, and determining a component mounting condition so that the suction nozzles do not drop the components when suctioning the components with the suction power specified by the obtained parameters.

It is preferred that the component mounting condition determination step includes a maximum suction component number determination step of determining, for each component type, a maximum number of components to be suctioned by the mounting head so that the suction power of the respective suction nozzles are equal to or greater than transportable suction power which is an upper limit of suction power within which the suction nozzles do not drop the components even when the mounting head moves at a predetermined speed.

According to this method, the maximum number of components to be suctioned is determined in consideration of a decrease in the component suction power due to air leakage. Therefore, a task with a correct positional precision and a short mounting time can be determined even in the case where the component suction power is decreased due to air leakage. Here, the component suction power corresponds to a suction pressure described in the embodiments of the present invention.

It is preferred that the component mounting condition determination step includes a transportation speed decreasing step of decreasing a transportation speed of the mounting head so as to be lower than a predetermined transportation speed, in the case where a suction power of the suction nozzle during component suctioning decreases to be less than a suction power of the suction nozzle in a stationary state.

According to this method, the transportation speed of the mounting head is decreased when the suction power of the suction nozzle to suction a component is decreased. Therefore, even in the case where the suction power of the suction nozzle to suction the component is decreased, components can be mounted onto a board with a correct positional precision.

It is preferred that the transportation speed decreasing step includes: an imaging step of taking an image of a suction plane of a component being suctioned by the suction nozzle; a gap calculating step of calculating an amount of a gap which appears between the suction nozzle and the component being suctioned by the suction nozzle; a suction power obtainment step of obtaining a suction power of the suction nozzle to suction the component, based on the calculated amount of the gap; and a decreasing step of decreasing the transportation speed of the mounting head based on the obtained suction power.

Furthermore, the amount of air leakage changes in the case where the component mounter lacks a replacement component and a different type of component having the same characteristics as the original component to be replaced is used as the replacement component, because an area of the gap appeared between the suction nozzle and the newly replaced component is different from an area of the gap between the suction nozzle and the original component. However, even in such a case, this method allows determining an appropriate transportation speed of the mounting head.

The component mounting method according to another embodiment of the present invention is a component mounting method for use in a component mounter which mounts components onto a board using a mounting head having plural suction nozzles. The component mounting method includes: a maximum suction component number determination step of determining a maximum number of components to be suctioned by the mounting head so that the suction power of the respective suction nozzles are equal to or greater than transportable suction power which is an upper limit of suction power within which the suction nozzles do not drop the components even when the mounting head moves at a predetermined speed; and a component mounting step of mounting, onto a board, the components so as to be less than the determined maximum number of components to be suctioned, using the mounting head.

According to this method, the maximum number of components to be suctioned by the mounting head is determined in consideration of a decrease in the component suction power due to air leakage. Therefore, a task with a correct positional precision and a short mounting time can be determined even in the case where the component suction power is decreased due to air leakage.

It is preferred that the component mounting step further includes mounting components onto a board by decreasing a transportation speed of the mounting head to be slower than a current transportation speed, in the case where the suction power of the respective suction nozzles are greater than suction-possible suction power and less than the transportable suction power when one of the suction nozzles suctions a component from a component supply unit, the suction-possible suction power being an upper limit of suction power within which the suction nozzles do not drop the components when the mounting head moves at a speed which is decreased to be slower than the predetermined speed.

When the component suction power is less than the transportable suction power, the transportation speed of the mounting head is decreased. Therefore, the mounting head can mount components onto a circuit board while maintaining a suction pressure which is equal to or higher than a predetermined value. Furthermore, components can be mounted while maintaining a correct positional precision even in the case where the component suction pressure is decreased due to air leakage, closing of a suction nozzle, or the like.

It should be noted that the present invention can be realized not only as a component mounting condition determination method and a component mounting method having such characteristic steps, but also as a component mounting condition determination apparatus and a component mounter having, as steps, the characteristic steps included in the component mounting condition determination method and the component mounting method, and as a program for causing a computer to execute the characteristic steps included in the component mounting condition determination method and the component mounting method. It is obvious that the program can be distributed by a recording medium such as a CD-ROM (Compact Disc-Read Only Memory), or via a communication network such as the Internet.

It can be provided a component mounting condition determination method of determining component mounting conditions for mounting a component at an accurate positional precision and in a short mounting duration even in the case where the power of sucking the component is decreased due to air leakage.

As further information about technical background to this application, the disclosures of Japanese Patent Application No. 2006-61884 filed on Mar. 7, 2006, and Japanese Patent Application No. 2006-70871 filed on Mar. 15, 2006 including specification, drawings and claims are incorporated herein by reference in their entireties.

BRIEF DESCRIPTION OF DRAWINGS

These and other objects, advantages and features of the invention will become apparent from the following description thereof taken in conjunction with the accompanying drawings that illustrate a specific embodiment of the invention. In the drawings:

FIG. 14 is a diagram showing an example of a table for the maximum number of components to be suctioned;

FIG. 19 is a diagram showing an example of a component library;

FIG. 20 is a diagram showing an example of a table for determining head speed levels;

FIG. 49 is a diagram showing an example of a component library;

FIG. 52 is a diagram showing an example of a head speed update table;

FIG. 57 is a diagram showing an example of a component library;

FIG. 58 is a diagram showing an example of a head speed table;

FIG. 63 is a diagram showing a correspondence table between a gap area and a head speed level.

BEST MODE FOR CARRYING OUT THE INVENTION

Hereinafter, the present invention shall be described based on the embodiments with reference to the drawings.

First Embodiment

Figure 1:
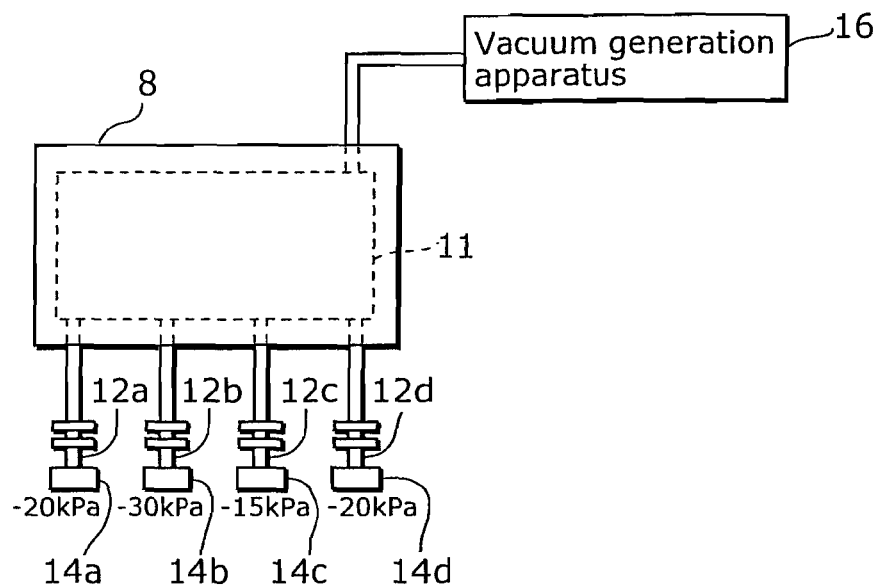
FIG. 1 is a schematic diagram of a mounting head.
Figure 2:
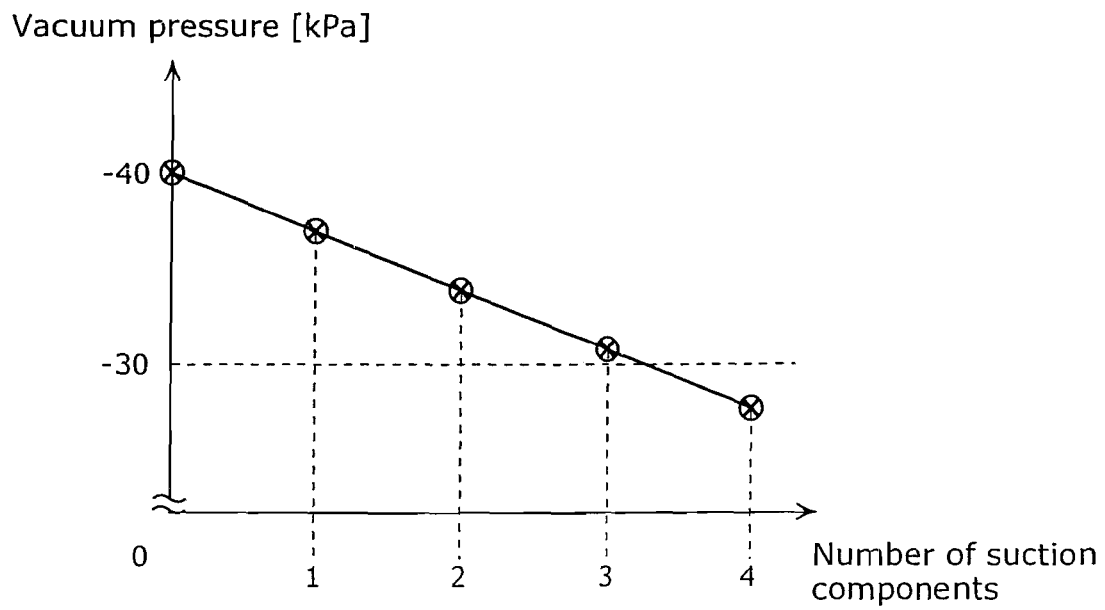
FIG. 2 is a graphic chart which shows a relationship between the number of suction components and a vacuum pressure in a vacuum room.
Figures 3, 4:
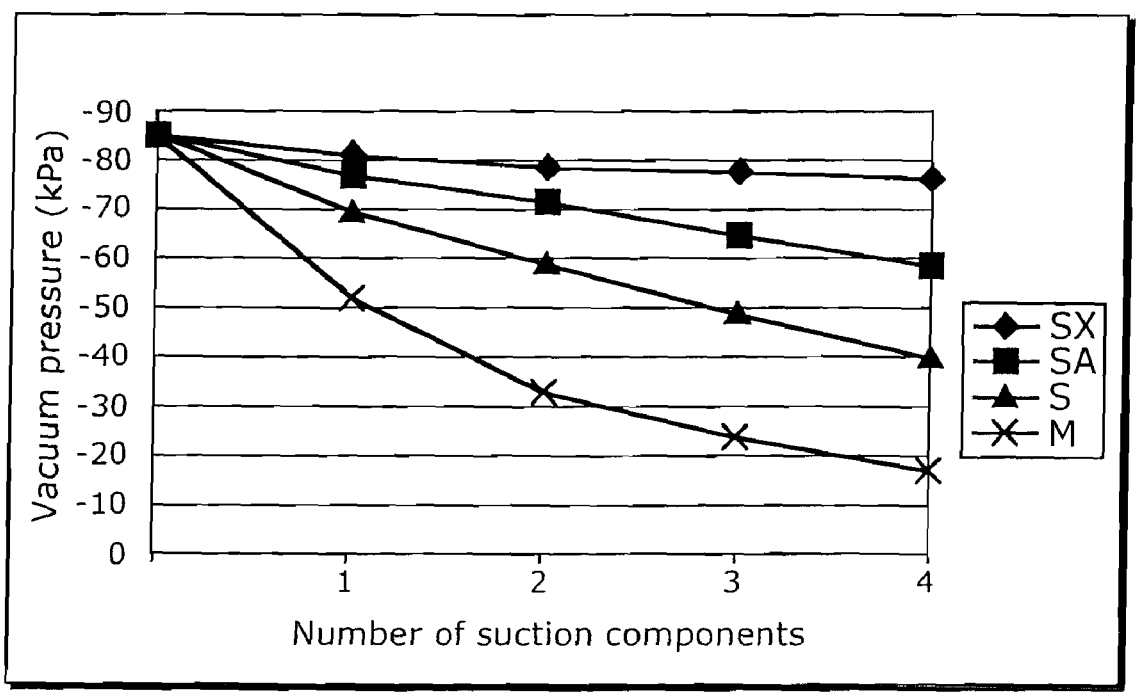
FIG. 3 is a table which show, for each size of a suction nozzle, a relationship between the number of suction components and a vacuum pressure in the vacuum room when the same type of components are suctioned.
FIG. 4 is a graphic chart which show, for each size of a suction nozzle, a relationship between the number of suction components and a vacuum pressure in the vacuum room when the same type of components are suctioned.
Figure 5:
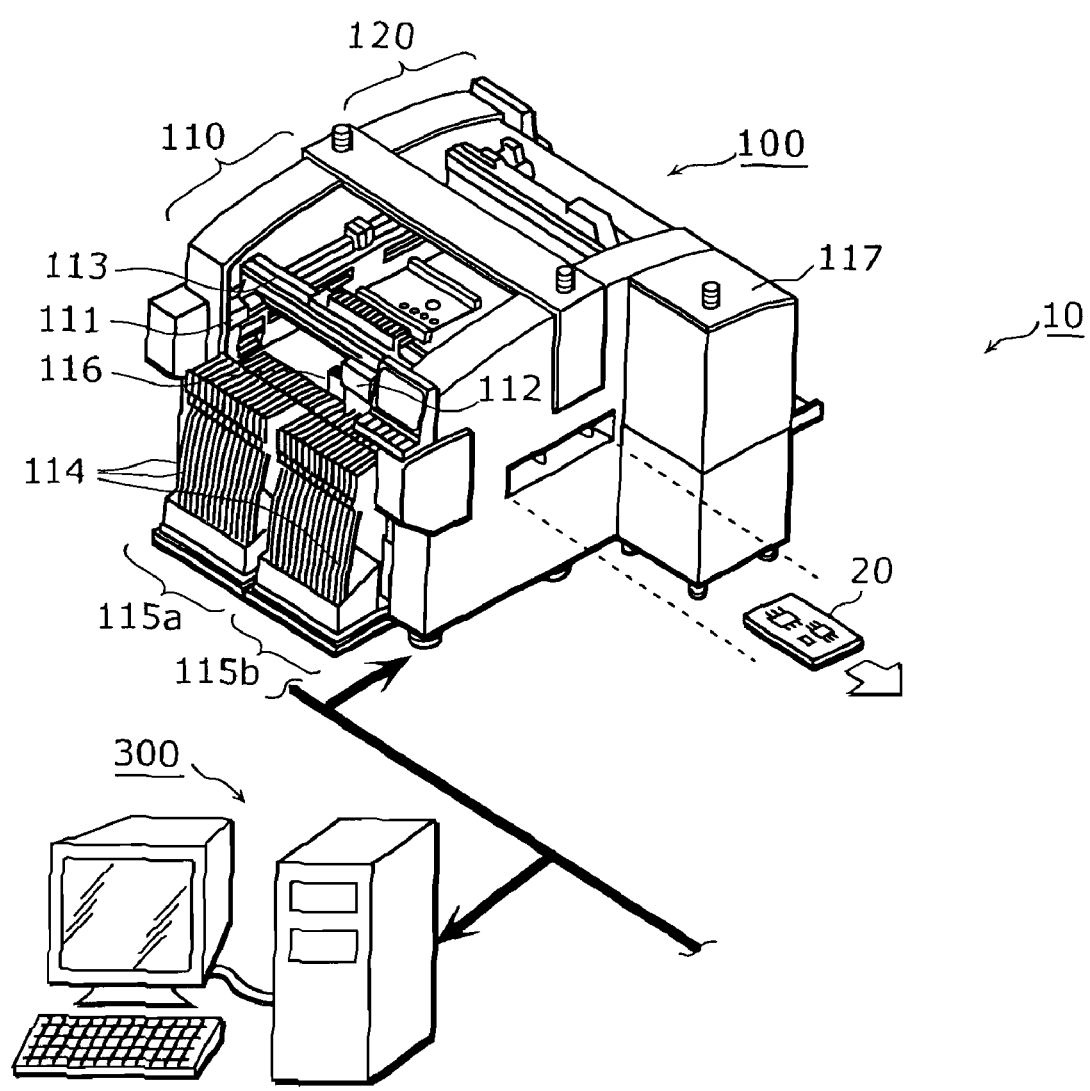
FIG. 5 is an external view of a configuration of a component mounting system according to a first embodiment.

FIG. 5 is an external view of a configuration of the component mounting system according to a first embodiment.

A component mounting system 10 is a system of mounting components onto a board so as to produce a circuit board, and includes a component mounter 100 and a mounting condition determination apparatus 300.

The component mounter 100 is an apparatus which mounts electric components while transporting a circuit board 20 from an upstream to a downstream, and includes two sub-equipments (a front sub-equipment 110 and a back sub-equipment 120) which independently mount components at the same time. Each sub-equipment 110 (120) is an orthogonal robot type mounting stage, and includes: two component supply units 115a and 115b each of which is an arrangement of maximum forty-eight component cassettes 114 for storing component tapes; a mounting head 112 (ten nozzle heads) having ten suction nozzles (hereinafter, simply referred to as "nozzle") which can suction maximum ten components from the component cassettes 114 and mount the suctioned components onto a circuit board 20; an XY robot 113 which moves the mounting head 112; a component recognition camera 116 for detecting two-dimensionally or three-dimensionally suction states of the components suctioned by the mounting head 112; and a tray supply unit 117 which supplies tray components.

Specifically, the component mounter 100 is a mounter which has functions of component mounters called a high-speed mounter and a multi-function mounter. The high-speed mounter is a device which provides a good productivity of mounting an electric component of 10 mm square or less at a speed around 0.1 seconds. The multi-function mounter is a device which mounts a large electric component of 10 mm square or larger, an odd-form component such as a switch/connector, and an IC component such as a QFP (Quad Flat Package)/BGA (Ball Grid Array).

Thus, the component mounter 100 is designed to mount almost all types of electric components (components having a chip resistor of from 0.6 mm×0.3 mm to a connector of 200 mm are to be mounted), and a production line can be configured by arranging necessary number of the component mounters 100.

Figure 6:
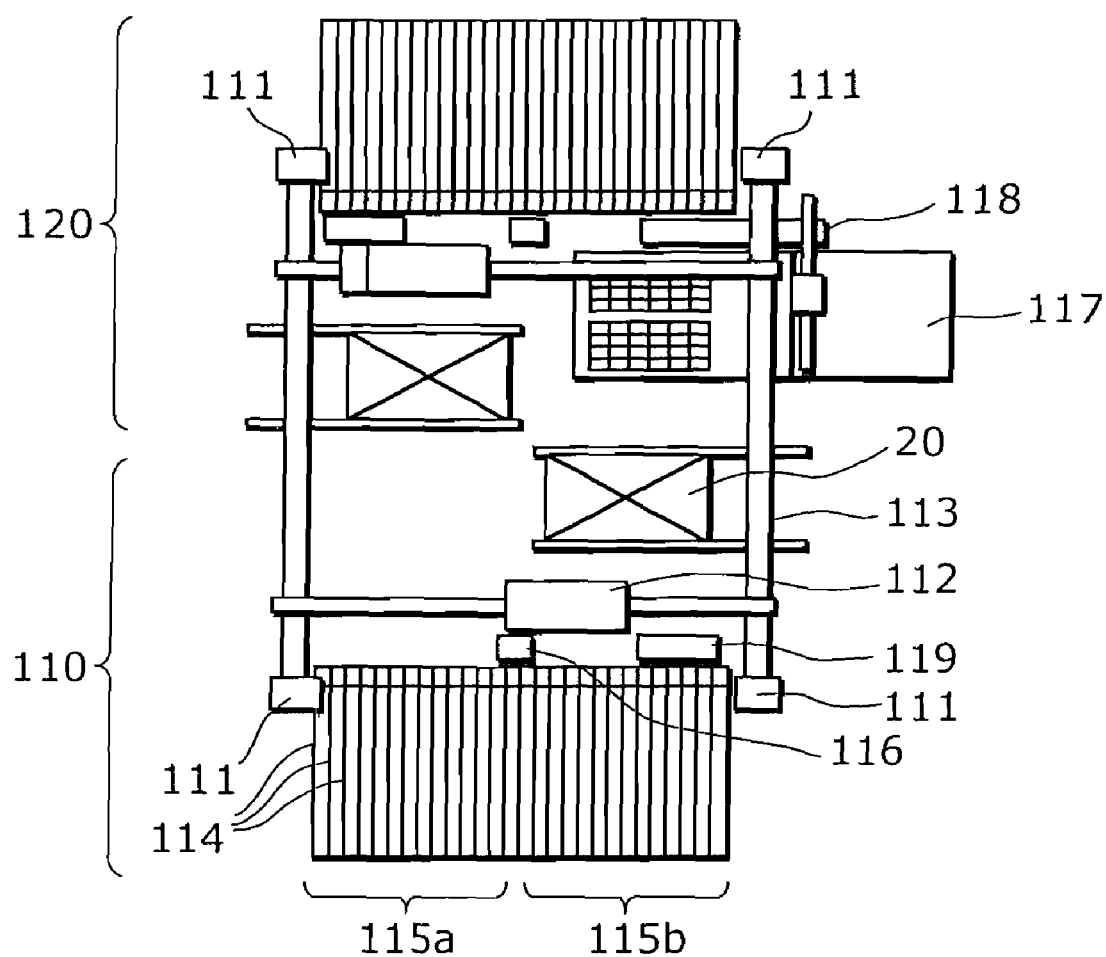
FIG. 6 is a plane diagram showing main constituent elements included in a component mounter.

FIG. 6 is a plane diagram showing main constituent elements included in the component mounter 100.

A shuttle conveyor 118 is a moving table (a component transport conveyor) for placing the components taken out from the tray supply unit 117 and transporting the components to predetermined positions from which the components can be suctioned by the mounting head 112. A nozzle station 119 is a table on which nozzles for replacements corresponding to various shapes of component types are placed.

The two component supply units 115a and 115b which are included in one of the sub-equipment 110 and 120 are positioned from side to side having the component recognition camera 116 in between. Accordingly, the mounting head 112, which has suctioned the components from the component supply units 115a or 115b, repeats, after passing through the component recognition camera 116, the operations of moving to mounting points on a circuit board 20, and sequentially mounting all the suctioned components. Here, a "mounting point" is coordinates on a board onto which components should be mounted. There is a case where the components of the same component type are mounted on different mounting points. The total number of components (mounting points) aligned on a component tape according to the same type of component is identical to the number of components of said component type (the total number of components to be mounted).

Here, a "task" is either an iteration (suctioning, transporting, and mounting) of a series of operations that includes suctioning, transporting and mounting components by the mounting head 112, or a group of components to be mounted by the iteration. For example, the mounting head 112 mounts maximum ten components by one task. Here, "suction" includes all suction operations from which a head starts picking up components and to when the head transports the picked up components. For example, it includes not only the case where ten components are suctioned by one suction operation (up-and-down movements of the mounting head 112), but also the case where ten components are suctioned by plural suction operations.

Figure 7:
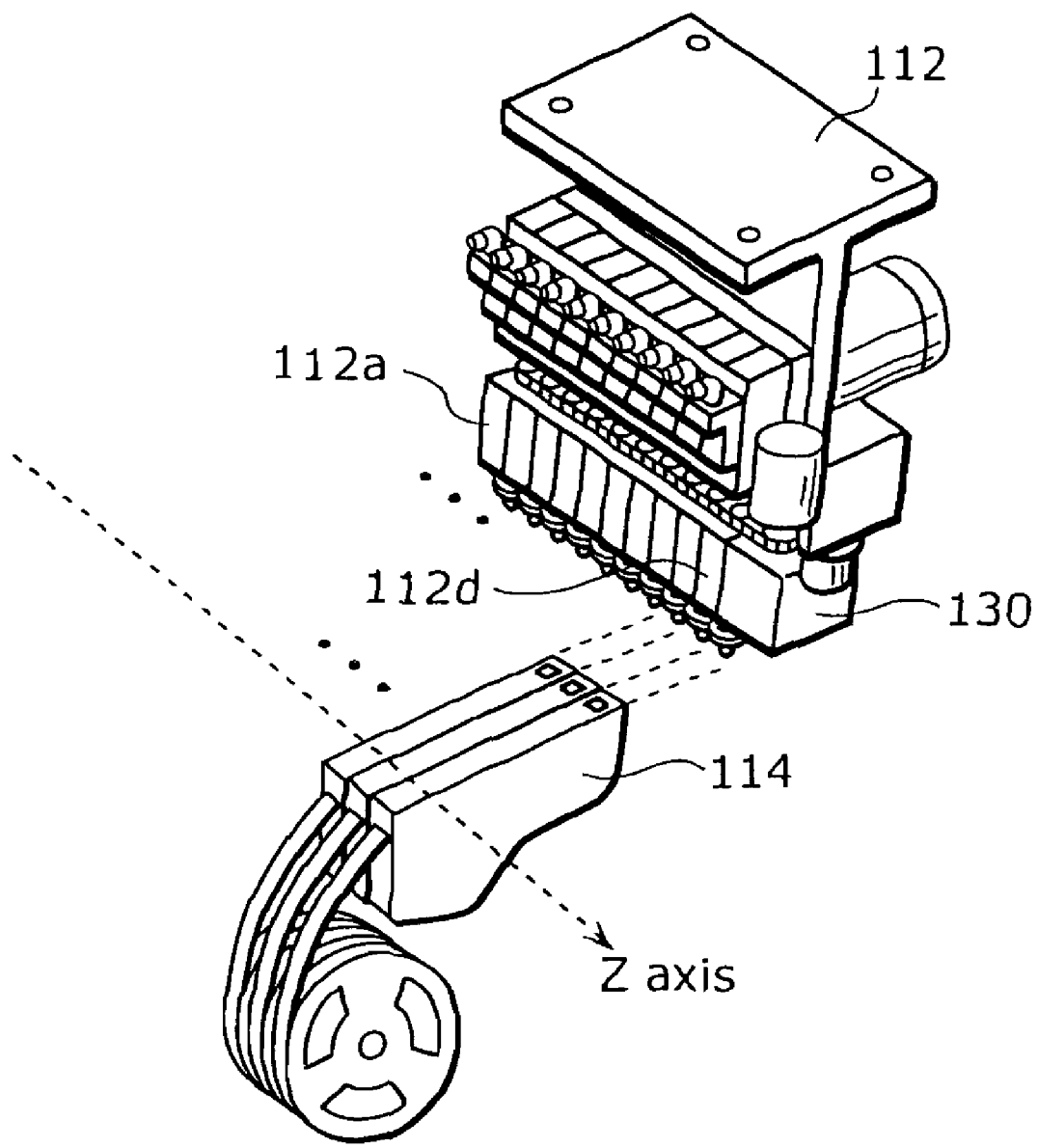
FIG. 7 is a schematic diagram which shows a positional relationship between a mounting head and component cassettes.

FIG. 7 is a schematic diagram which shows a positional relationship between the mounting head 112 and the component cassettes 114. The mounting head 112 is an operation head called a "gang pickup head", which can equip maximum ten suction nozzles 112a to 112d. Here, the suction nozzles 112a to 112d can suction components respectively from the maximum ten component cassettes 114 at the same time (by one up-down operation).

The mounting head 112 further equips a camera 130 for recognizing a shape of a component when suctioning the component from the component cassette 114.

Figure 8:
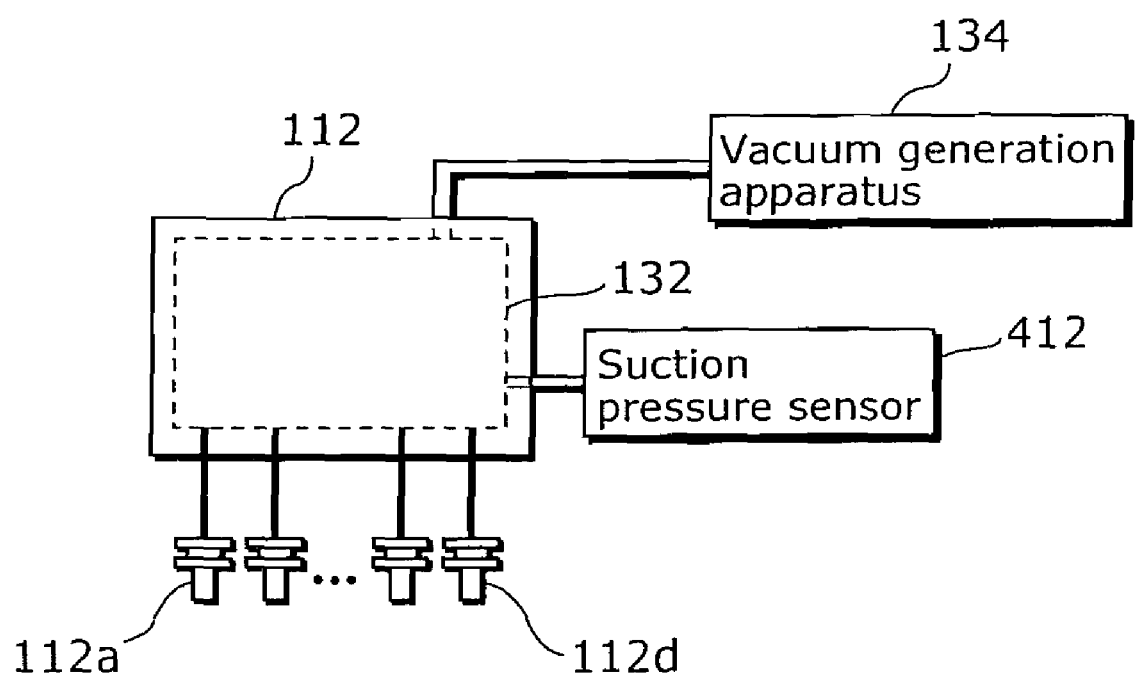
FIG. 8 is a schematic diagram of the mounting head.

FIG. 8 is a schematic diagram of the mounting head 112. The mounting head 112 equips the ten suction nozzles 112a to 112d as described above, and internally has a vacuum room 132 which is connected to the suction nozzles 112a to 112d. The vacuum room 132 is connected to a vacuum generation apparatus 134 placed in the component mounter 100 and a suction pressure sensor 412. The vacuum generation apparatus 134 suctions air in the vacuum room 132 so as to make the vacuum room 132 into an air-vacuumed state. Accordingly, the suction nozzles 112a to 112d connected to the vacuum room 132 can suction components by air-vacuum.

The suction pressure sensor 412 is a sensor which measures a pressure in the vacuum room 132 placed in the mounting head 112. Note that, a "suction pressure" indicates an absolute value when a vacuum pressure is expressed by a gage pressure, hereinafter.

Figure 9:
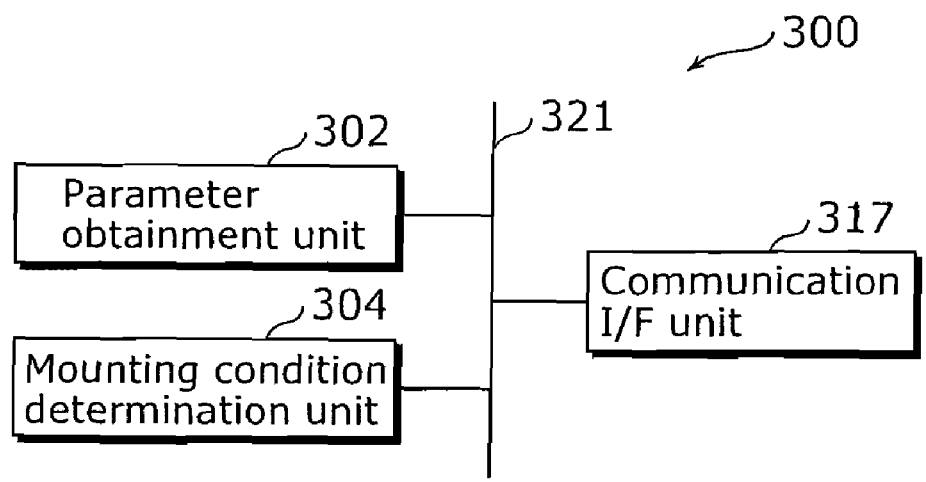
FIG. 9 is a functional block diagram which shows an internal configuration of a mounting condition determination apparatus.

FIG. 9 is a functional block diagram which shows an internal configuration of a mounting condition determination apparatus 300.

The mounting condition determination apparatus 300 is an apparatus which determines a mounting condition of a component, and includes a parameter obtainment unit 302, a mounting condition determination unit 304, and a communication I/F unit 307.

The communication I/F unit 317 is a processing unit which communicates various types of data with the component mounter 100.

The parameter obtainment unit 302 is a processing unit which obtains a parameter relating to power of suctioning a component. The parameter relating to the power of suctioning a component is specified as a suction pressure with respect to a component, a component weight, a leakage parameter and the like.

The mounting condition determination unit 304 is a processing unit which determines a component mounting condition so as not to drop the component when the suction nozzle suctions the component based on the suction power which is determined based on the parameter obtained by the parameter obtainment unit 302. The component mounting condition is specified as the number of components to be suctioned, a task, a transportation speed, and the like, in the following embodiments.

A bus 321 is a bus for mutually connecting processing units which constitute the mounting condition determination apparatus 300.

Figure 10:
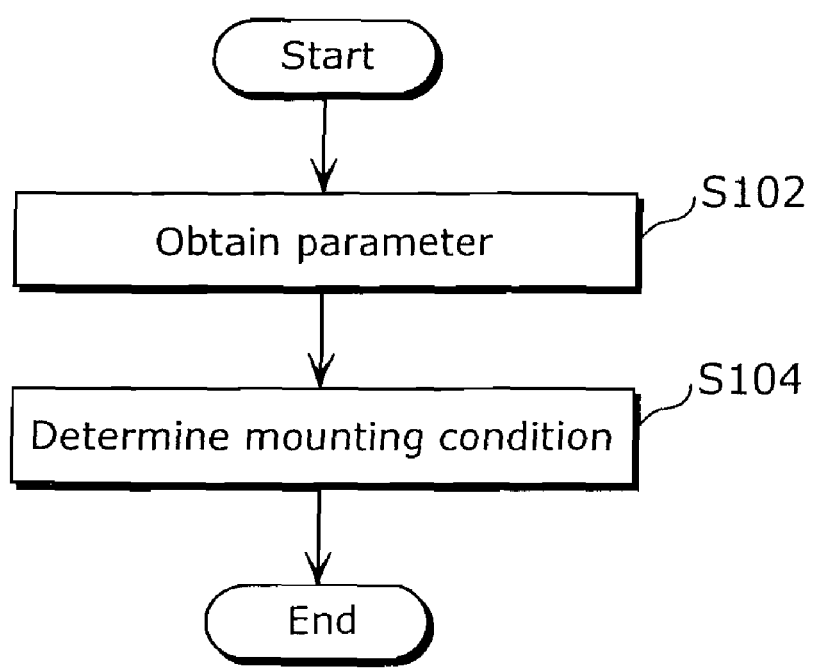
FIG. 10 is a flowchart showing a process executed by the mounting condition determination apparatus.

FIG. 10 is a flowchart showing a process executed by the mounting condition determination apparatus 300.

The parameter obtainment unit 302 obtains a parameter relating to power of suctioning a component from the component mounter 100 or the like, via the communication I/F unit 317 or the like.

The mounting condition determination unit 304 determines a component mounting condition so as not to drop the component when the suction nozzle suctions the component with the suction power which is determined based on the parameter obtained in S102 (S104).

Second Embodiment

The component mounting system according to a second embodiment shall be described. In the present embodiment, the mounting condition determination apparatus 300 indicated in the first embodiment is specifically described.

Figure 11:
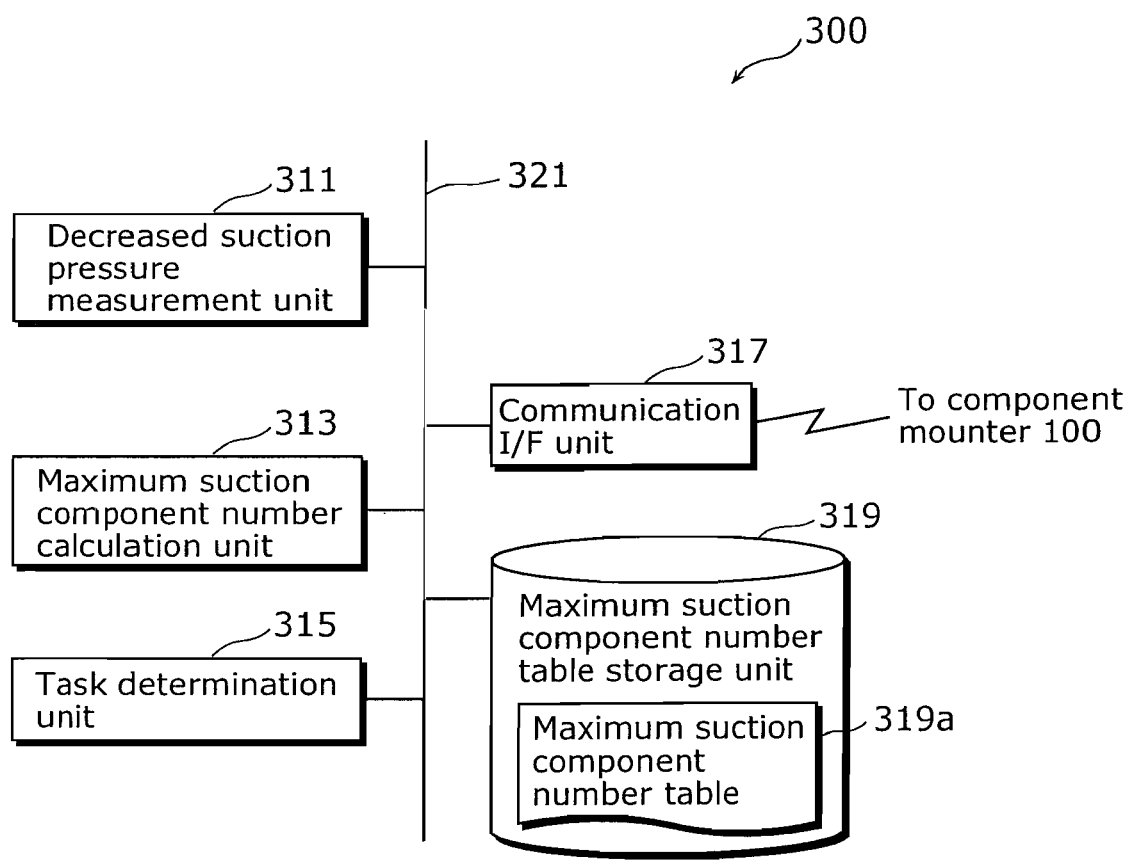
FIG. 11 is a functional block diagram which shows an internal configuration of the mounting condition determination apparatus.

FIG. 11 is a functional block diagram which shows an internal configuration of the mounting condition determination apparatus 300.

The mounting condition determination apparatus 300 is an apparatus which determines a task and a task order, and includes a decreased suction pressure measurement unit 311, a maximum suction component number calculation unit 313, a task determination unit 315, a communication I/F unit 317, a maximum suction component number table storage unit 319, and a bus 321.

The communication I/F unit 317 is a processing unit which communicates various types of data with the component mounter 100.

The decreased suction pressure measurement unit 311 is a processing unit which obtains a suction pressure with respect to a component from the component mounter 100 via the communication I/F unit 317, and calculates a decreased suction pressure which is a difference of suction pressures before and after suctioning the component. The decrease in suction pressure is appeared due to air leakage from a gap between the component and the suction nozzle 112a caused when the component is suctioned.

The maximum suction component number calculation unit 313 is a processing unit which calculates, for each type of component, the maximum number of components which can be suctioned by the suction head 112 (hereinafter, referred to as "the maximum number of suction components"), based on the decreased suction pressure.

The maximum suction component number table storage unit 319 is a storage apparatus in which the maximum suction component number table 319a that is a table for summarizing, for each type of component, the calculated maximum number of components to be suctioned is stored.

The task determination unit 315 is a processing unit which determines a task based on the maximum suction component number table 319a.

The bus 321 is a bus for mutually connecting processing units which constitute the mounting condition determination apparatus 300 and the maximum suction component number table storage unit 319.

Figure 12:
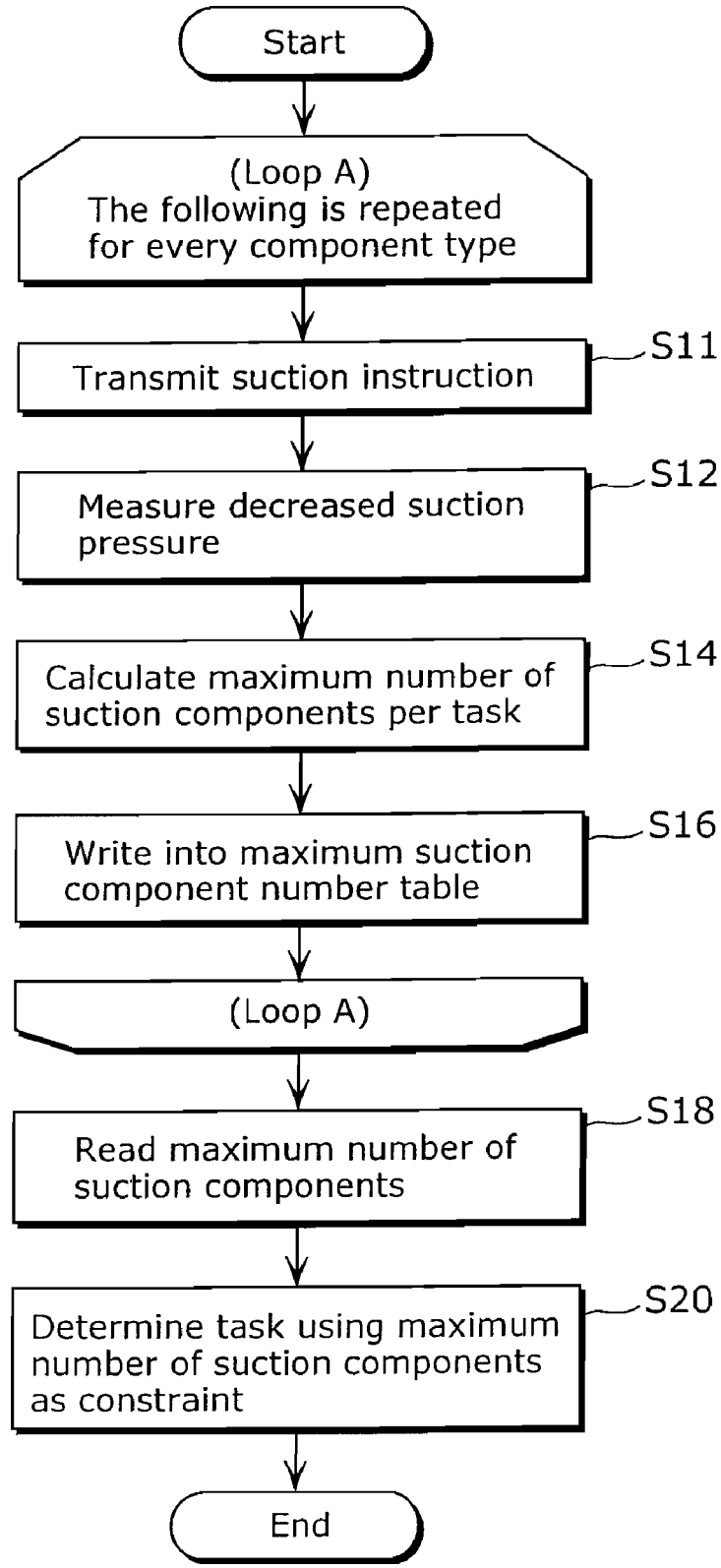
FIG. 12 is a flowchart showing a process executed by the mounting condition determination apparatus.

FIG. 12 is a flowchart showing a process executed by the mounting condition determination apparatus 300.

The decreased suction pressure measurement unit 311 transmits an instruction to suction a component to the component mounter 100 via the communication I/F unit 317 (S11). The component mounter 100 which received the suction instruction moves the mounting head 112, and suctions only one component using the suction nozzle 112a. After that, the component mounter 100 replies, to the communication I/F unit 317 in the mounting condition determination apparatus 300, a suction pressure which is measured by the suction sensor 412 when the component is being suctioned. The decreased suction pressure measurement unit 311 obtains a suction pressure when the component is being suctioned, via the communication I/F unit 317. The decreased suction pressure measurement unit 311 calculates a decreased suction pressure which is a difference between a suction pressure measured when the mounting head 112 does not suction a component and a suction pressure measured when the mounting head 112 suctions one component (S12). Here, the suction pressure measured when the mounting head 112 does not suction a component has been measured in advance. As described in the above, the suction pressure is decreased due to air leakage from the gap caused between the component and the suction nozzle 112a when the component is suctioned.

The maximum suction component number calculation unit 313 calculates the maximum number of components to be suctioned when the same type of components are suctioned, based on the decreased suction pressure calculated by the decreased suction pressure measurement unit 311 (S14).

Figure 13:
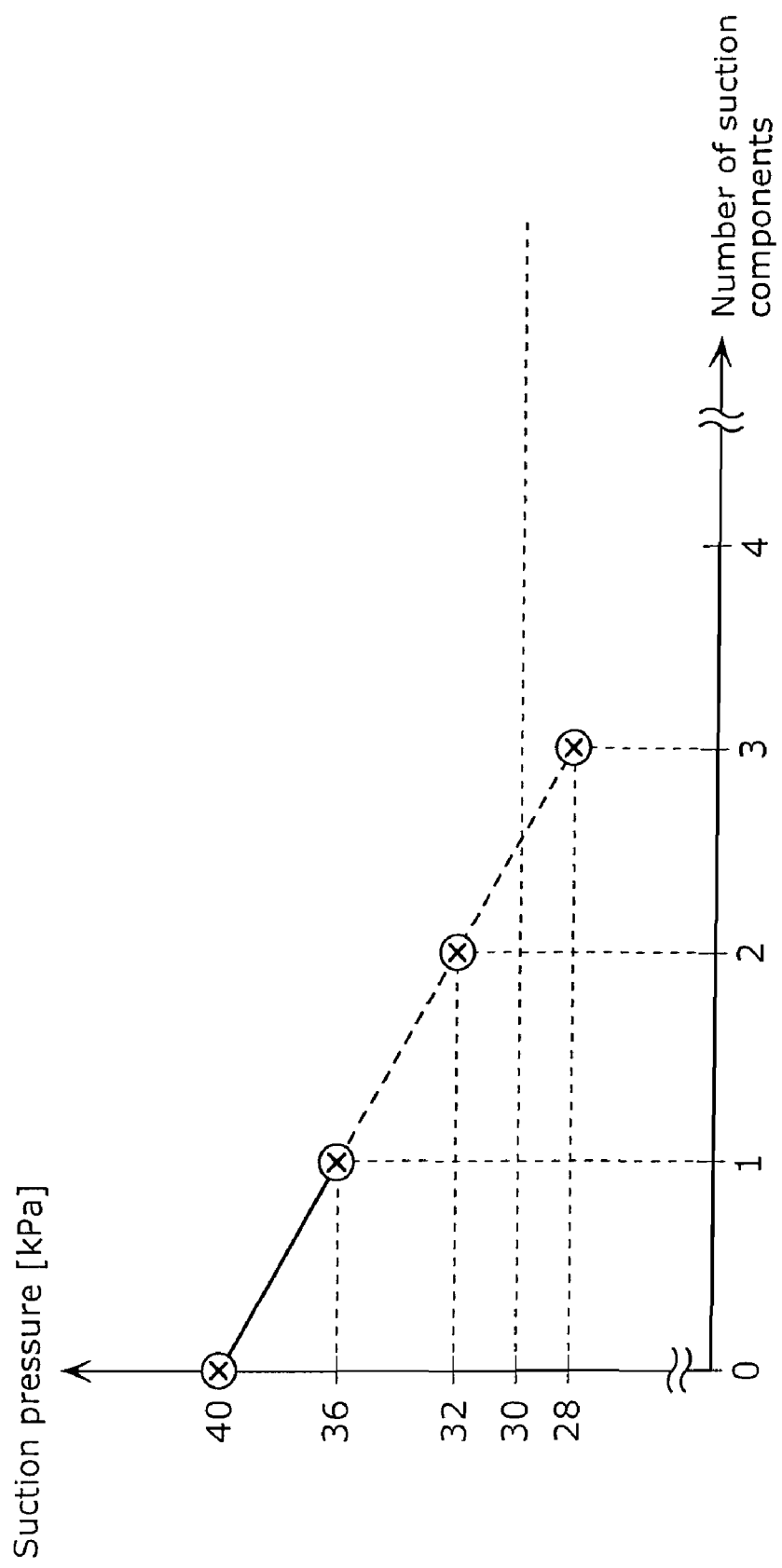
FIG. 13 is a graphic chart showing a relationship between the number of suction components and a suction pressure, with respect to a type of components.

FIG. 13 is a graphic chart showing a relationship between the number of suction components and a suction pressure, with respect to a type of the components. Hereinafter, a method of calculating the maximum number of components to be suctioned shall be described with reference to FIG. 13. If the suction pressure is 40 kPa when components are not being suctioned and 36 kPa when one of the components is being suctioned, a decreased suction pressure is obtained as 4 kPa (=40 kPa−36 kPa). Furthermore, a threshold of the suction pressure within which the mounting head 112 can move without dropping components is assumed to be 30 kPa. When the mounting head 112 suctions two components, the suction pressure is 32(=40−4×2) kPa which is equal to or greater than 30 kPa. However, when the mounting head suctions three components, the suction pressure is 28(=40−4×3) kPa which is less than 30 kPa. Therefore, if the mounting head 112 moves while suctioning the three components, one of the suctioned components is dropped. Accordingly, the maximum suction component number calculation unit 313 determines two as the maximum number of components to be suctioned with respect to the target component type. Note that, the threshold 30 kPa of the suction pressure can be obtained based on a shape of the suction nozzle 112a and the like. Here, the threshold of the suction pressure is influenced, for example, by the shape of a component to be suctioned, a set transportation speed of the mounting head 112, and acceleration.

Note that, "a threshold of the suction pressure within which the mounting head 112 can move without dropping components" includes not only a threshold of the suction pressure within which the suction nozzle 112a does not drop components even when the mounting head 112 moves at the maximum speed predetermined with respect to the type of component, but also a threshold of the suction pressure within which the suction nozzle 112a does not drop components even when the mounting head 112a moves at a speed slower than that maximum speed. Therefore, the present invention applies as long as the maximum number of components to be suctioned is determined so that the suction pressure becomes higher than the threshold at a speed (equals to or slower than the maximum speed) set for suctioning and transporting the type of component, despite the method of determining thereof.

The maximum suction component number calculation unit 313 writes the maximum number of components to be suctioned which is determined in the maximum suction component number calculation process (S14), into the maximum suction component number table 319a together with a type of the components (S16).

FIG. 14 is a diagram showing an example of the maximum suction component number table 319a. The maximum suction component number table 319a is a database having records each of which indicates a pair (a component name, the maximum number of components to be suctioned). For example, the first record indicates (A, 2) as (the component name, the maximum number of components to be suctioned). This record shows that the mounting head 112 can suction maximum two components when suctioning only the components with the component name "A".

Each processing unit in the mounting condition determination apparatus 300 repeats the above-mentioned processes (S11 to S16) for every type of components to be mounted onto the circuit board 20, and generates the maximum suction component number table 319a. Note that, it is possible to omit the above-mentioned processes (S11 to S16) for the type of components whose maximum number of components to be suctioned has been already calculated and registered in the maximum suction component number table 319a.

The task determination unit 315 is then reads, from the maximum suction component number table 319a, the maximum number of suction components for all types of components to be mounted onto the circuit board 20 (S18). The task determination unit 315 determines a task based on the read maximum number of components to be suctioned as a constraint (S20). For example, the maximum suction component number table 319a shown in FIG. 14 shows that only the maximum two components of the component type "A" can be suctioned. This indication is the constraint. Also, in the case where plural types of components are included in one task, the minimum value among the maximum number of suction components of the plural types of components is determined as the maximum number of suction components for the task. For example, when one task includes the component of the type "B" and the component of the type "C", the maximum number of suction components is determined as the minimum value "3" between the maximum number of suction components "5" of the type "B" and the maximum number of suction components "3" of the type "C". Therefore, the task determination unit 315 determines a task so that the sum of the number of components of the type "B" and the number of components of the type "C" is three at the maximum within one task. Note that, various methods have been suggested for the method of determining a task, and the task is not the main point of the present invention. Therefore, the detailed explanation regarding the method is not repeated herein.

The component mounter 100 mounts components onto the circuit board 20 based on such determined task.

As described in the above, in the present embodiment, the maximum number of suction components is determined considering the decrease in the component suction pressure due to air leakage. Furthermore, the task is determined using the maximum number of suction components as a constraint. Therefore, a task with a correct positional precision and a short mounting time can be determined even in the case where the component suction pressure is decreased due to air leakage.

Third Embodiment

Next, the component mounting system according to the third embodiment of the present invention shall be described. The present embodiment differs from the second embodiment in that a task is determined based on a weight of a component.

The configuration of the component mounting system according to the third embodiment includes a mounting condition determination apparatus 500 (below-mentioned) in place of the mounting condition determination apparatus 300, in the component mounting system 10 shown in FIG. 5.

Figure 15:
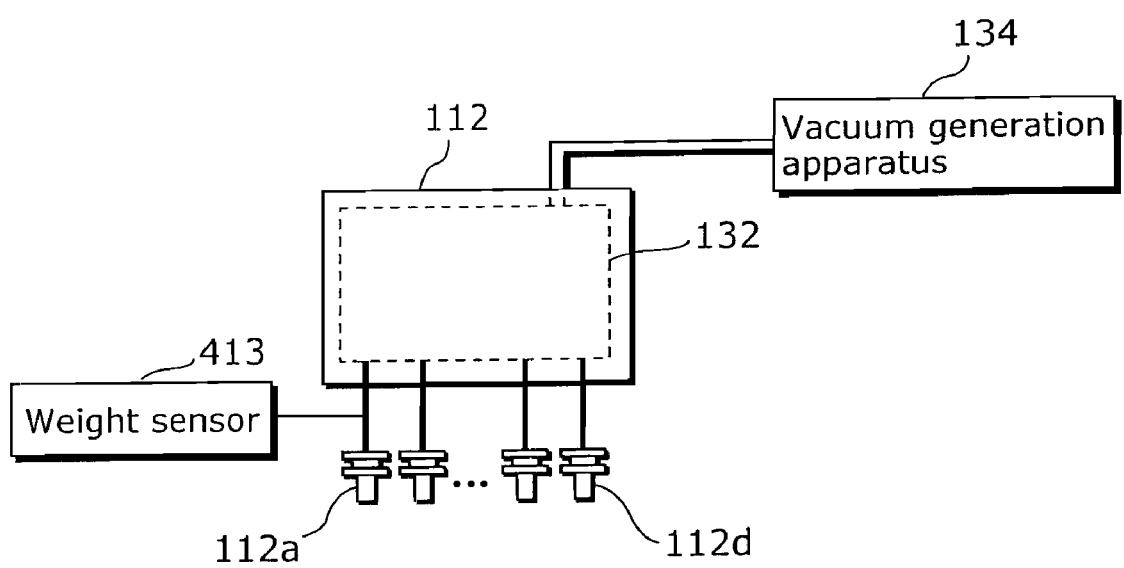
FIG. 15 is a schematic diagram of a mounting head.

The configuration of the component mounter 100 is the same as the configuration shown in FIG. 6 and FIG. 7. However, as shown in FIG. 15, it differs from the component mounter 100 according to the first and second embodiments in that a weight sensor 413 which detects a weight of the component suctioned by the suction nozzle 112a is equipped to the mounting head 112 in place of the suction pressure sensor 412.

Figure 16:
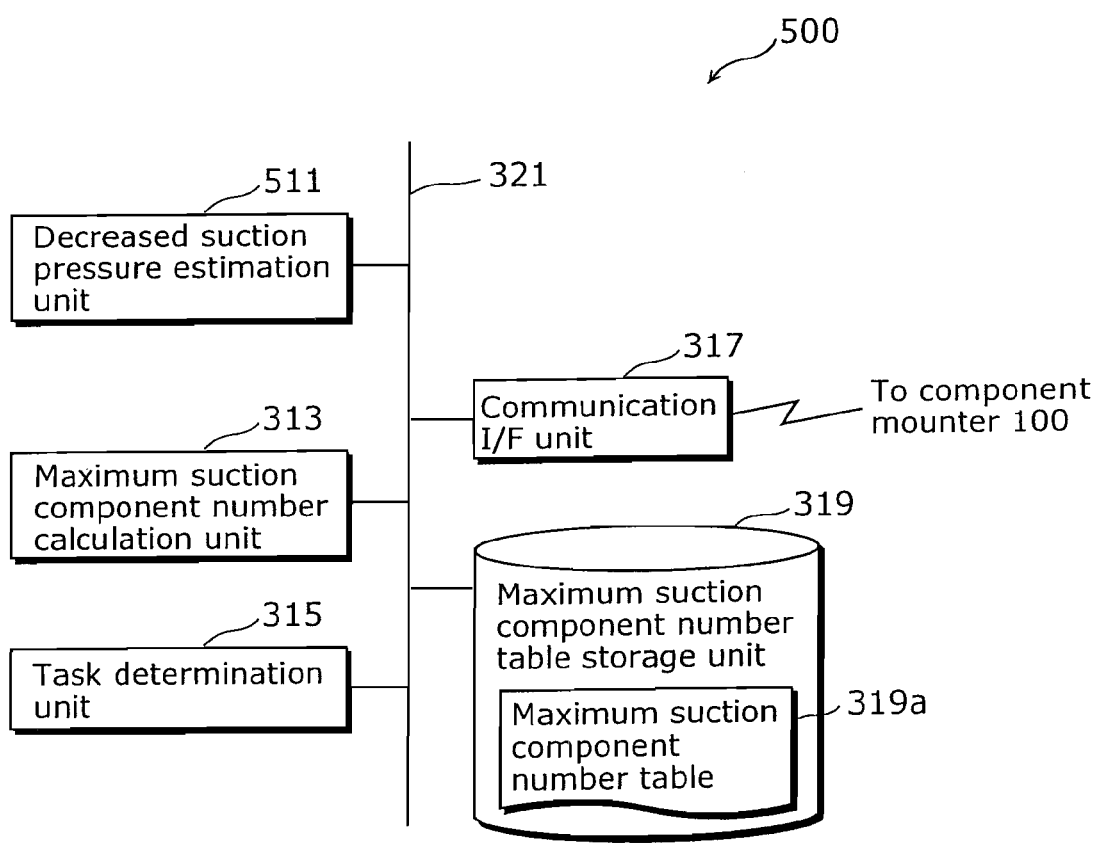
FIG. 16 is a functional block diagram which shows an internal configuration of the mounting condition determination apparatus.

FIG. 16 is a functional block diagram which shows an internal configuration of the mounting condition determination apparatus 500.

The mounting condition determination apparatus 300 is an apparatus which determines a task and a task order, and includes a decreased suction pressure measurement unit 511, a maximum suction component number calculation unit 313, a task determination unit 315, a communication I/F unit 317, a maximum suction component number table storage unit 319, and a bus 321.

The decreased suction pressure measurement unit 511 is a processing unit which obtains a weight of the component from the component mounter 100 via the communication I/F unit 317, and estimates a decreased suction pressure which is a difference of suction pressures before and after suctioning the component. The configurations of other processing units are the same as shown in FIG. 11.

Figure 17:
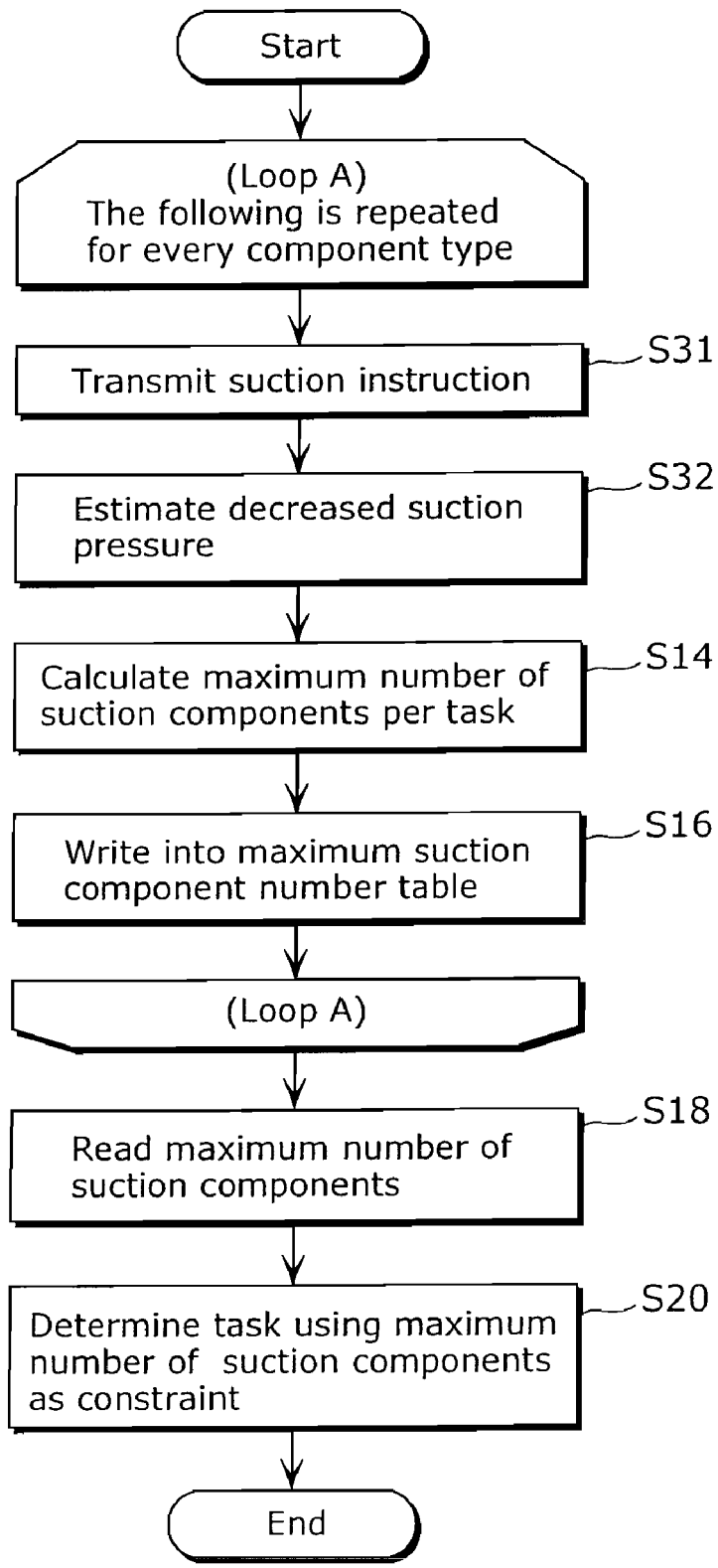
FIG. 17 is a flowchart showing a process executed by the mounting condition determination apparatus.

FIG. 17 is a flowchart showing a process executed by the mounting condition determination apparatus 500.

The decreased suction pressure estimation unit 511 transmits an instruction to suction a component to the component mounter 100 via the communication I/F unit 317 (S31). The component mounter 100 which received the suction instruction moves the mounting head 112, and suctions only one component using the suction nozzle 112a. After that, the component mounter 100 transmits, to the communication I/F unit 317 of the mounting condition determination apparatus 500, the weight of the component which is measured by the weight sensor 413. The decreased suction pressure estimation unit 511 obtains the weight of the component via the communication I/F unit 317. The decreased suction pressure estimation unit 511 estimates a decreased suction pressure when the component is suctioned, based on the weight of the component (S32). For example, when the weight of the component is x(g) and the decreased suction pressure is y(kPa), the decreased suction pressure estimation unit 511 estimates a decreased suction pressure in accordance with the following equation (1).

$$Y = X \times 0.8 \tag{1}$$

For example, when the weight of the component is 5 g, the decreased suction pressure can be obtained as 4(=5×0.8) kPa in accordance with the equation (1).

The maximum suction component number calculation unit 313 calculates the maximum number of suction components when the same type of components are suctioned, based on the decreased suction pressure estimated by the decreased suction pressure estimation unit 511 (S14). Here, the processes after S14 are the same as those described in the first and second embodiments. Therefore, the detailed explanation is not repeated herein.

As described in the above, in the present embodiment, the maximum number of suction components is determined considering the decrease in the component suction pressure due to air leakage as similar in the case of the first embodiment. Furthermore, a task is determined using the maximum number of suction components as a constraint. Therefore, a task with a correct positional precision and a short mounting time can be determined even in the case where the component suction pressure is decreased due to air leakage.

Furthermore, even in the case where only a weight sensor can be equipped to the component mounter 100, the task considering the decrease in the component suction pressure can be determined.

Fourth Embodiment

The present embodiment is different from the second and third embodiments in that the maximum number of suction components is determined based on a leakage parameter which indicates a degree of air leakage from a suction nozzle.

Figure 18:
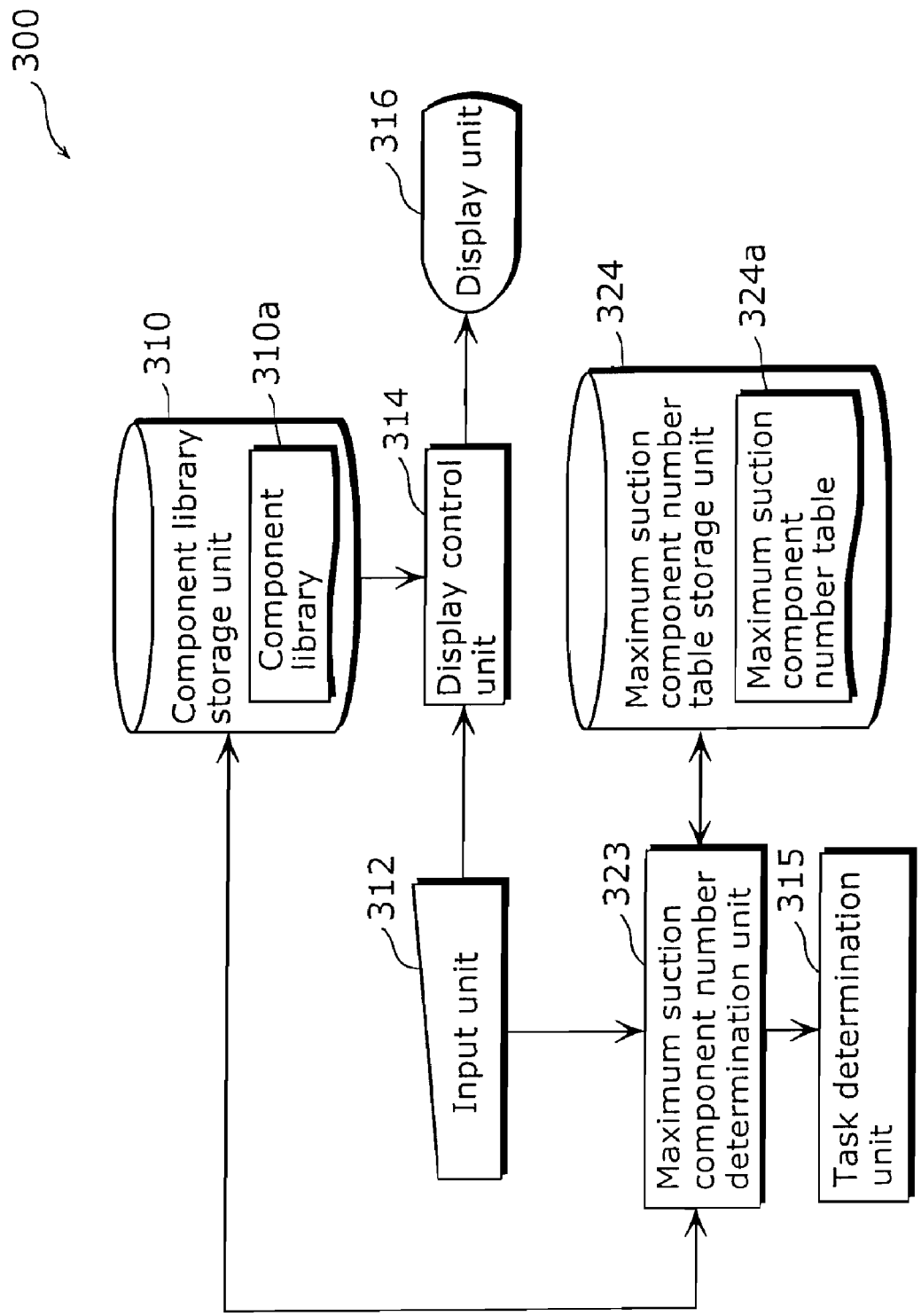
FIG. 18 is a block diagram which shows an internal configuration of the component mounting condition determination apparatus.

FIG. 18 is a block diagram which shows an internal configuration of the component mounting condition determination apparatus 300.

The component mounting condition determination apparatus 300 is an apparatus which determines a task and a task order, and includes a component library storage unit 310, an input unit 312, a display control unit 314, a display unit 316, a maximum suction component number determination unit 323, a maximum suction component number table storage unit 324, and a task determination unit 315.

The component library storage unit 310 is a storage apparatus which stores a below-mentioned component library 310a.

The display unit 316 is an apparatus such as a liquid-crystal display for displaying letters, images and the like.

The input unit 312 is an apparatus such as a keyboard, mouse, and the like for a user to input various types of data.

The display control unit 314 is a processing unit which controls the display unit 316 to display data included in the component library 310a and the data inputted by the input unit 312.

The maximum suction components table storage unit 324 is a storage apparatus in which the maximum suction component number table 324a that is a table for determining the maximum number of suction components is stored.

The maximum suction component number determination unit 323 is a processing unit which determines the maximum number of suction components by referring to the maximum suction component number table 324a stored in the maximum suction component number table storage unit 324, based on the leakage parameter inputted by the input unit 312.

The task determination unit 315 is a processing unit which determines a task based on the maximum number of suction components determined by the maximum suction component number determination unit 323.

FIG. 19 is a diagram showing an example of the component library 310a. The component library 310a is a library in which information unique to each type of components available for the component mounter 100 is collected, and includes, for each component type, a component size, a tact (a tact unique to each component type under a specific condition), and other pieces of constraint information (an available suction nozzle type, a recognition method by the component recognition camera 116, a head speed level of the mounting head 112, and the like). In this diagram, an external view of each component type is also shown as a reference.

The head speed level of the mounting head 112 indicates a level of the maximum transportable speed of the mounting head 112. Here, "1" is the maximum speed which is decreased as the value becomes larger.

This head speed level is previously determined based on the table shown in FIG. 20. Each record shown in the table of FIG. 20 includes a component type, use data, a determination formula, and a head speed level. For example, in the case where the component type is a general box-type, the head speed level is determined based on the determination formula shown in FIG. 20 only using the thickness T of the component. Here, when the thickness T is 1.0 mm, the head speed level is determined as 3.

Figure 21:
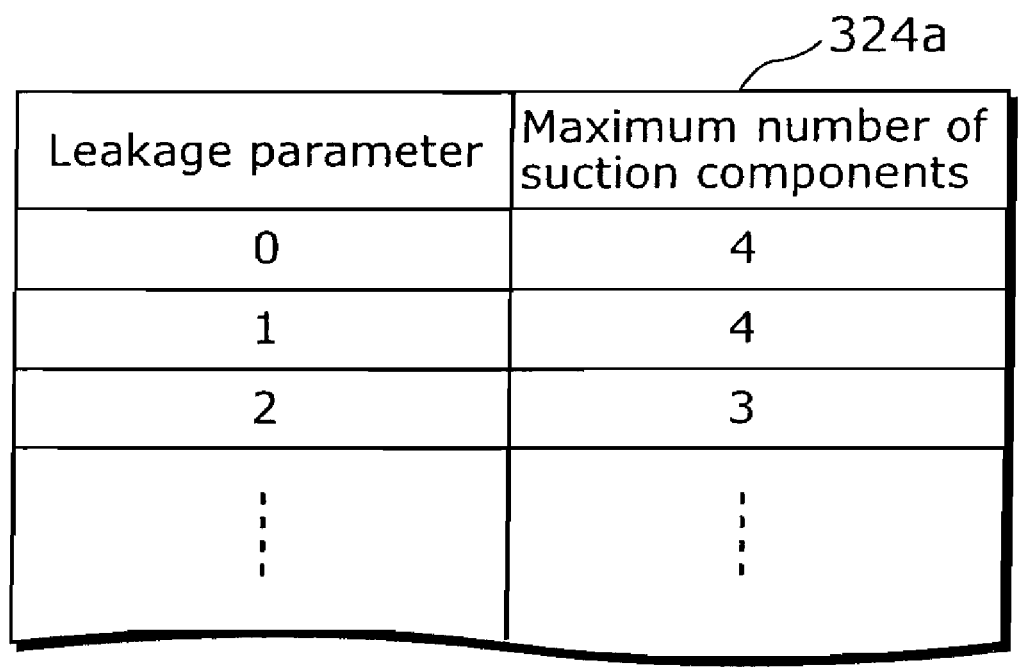
FIG. 21 is a diagram showing an example of a table for the maximum number of components to be suctioned.

FIG. 21 is a diagram showing an example of the maximum suction component number table 324a.

The maximum suction component number table 324a is a table showing a relationship between a leakage parameter and the maximum number of suction components. Here, the amount of air leakage from the suction nozzle is smaller as the value of the leakage parameter is smaller. For example, according to the maximum suction component number table 324a, the maximum number of suction components is "4" when the leakage parameter is "0", and the maximum number of suction components is "3" when the leakage parameter is "2".

FIGS. 22 to 33 are diagrams for explaining a phenomenon of air leakage which occurs when the suction nozzle 112a suctions a component. Note that, a similar phenomenon occurs when a different suction nozzle suctions a component.

Figure 22:
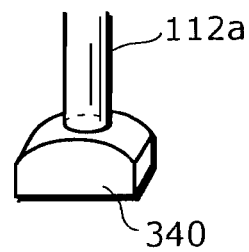
FIG. 22 is an illustration of the case where a suction nozzle has suctioned a component having a curved suction plane.
Figure 23:
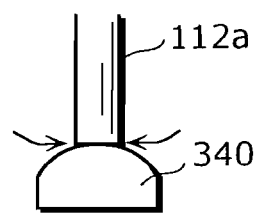
FIG. 23 is an illustration of the case where the suction nozzle has suctioned the component having the curved suction plane.

FIGS. 22 and 23 are illustrations of the case where the suction nozzle 112a suctions a component having a curved suction plane. FIG. 22 is a diagram showing a state where the suction nozzle 112a suctions a component 340 having a convex circular shape. FIG. 23 is a diagram showing, from the side, the component 340 in the state of FIG. 22. Since the contact plane of the component 340 with the suction nozzle 112a is the convex circular shape, a gap appears between the suction nozzle 112a and the component 340, and thus air leaks from the gap towards the direction indicated by arrows in FIG. 23.

Figure 24:
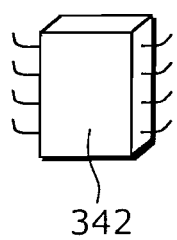
FIG. 24 is an illustration of the case where the suction nozzle has suctioned an IC component.
Figure 25:
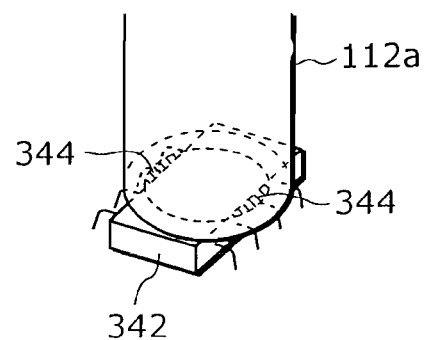
FIG. 25 is an illustration of the case where the suction nozzle has suctioned the IC component.
Figure 26:
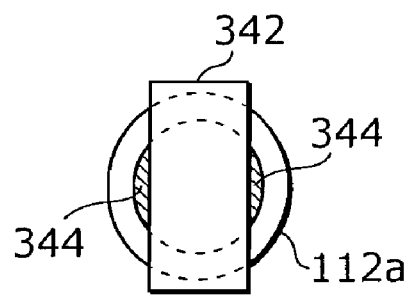
FIG. 26 is an illustration of the case where the suction nozzle has suctioned the IC component.

FIGS. 24 to 26 are illustrations of the case where the suction nozzle 112a suctions an IC (Integrated Circuit) component. FIG. 24 is a diagram showing an example of the IC component 342. FIG. 25 shows a state where the IC component 342 is suctioned by the suction nozzle 112a having an internal diameter which is greater than the width of the IC component 342. FIG. 26 is a diagram showing, from below, the IC component 342 in the state of FIG. 25. Since the internal diameter of the suction nozzle 112a is greater than the width of the IC component 342, a gap 344 appears between the IC component and the suction nozzle 112a when the IC component 342 is suctioned, and thus air leaks from the gap.

Figure 27:
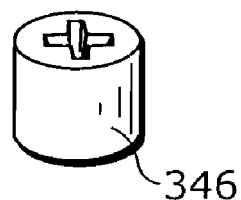
FIG. 27 is an illustration of the case where a suction nozzle has suctioned a component having a screw hole.
Figure 28:
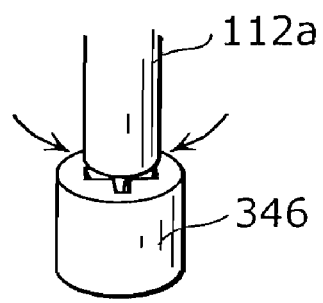
FIG. 28 is an illustration of the case where the suction nozzle has suctioned the component having the screw hole.

FIGS. 27 and 28 are illustrations of the case where the suction nozzle 112a suctions a component having a screw hole. FIG. 27 shows a component 346 having a screw hole. FIG. 28 shows a state where the component 346 having the screw hole. As shown in FIG. 28, a gap appears between the screw hole of the component 346 and the suction nozzle 112a when the component 346 is suctioned, and thus air leaks from the gap towards the direction indicated by arrows in FIG. 28.

Figure 29:
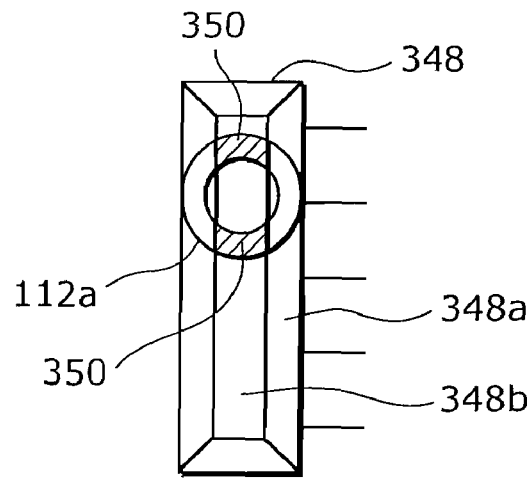
FIG. 29 is a schematic diagram showing, from the above, a suction nozzle which has suctioned a connector component.

FIG. 29 is a schematic diagram showing, from the above, the suction nozzle 112a which suctions a connector component 348. An inner area 348b of the connector component 348 is one-step lower than an outer area 348a thereof. Accordingly, when the concavo-convex connector component 348 is suctioned, a gap 350 appears between the connector component 348 and the suction nozzle 112a, and thus air leaks from the gap 350.

Figure 30:
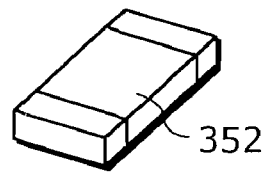
FIG. 30 is an illustration of the case where a suction nozzle suctions a chip component.
Figure 31:
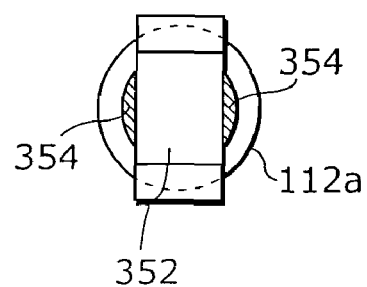
FIG. 31 is an illustration of the case where the suction nozzle has suctioned the chip component.

FIGS. 30 and 31 are illustrations of the case where the suction nozzle 112a suctions a chip component. FIG. 30 is a diagram showing the chip component 352. FIG. 31 is a diagram showing, from the below, the chip component 352 when the suction nozzle 112a suctions the chip component 352. Thus, in the case where the inner diameter of the suction nozzle 112a is greater than the length of the shorter side of the chip component 352, the gap 354 appears, and air leaks from the gap 354.

Figure 32:
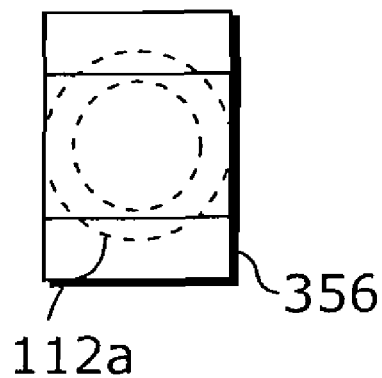
FIG. 32 is an illustration of the case where the suction nozzle has suctioned the chip component.
Figure 33:
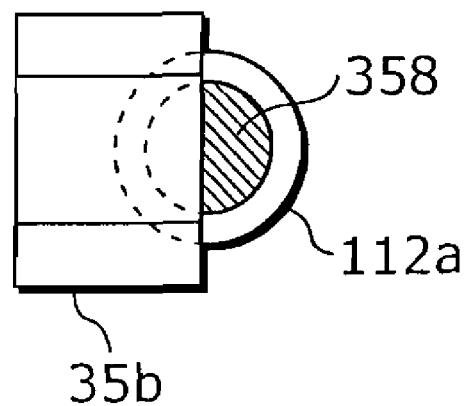
FIG. 33 is an illustration of the case where the suction nozzle has suctioned the chip component.

FIGS. 32 and 33 are illustrations of the case where the suction nozzle 112a suctions a chip component. FIG. 32 is a diagram showing, from the below, the chip component 356 when the suction nozzle 112a suctions the chip component 356 without causing a suction positional misalignment. As shown in FIG. 32, in the case where the inner diameter of the suction nozzle 112a is smaller than the length of the shorter side of the chip component 356, the component can be suctioned without causing a gap between the chip component 356 and the suction nozzle 112a. However, it is not applied when the positional misalignment is generated when the component is suctioned. FIG. 33 is a diagram showing, from the below, the chip component 356 when the suction nozzle 112a suctions the chip component 356 causing a positional misalignment. Thus, in the case where the positional misalignment occurs when the component is suctioned, a gap 358 appears, and air leaks from the gap 358.

Figure 34:
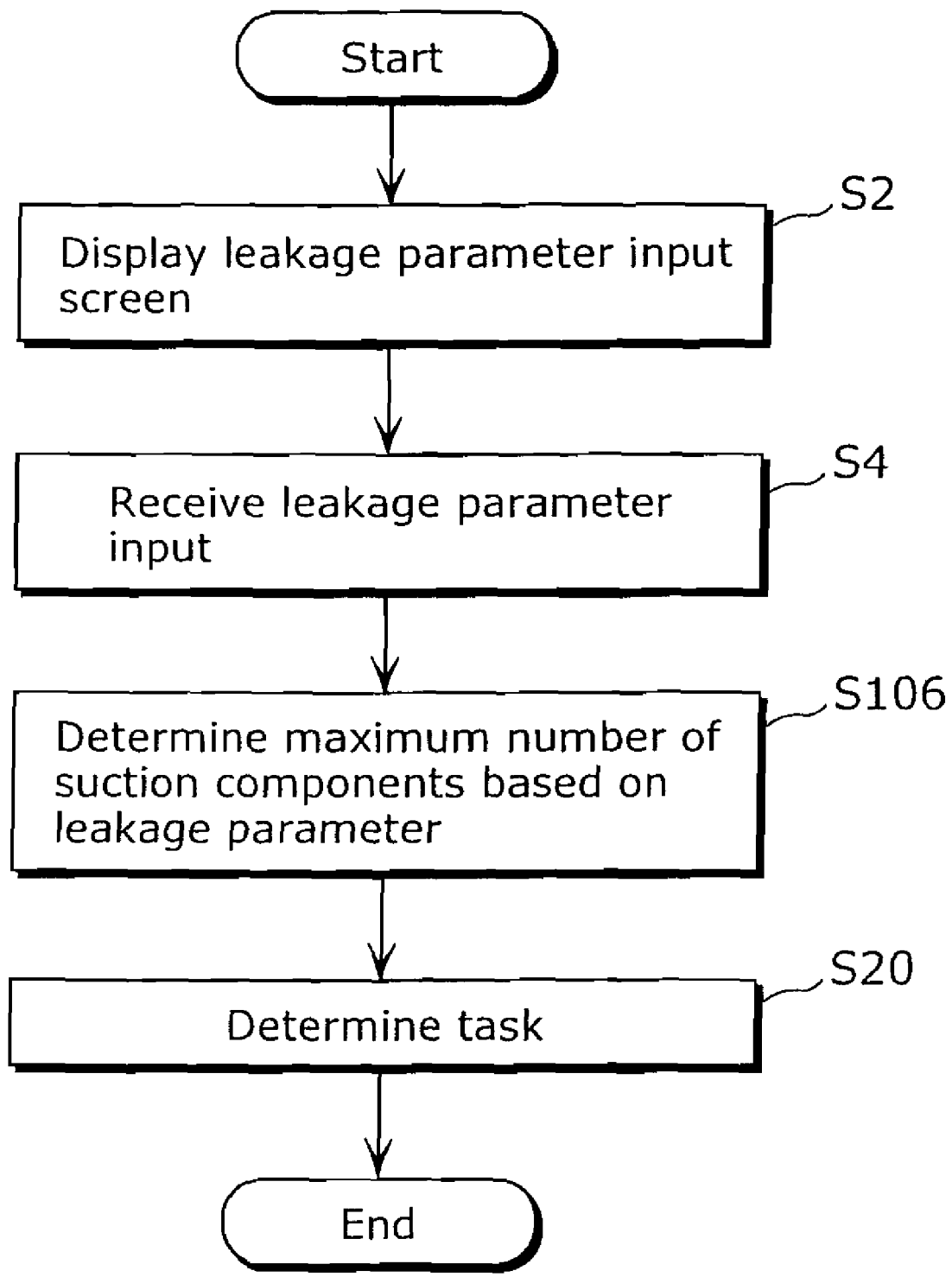
FIG. 34 is a flowchart showing a process executed by the mounting condition determination apparatus.

Next, the process executed by the mounting condition determination apparatus 300 shall be described. FIG. 34 is a flowchart showing the process executed by the mounting condition determination apparatus 300.

Figure 35:
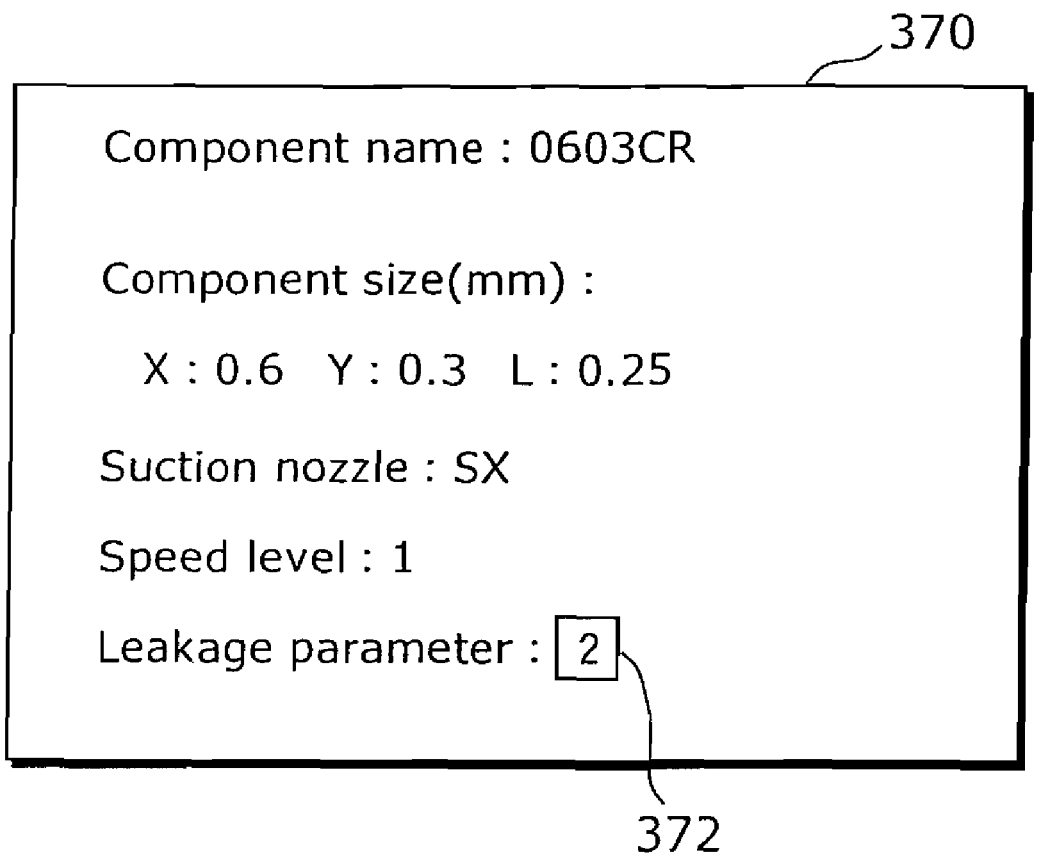
FIG. 35 is a diagram showing an example of an input screen for a leakage parameter.

The display control unit 314 displays, for each type of component, an input screen for a leakage parameter, with reference to the component library 310a (S2). FIG. 35 is a diagram showing an example of the input screen for a leakage parameter. This screen is an input screen for a leakage parameter with respect to the component name "0603CR" in the component library 310a shown in FIG. 19. The input screen 370 displays thereon a component name, a component size, a suction nozzle, and a speed level of the mounting head 112. The input screen 370 further displays an input column 372 for inputting leakage parameters.

When an operator inputs a leakage parameter into the input column 372 (S4), the maximum suction component number determination unit 323 determines the maximum number of suction components by referring to the maximum suction component number table 324a shown in FIG. 21, with respect to the input leakage parameter (S106). For example, on the input screen 370 shown in FIG. 35, "2" is set as a leakage parameter of the component type with the component name of "0603CR". As shown in FIG. 21, the maximum number of suction components is "3" when the leakage parameter is "2". Therefore, the maximum suction component number determination unit 323 determines "3" as the maximum number of suction components of the component type with the component name of "0603 CR".

The task determination unit 315 determines a task based on the determined maximum number of suction components as a constraint (S20). The method of determining a task is not the main purpose of the present invention, and therefore, the detailed explanation is not repeated.

As described in the above, in the present embodiment, a task can be determined considering the air leakage from the gap between the component and the suction nozzle, by setting the leakage parameter. Therefore, it is prevented that a component is dropped or that the component is misaligned from the suction position, when the mounting head 112 moves. Accordingly, the component can be mounted onto a board at a correct positional precision.

Fifth Embodiment

The present embodiment is different from the fourth embodiment in that the component mounter 100 obtains a leakage parameter from an image of a component captured with a camera.

Figure 36:
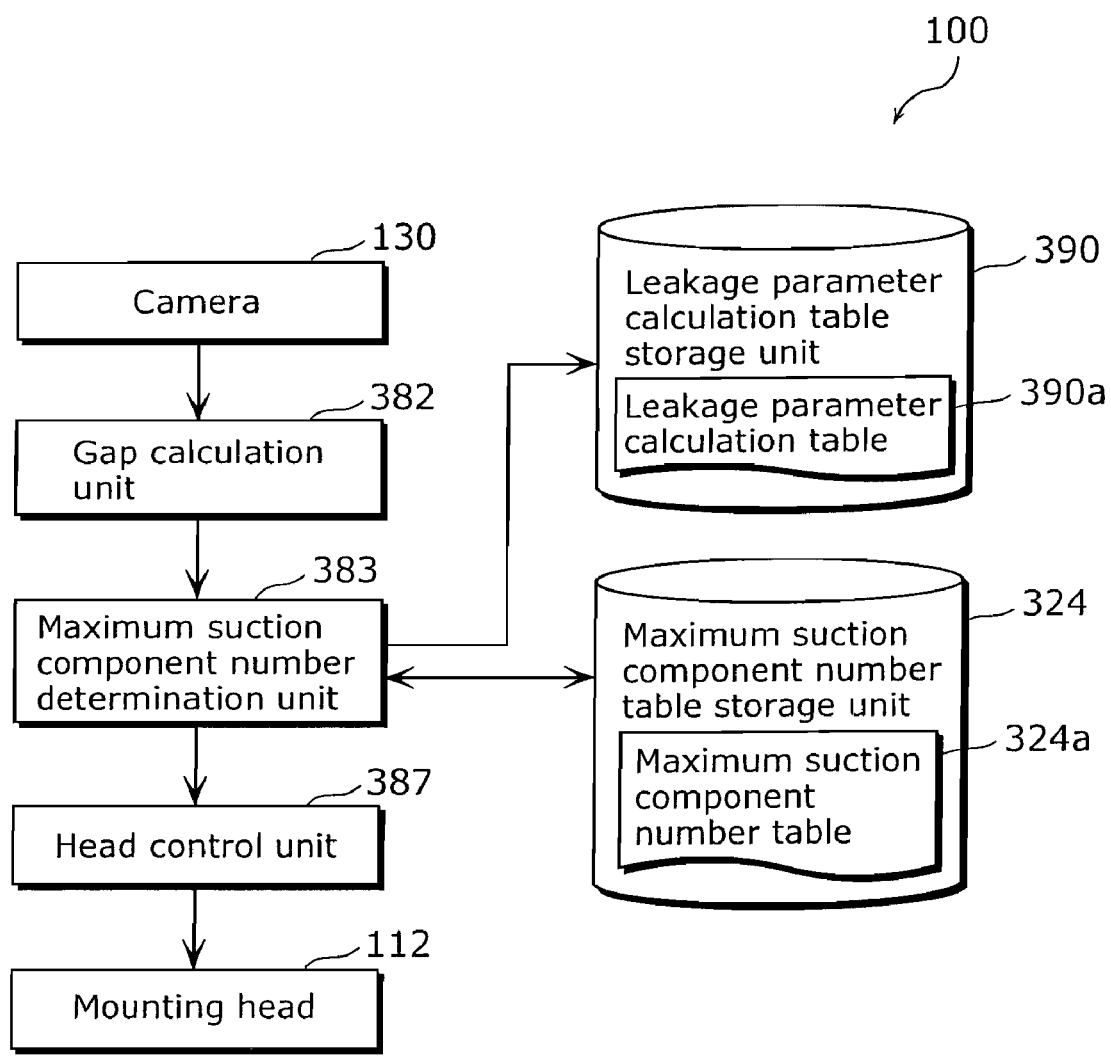
FIG. 36 is a functional block diagram which shows a configuration of a component mounter.

FIG. 36 is a functional block diagram which shows a configuration of the component mounter 100 according to the present embodiment.

The component mounter 100 includes a camera 130, a gap calculation unit 382, a maximum suction component number determination unit 383, a head control unit 387, a mounting head 112, a leakage parameter calculation table storage unit 390, and a maximum suction component number table storage unit 324.

The camera 130 and the mounting head 112 are the same as those described in the first embodiment.

The gap calculation unit 382 is a processing unit which obtains a size of the component from an image of the component captured with the camera 130, and calculates an amount of gap appeared between the component and the suction nozzle 112a based on the size and an inner diameter of the suction nozzle 112a.

The leakage parameter calculation table storage unit 390 is a storage apparatus which stores a leakage parameter calculation table 390a for calculating a below-mentioned leakage parameter.

Figure 37:
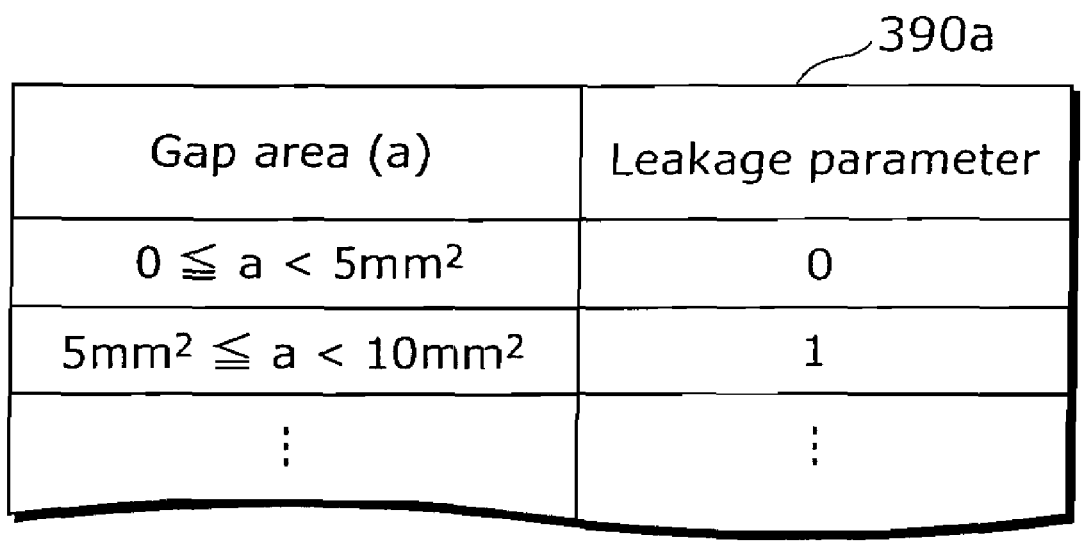
FIG. 37 is a diagram showing an example of a leakage parameter calculation table.

FIG. 37 is a diagram showing an example of the leakage parameter calculation table 390a. The leakage parameter calculation table 390a is a correspondence table between a gap area and a leakage parameter. For example, when the gap area "a" is in a range from 0 mm$^2$ to 5 mm$^2$, the leakage parameter is obtained as "0".

The maximum suction component number table storage unit 324 is the same as the one described in the fourth embodiment.

The maximum suction component number determination unit 383 is a processing unit which determines the maximum number of suction components for the Mounting head 112, based on a gap amount calculated by the gap calculation unit 382.

The head control unit 387 is a processing unit which controls the mounting head 112 based on the maximum number of suction components determined by the maximum suction component number determination unit 383.

Figure 38:
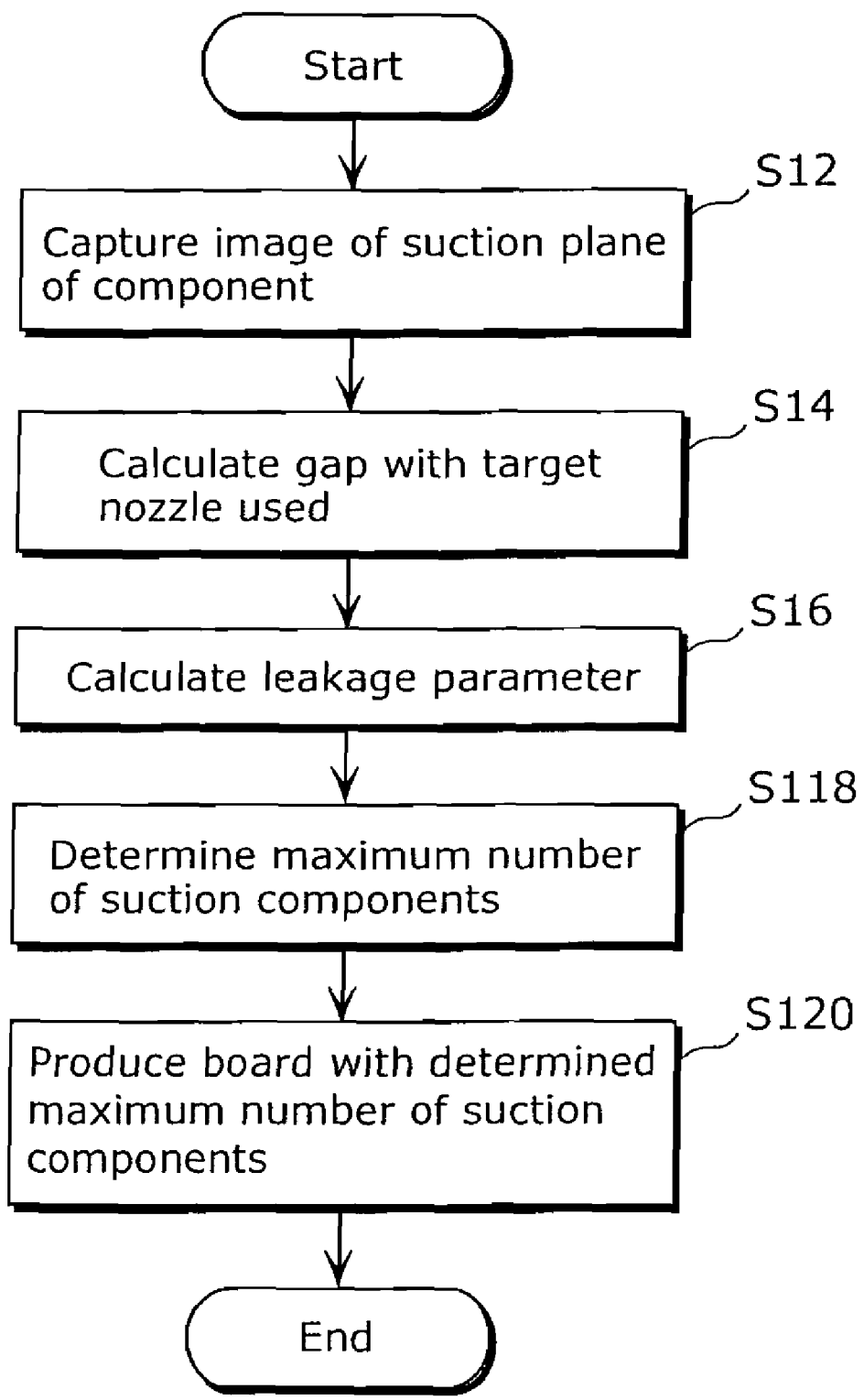
FIG. 38 is a flowchart showing a process executed by the component mounter.

Next, the process executed by the component mounter 100 shall be described. FIG. 38 is a flowchart showing a process executed by the component mounter 100.

When at least one component cassette 114 is changed by the component supply unit 115a or 115b, the component mounter 100 moves the camera 130 to a component suction port of the component cassette 114 so that the camera captures an image of the suction plane of the component suctioned by the suction nozzle 112a (S12).

The gap calculation unit 382 calculates an area of a gap appeared when the component is suctioned by the suction nozzle 112a, based on an image of the component captured with the camera 130 and an inner diameter of the suction nozzle 112a used for suctioning the component (S14).

Figure 39:
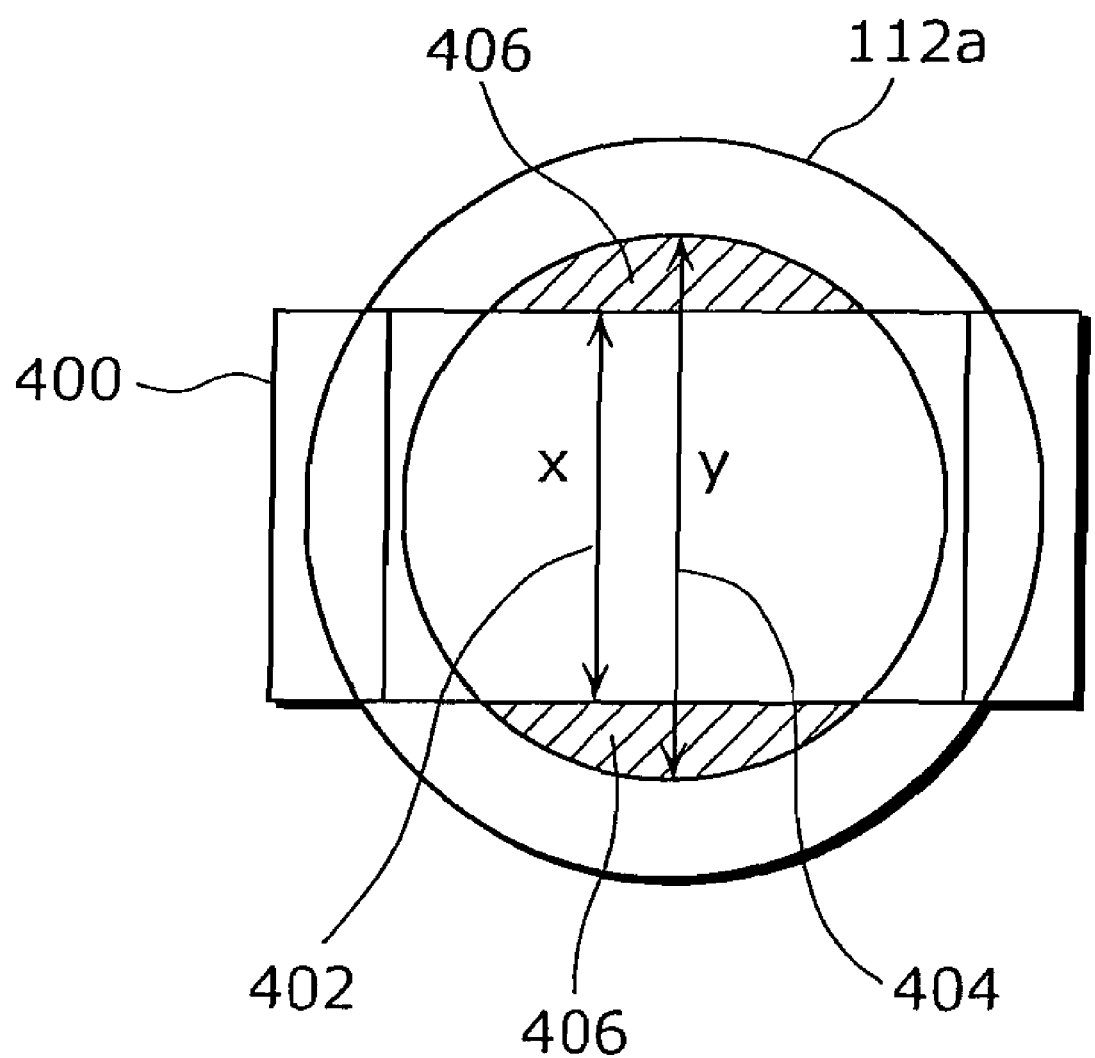
FIG. 39 is a diagram showing a relationship between a suction nozzle and a component.

FIG. 39 is a diagram showing a relationship of a suction nozzle, a component, and a gap. Here, defining the length of the shorter side 420 of the component 400 as x, and the inner diameter 303 of the suction nozzle 112a as y. When x≧y, a gap does not appear between the component 400 and the suction nozzle 112a if the suction nozzle 112a suctions the center of the component 400. Therefore, the gap area "a" is determined as "0". On the other hand, when x<y, a gap 406 appears between the component 400 and the suction nozzle 112a. Here, the gap area a can be calculated by the following formula (1).

[Formula 1]

$$a = 2 \times \left( \left(\frac{y}{2}\right)^2 \times \theta - \frac{x}{2} \times \sqrt{\left(\frac{y}{2}\right)^2 - \left(\frac{x}{2}\right)^2} \right) \quad (1)$$

when $\theta = \arccos\left(\frac{x}{y}\right)$

The maximum suction component number determination unit 383 extracts, from the leakage parameter calculation table 390a, a leakage parameter which corresponds to the gap area "a" which is calculated based on the formula (1) (S16). Note that, the maximum suction component number determination unit 383 may calculate a leakage parameter from the gap area 1 using a predetermined calculation.

The maximum suction component number determination unit 383 obtains the maximum number of suction components with respect to the calculated leakage parameter, by referring to the maximum suction component number table 324a shown in FIG. 21 (S118). The process in S118 is the same as that of S106 in the fourth embodiment, and therefore the detailed explanation is not repeated herein.

The head control unit 387 controls the mounting head 112 so as not to suction the number of components more than the determined maximum number of suction components, and produces a board (S120).

As described in the above, in the present embodiment, a gap area appeared when a component is suctioned by a suction nozzle is calculated based on a captured image of the component, and the maximum number of suction components can be determined considering the air leakage due to the gap area. Therefore, it is prevented that the component is dropped or that the component is misaligned from the suction position, when the mounting head moves. Consequently, a component can be mounted onto a board at a correct positional precision.

Furthermore, the amount of air leakage changes in the case where the component mounter lacks a replacement component and a different type of component having the same characteristics as the original component to be replaced is used as the replacement component, because the gap area appeared between the suction nozzle and the newly replaced component is different from the gap between the suction nozzle and the original component. However, even such a case occurs, the gap area is recalculated when the component is replaced, in the present embodiment. Therefore, an approximate maximum number of suction components for the mounting head can be determined.

Sixth Embodiment

Next, the component mounter according to the sixth embodiment of the present invention shall be described.

The present embodiment is different from other above-identified embodiments in that a suction pressure of a suction nozzle to suction a component is measured at a real time when the component is mounted, and if the suction pressure is less than a predetermined transportable suction pressure, the suctioning of the component is stopped and the task is reconfigured at a real time.

Figure 40:
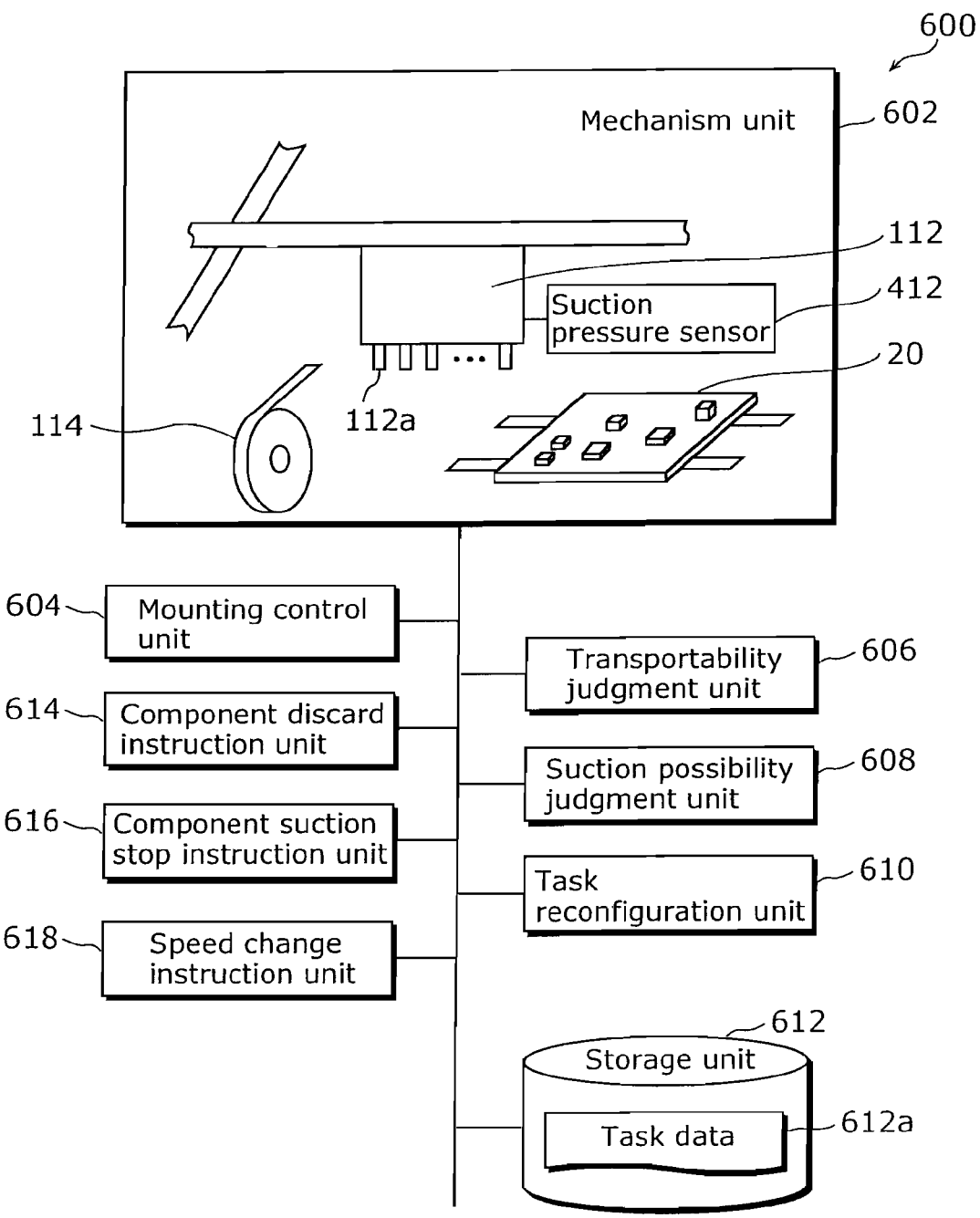
FIG. 40 is a block diagram showing a functional configuration of the component: mounter.

FIG. 40 is a block diagram showing a functional configuration of the component mounter 600 according to the present embodiment. The component mounter 600 functionally includes a mechanism unit 602, a mounting control unit 604, a transportability judgment unit 606, a suction possibility judgment unit 608, a task reconfiguration unit 610, a storage unit 612, a component discard instruction unit 614, a component suction stop instruction unit 616, and a speed change instruction unit 618.

The mechanism unit 602 is an aggregate of mechanism-related constituent elements of the component mounter 100 such as the mounting head 112, and the suction sensor 412 that have been described with references to FIGS. 6 to 8.

The storage unit 612 is a storage apparatus in which task data 612a indicating an order of mounting components is stored.

The mounting control unit 604 is a processing unit which controls the mechanism unit 602 to mount components onto the circuit board 20, based on the task data 612a.

The transportability judgment unit 606 is a processing unit which judges whether or not the currently suctioned components can be transported at a current transportation speed by the mounting head 112, based on an output value by the suction pressure sensor 412.

The suction possibility judgment unit 608 is a processing unit which judges whether or not the currently suctioned components can be transported while being suctioned by the suction nozzles, based on the output value by the suction pressure sensor 412.

The task reconfiguration unit 610 is a processing unit which reconfigures a task by changing the order of suctioning components when the components are failed to be suctioned, so that the components failed to be suctioned are to be suctioned at a subsequent or later order.

The component discard instruction unit 614 is a processing unit which instructs the mounting control unit 604 to discard the currently suctioned components.

The component suction stop instruction unit 616 is a processing unit which instructs the mounting control unit 604 to stop suctioning the components.

The speed change instruction unit 618 is a processing unit which instructs the mounting control unit 604 to change the transportation speed of the mounting head 112.

Next, the process executed by the component mounter 600 shall be described.

Figure 41:
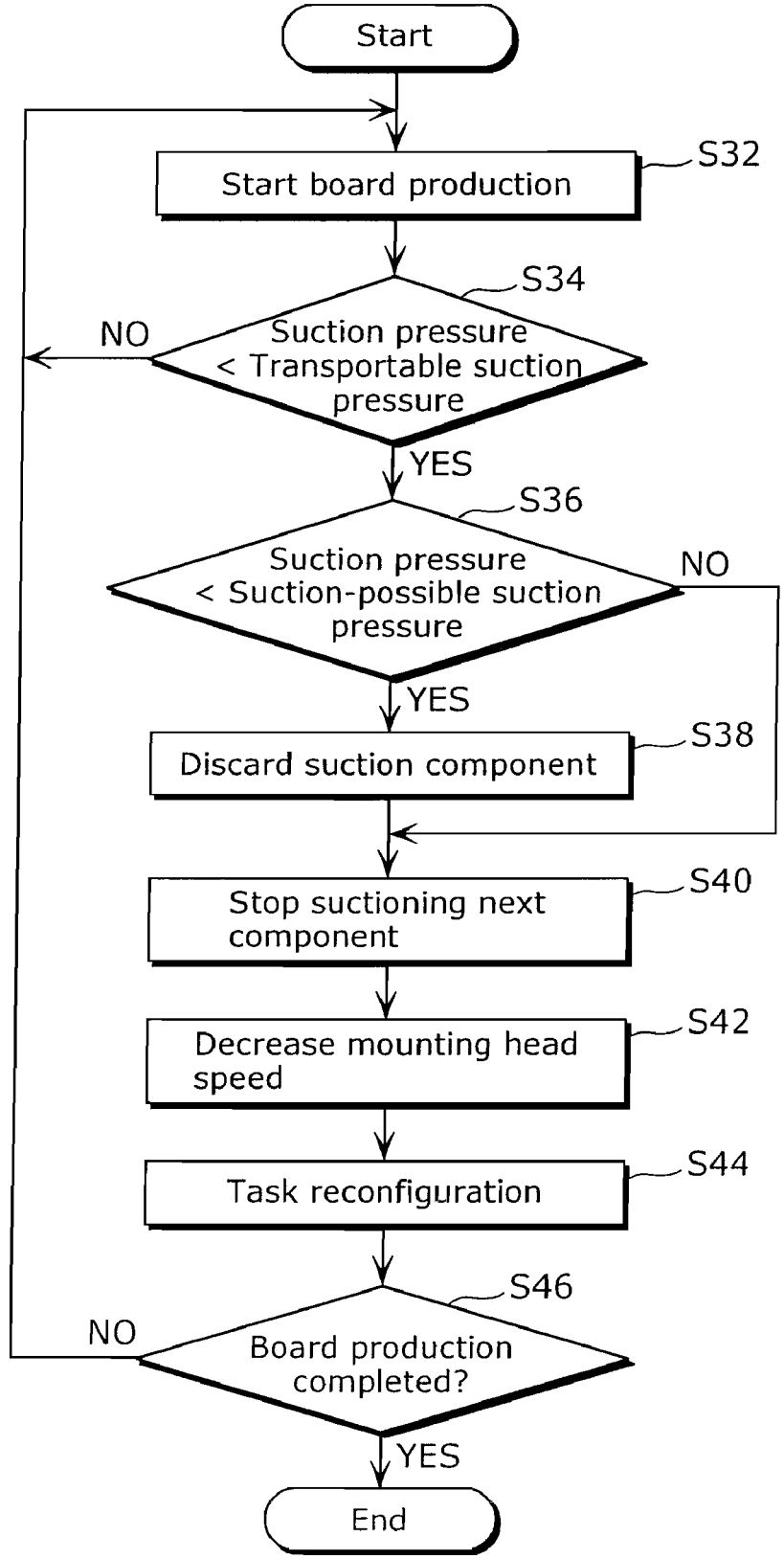
FIG. 41 is a flowchart showing a process executed by the component mounter.

FIG. 41 is a flowchart showing a process executed by the component mounter 600. Here, for the ease of explanation, it is assumed that the mounting head 112 has four suction nozzles 112a to 112d.

Figure 42:
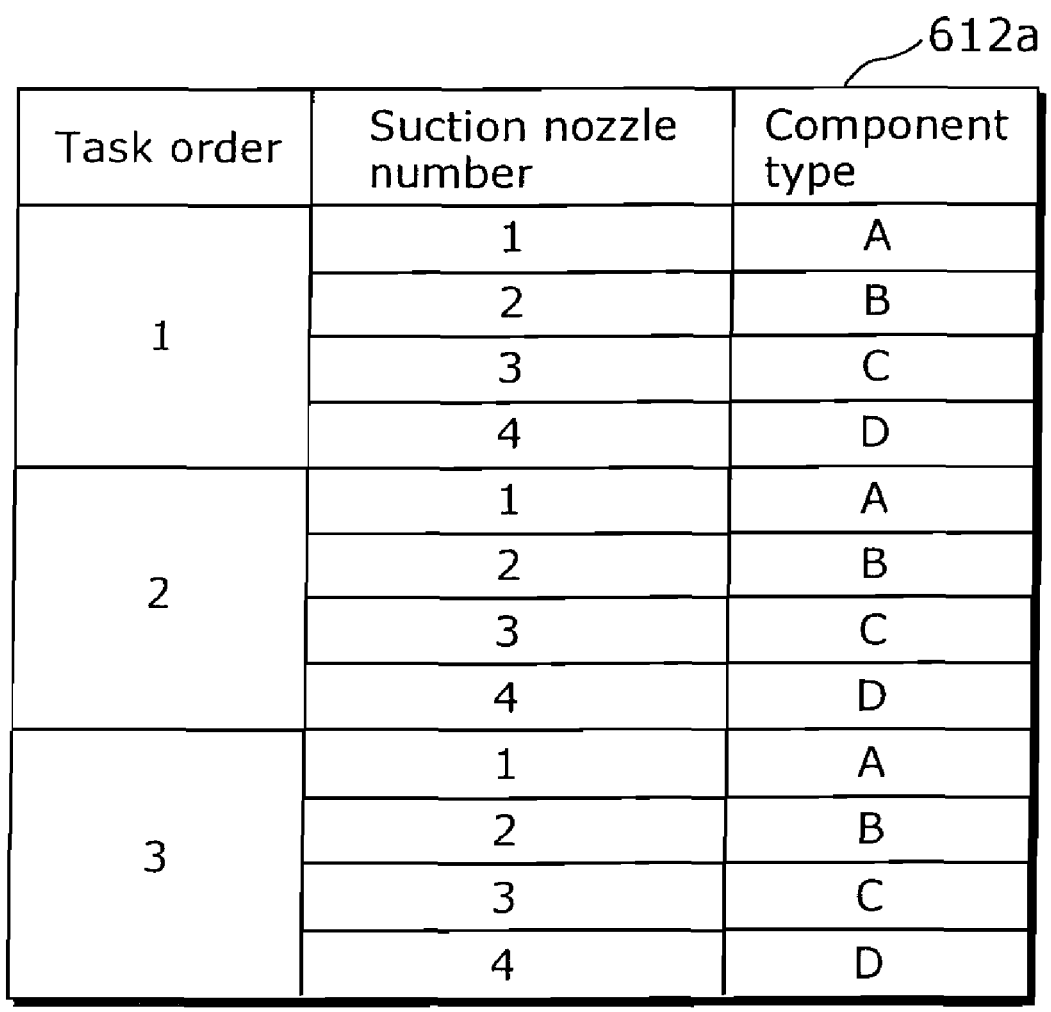
FIG. 42 is a diagram showing an example of task data.

The mounting control unit 604 controls the mechanism unit 602 to sequentially mount components onto the circuit board 20, based on the task data 612a (S32). FIG. 42 is a diagram showing an example of the task data 612a. As shown in FIG. 42, the four suction nozzles of the mounting head 112 suctions respective components of the component types "A" to "D", and mount the suctioned components onto the circuit board 20. When one task is considered as a group of components having the respective component types, the mounting head 112 mounts components for three tasks onto the circuit board 20.

The transportability judgment unit 606 judges whether or not the suction pressure measured when the suction nozzles suction the components is less than a predetermined transportable suction pressure (S34). Here, the "transportable suction pressure" is an upper limit of the suction pressure within which the suction nozzles do not drop the suctioned components even when the mounting head 112 moves at a current speed. Specifically, when the suction pressure is less than the transportable suction pressure, the component is dropped unless the transportation speed of the mounting head 112 is decreased. Note that, the "current speed" is applicable to any previously determined speed including not only the maximum speed which is previously set with respect to the component, but also the speed which is decreased from the maximum speed.

When the suction pressure is equal to or greater than the transportable suction pressure (NO in S34), the mounting control unit 604 controls the mechanism unit 602, and continues mounting components onto the circuit board 20 (S32).

When the suction pressure is less than the transportable suction pressure (YES in S34), the suction possibility judgment unit 608 judges whether or not the suction pressure is less than a suction-possible suction pressure which is determined in advance (S36). Here, the "suction-possible suction pressure" is a value less than the transportable suction pressure, and indicates an upper limit of the suction pressure within which the suction nozzles do not drop the components if the mounting head 112 moves at a decreased speed. Specifically, when the suction pressure is less than the suction-possible suction pressure, the component is dropped even when the mounting head 112 moves at the decreased speed.

When the suction pressure is less than the suction-possible suction pressure (YES in S36), the component discard instruction unit 614 instructs the mounting control unit 604 to discard the last suctioned component. The mounting control unit 604, which received the instruction, controls the mechanism unit 602 to discard the last suctioned component (S38).

Figure 43:
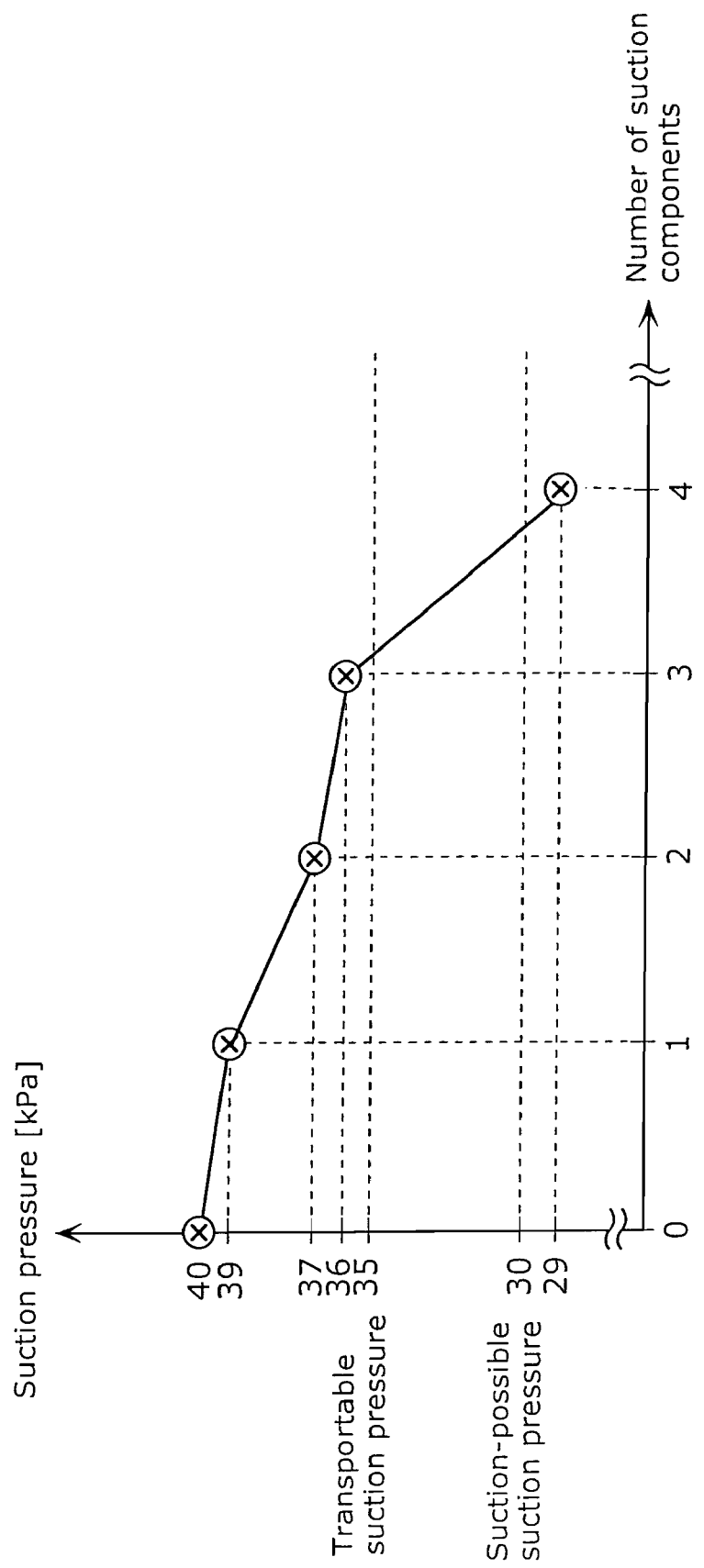
FIG. 43 is a diagram for explaining a component discard process.

FIG. 43 is a diagram for explaining the component discard process (S38). In FIG. 43, a horizontal axis in the graphic chart indicates the number of components that are currently being suctioned by the mounting head 112, and a vertical axis indicates the suction pressure by the mounting head 112. It is assumed that the transportable suction pressure is 35 kPa and the suction-possible suction pressure is 30 kPa. Here, the suction pressure measured when the components are not being suctioned (the number of suctioned components is 0), the suction pressure is 40 kPa. However, the suction pressure decreases as more components are suctioned. When the fourth suction nozzle suctions a component, the suction pressure becomes 29 kPa which is less than the suction-possible suction pressure 30. Therefore, the component suctioned by the fourth suction nozzle is discarded. Accordingly, the mounting head 112 mounts only the first three suctioned components onto the circuit board 20.

When the suction pressure is equal to or greater than the suction-possible suction pressure (NO in S36), the component suction stop instruction unit 616 instructs the mounting control unit 60 to stop suctioning a component which is scheduled to be suctioned next in the same task. The mounting control unit 604 controls the mechanism unit 602 to stop suctioning said component (S40).

Figure 44:
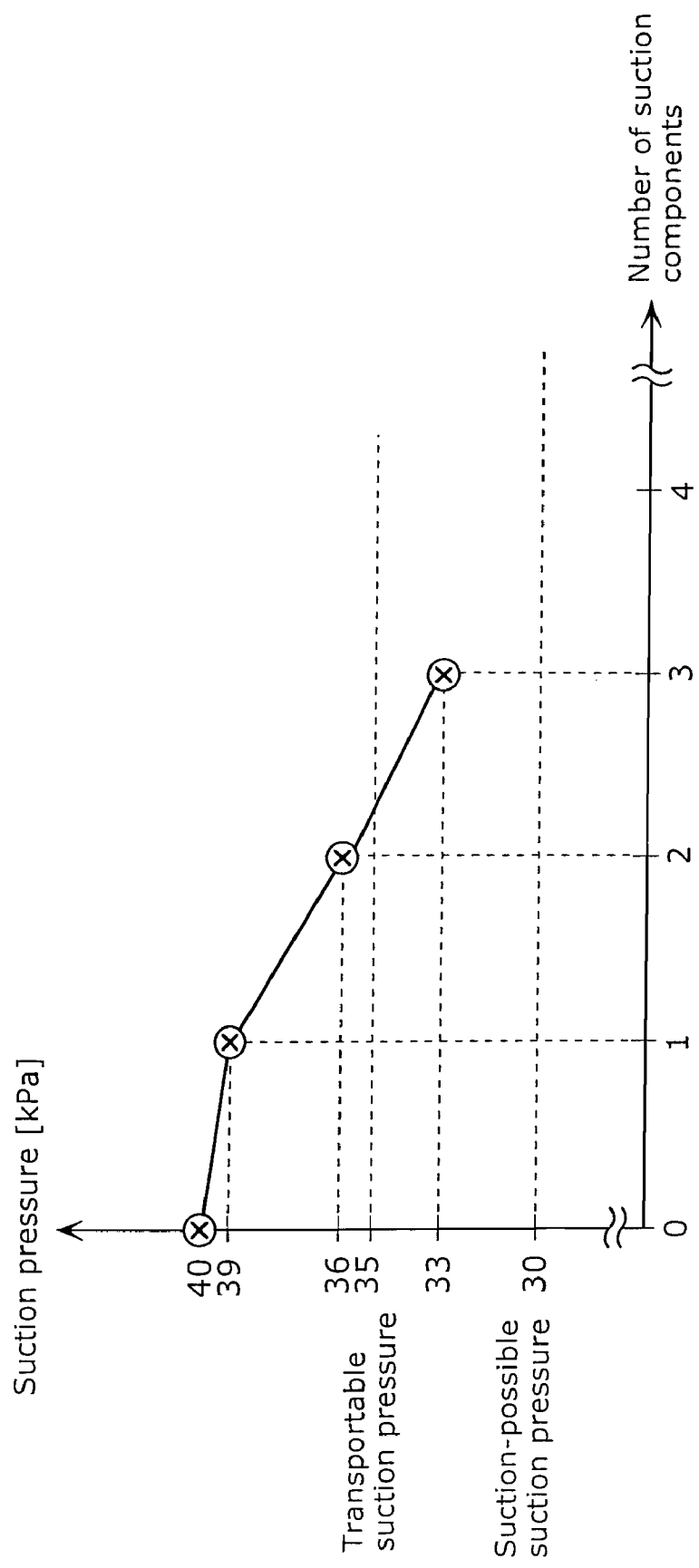
FIG. 44 is a diagram for explaining a component suction stop process.

FIG. 44 is a diagram for explaining the component suction stop process (S40). The graphic chart shown in FIG. 44 is the same graphic chart as shown in FIG. 43. In the graphic chart shown in FIG. 44, the suction pressure measured when the second suction nozzle suctions a component is 36 kPa which is higher than the transportable suction pressure 35 kPa. However, the suction pressure is decreased to 33 kPa when the third suction nozzle suctions a component. This value is less than the transportable suction pressure 35 kPa but is greater than the suction-possible suction pressure 30 kPa. Therefore, the component suctioned by the third suction nozzle is not discarded. However, suctioning a component which is scheduled to be suctioned by the fourth suction nozzle is stopped.

After that, the mounting control unit 604 controls the mounting head 112 to decrease its transportation speed as much as the predetermined value (S42).

Furthermore, the task reconfiguration unit 610 reconfigures the task so that the component which is stopped to be suctioned or is discarded is to be mounted by a subsequent or later task, and stores the reconfigured task into the task data 612a (S44).

Figure 45:
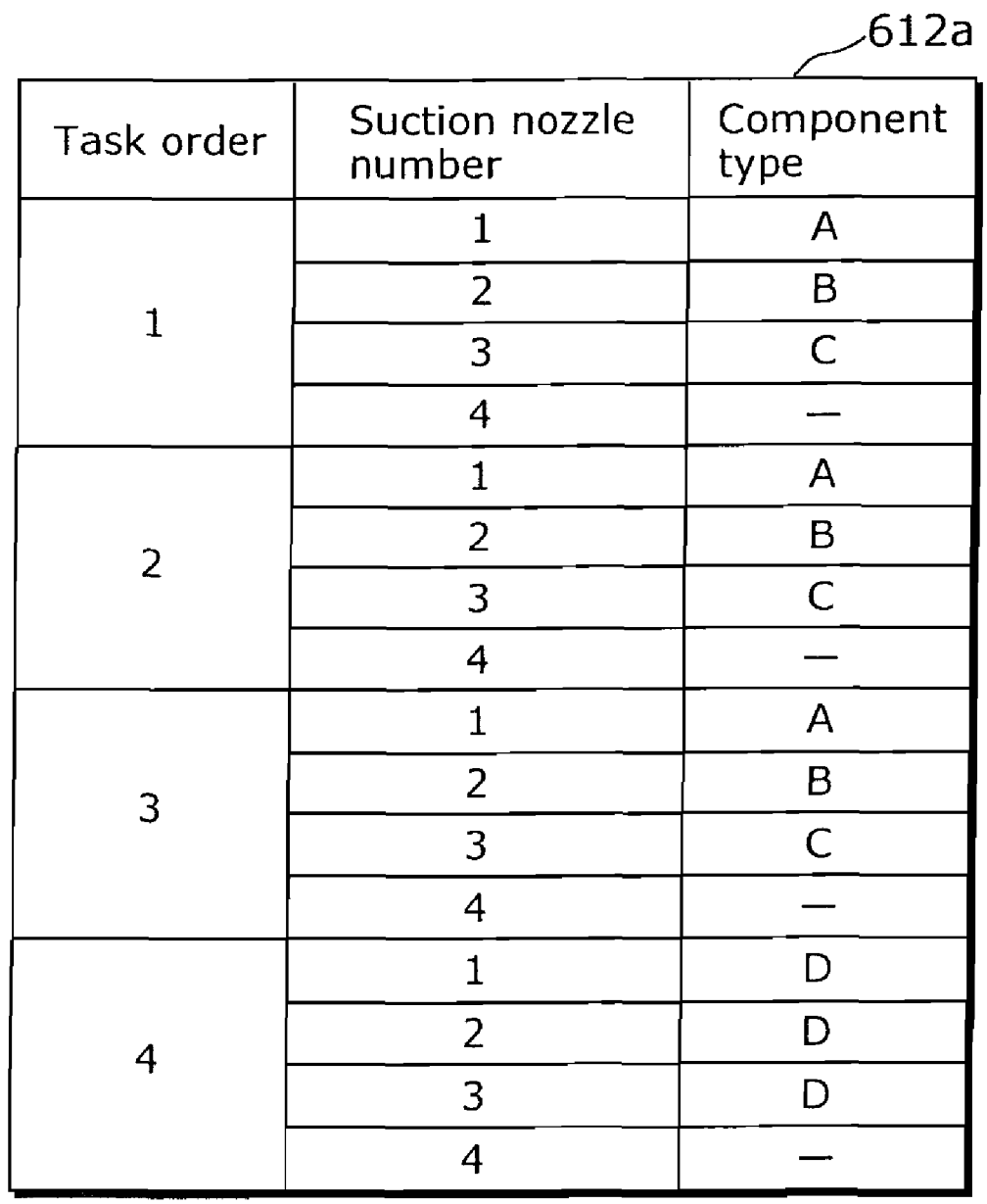
FIG. 45 is a diagram showing an example of task data obtained by reconfiguring the task data shown in FIG. 42.

FIG. 45 is a diagram showing an example of the reconfigured task data 612a which is obtained by reconfiguring the task data 612a shown in FIG. 42. In the task data 612a shown in FIG. 42, it is assumed that the component of the component type "D" which was scheduled to be suctioned by the fourth suction nozzle has been stopped from being suctioned or has been discarded. Here, as shown in FIG. 45, the task reconfiguration unit 610 reconfigures the task by determining a fourth task which includes only the components of the component type "D" which has been discarded or stopped from being suctioned, and updates the task data 612a.

Next, the mounting control unit 604 judges whether or not the production of the circuit board 20 has been completed (S46), and when the production has not been completed (NO in S46), continues the production of the board in accordance with the task data 612a (S32). Here, if the task has been reconfigured, the circuit board 20 is produced in accordance with the reconfigured task data 612a.

As described in the above, in the present embodiment, a suction pressure with respect to the component is dynamically measured when the component is mounted, and the suctioning of the component is stopped or the component is discarded depending on the situations. Therefore, the mounting head can mount components onto a circuit board while maintaining a suction pressure which is equal to or higher than a predetermined value. Furthermore, the transportation speed of the mounting head is decreased when necessary. Accordingly, components can be mounted while maintaining the correct positional precision even in the case where the component suction pressure is decreased due to air leakage, closing of a suction nozzle or the like.

Furthermore, the task is dynamically reconfigured in accordance with the stop of suctioning a component or a discard of the component. Therefore, a circuit board which is to be produced next is produced in accordance with the reconfigured task. Accordingly, it is possible to produce a circuit board while maintaining a correct positional precision and shortening the mounting time.

Note that, whereas, in the process executed by the component mounter 600 shown in FIG. 41, the last suctioned component is discarded (YES in S36, S38), the last suctioned component may be discarded when the suction pressure is less than the transportable suction pressure (YES in S34), and the task may be reconfigured. Consequently, the mounting head can move at the initially set speed.

Seventh Embodiment

Next, the component mounter according to the seventh embodiment of the present invention is described.

The present embodiment is different from the present embodiment in that the suction misalignment of a component caused when the suction nozzle suctions the component is measured, and when the suction misalignment is less than the predetermined transportable misalignment amount, the suctioning of a component is stopped and the task is reconfigured at a real time.

Figure 46:
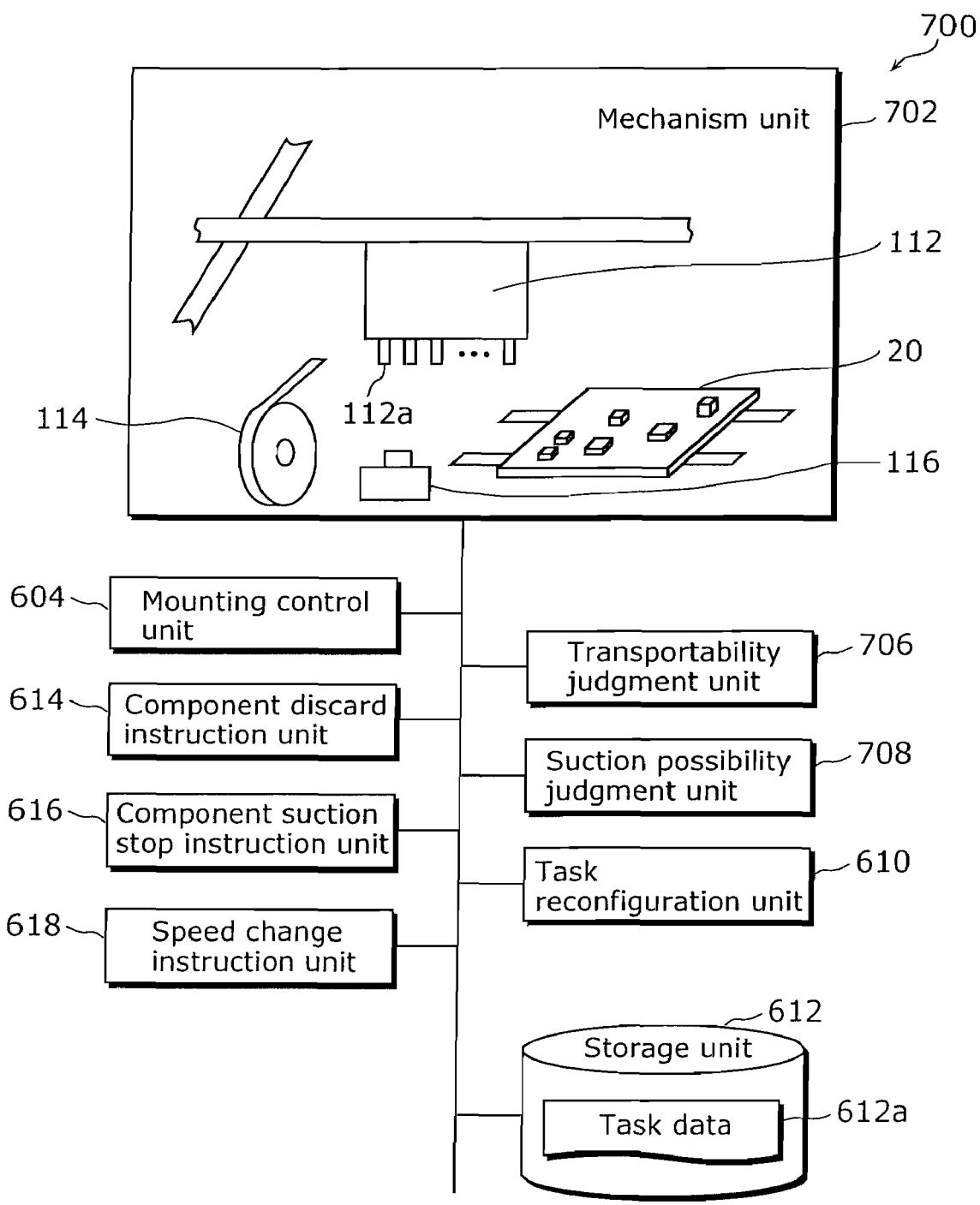
FIG. 46 is a block diagram showing a functional configuration of the component mounter.

FIG. 46 is a block diagram showing a functional configuration of the component mounter 700 according to the present embodiment. The component mounter 700 functionally includes a mechanism unit 702, a mounting control unit 604, a transportability judgment unit 706, a suction possibility judgment unit 708, a task reconfiguration unit 610, a storage unit 612, a component discard instruction unit 614, a component suction stop instruction unit 616, and a speed change instruction unit 618.

The mechanism unit 702 is an aggregate of mechanism-related constituent elements of the component mounter 100 such as the mounting head 112 and the component recognition camera 116 described with references to FIG. 6 to FIG. 8. However, it is assumed that the component mounter 700 of the present embodiment does not include the suction pressure sensor 412. The suction possibility judgment unit 706 is a processing unit which judges whether or not the currently suctioned components can be transported at the current transportation speed of the mounting head 112, based on the recognition result obtained by the component recognition camera 116.

The suction possibility judgment unit 708 is a processing unit which judges whether or not the currently suctioned components can be transported while being suctioned by the suction nozzles, based on the recognition result obtained by the component recognition camera 116.

Other processing units and storage apparatus included in the component mounter 700 are the same as those described in the sixth embodiment.

Next, the process executed by the component mounter 700 is described.

Figure 47:
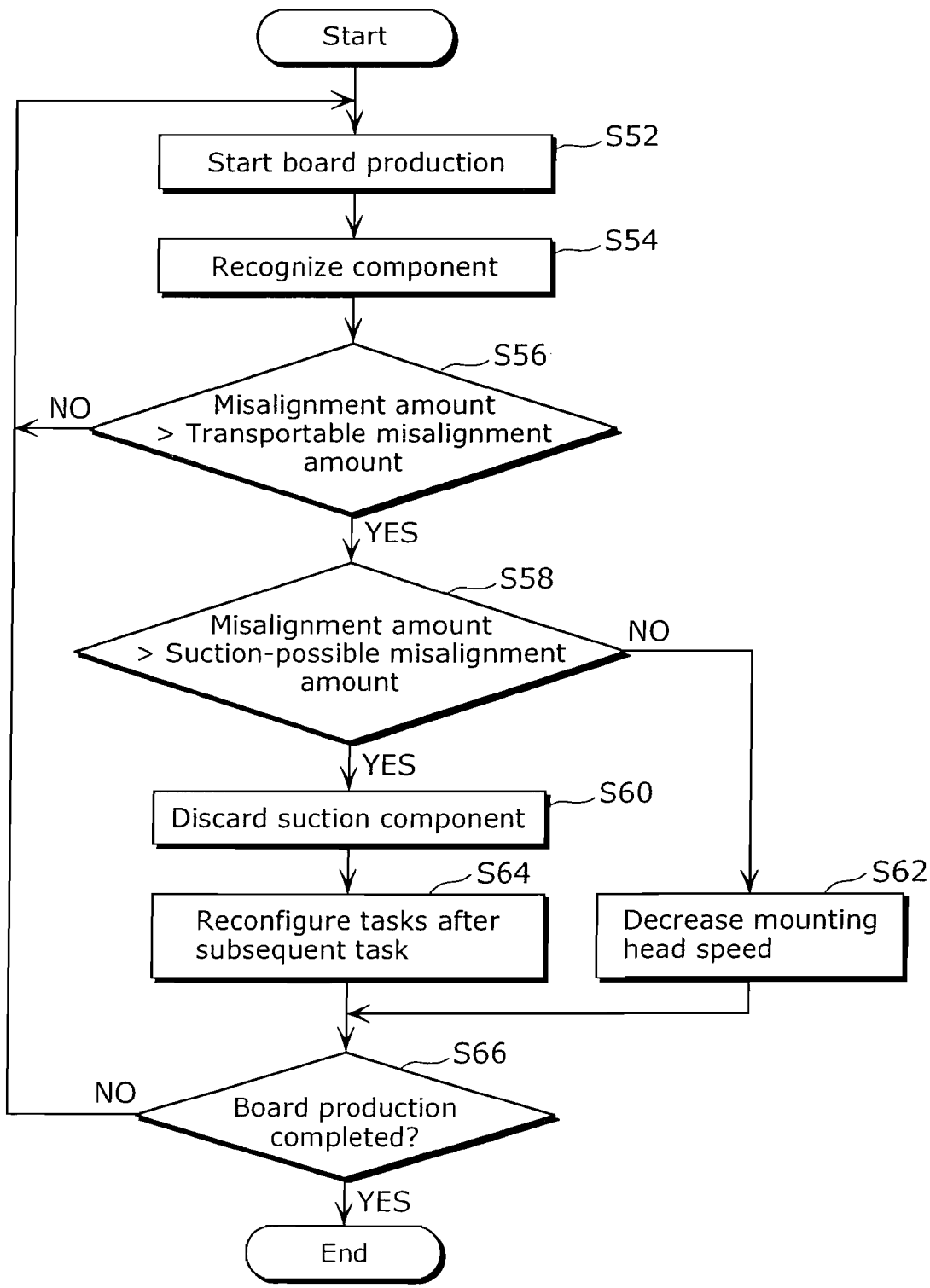
FIG. 47 is a flowchart showing a process executed by the component mounter.

FIG. 47 is a flowchart showing a process executed by the component mounter 700. Here, for the ease of explanation, it is assumed that the mounting head 112 has four suction nozzles 112a to 112d.

The mounting control unit 604 controls the mechanism unit 602 to sequentially mount components onto the circuit board 20, based on the task data 612a (S52). An example of the task data 612a is the same as the one shown in FIG. 42.

Figure 48:
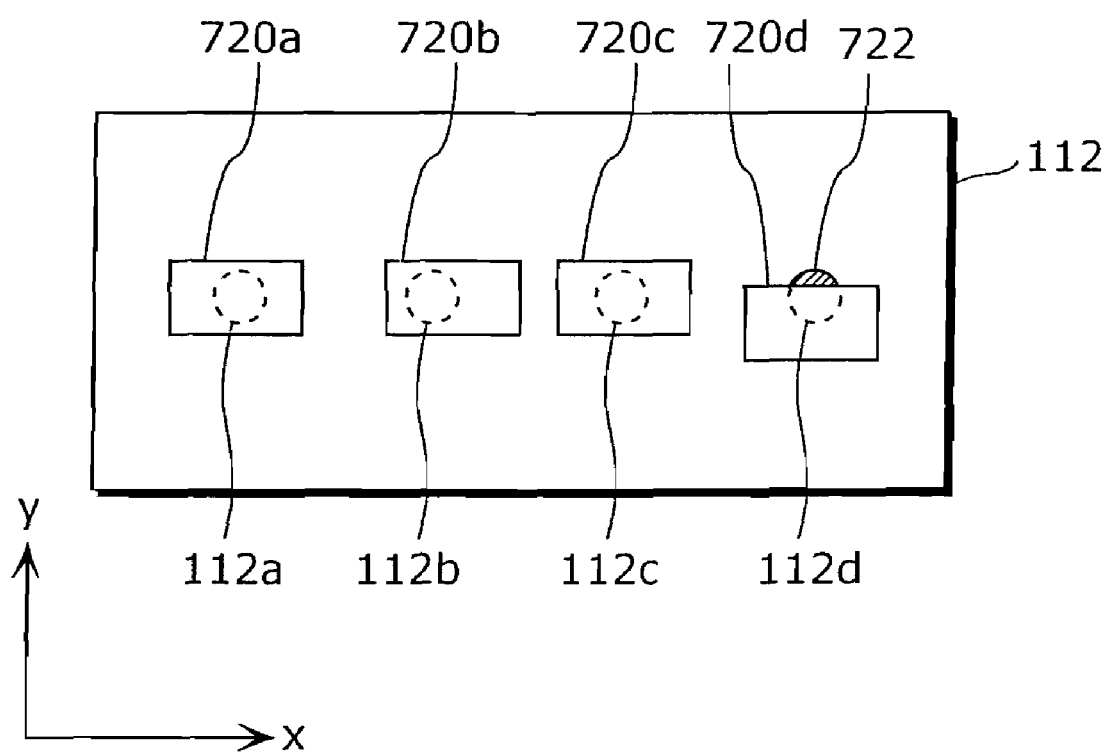
FIG. 48 is a diagram showing, from below, a mounting head which has suctioned a component.

After the four suction nozzles 112a to 112d suction the respective components, the component recognition camera 116 examines suction states of the components, and obtains an amount of component misalignment (S54). FIG. 48 is a diagram showing, from below, the mounting head 112 which has suctioned the component. In FIG. 48, the direction of the alignment of the suction nozzles 112a to 112d is assumed as an x-axis direction and the direction which is orthogonal to the x-axis is assumed as a y-axis direction. The suction nozzles 112a and 112c respectively suction the components 720a and 720c almost at the center of the nozzles. The suction nozzle 112b suctions the component 720b at a position shifted to the x-axis direction compared to the initially expected suction position of the component 720b. However, in this case, no gap appears between the suction nozzle 112b and the component 720b so that air leakage is not occurred. Therefore, the suction pressure of the component is not affected.

On the other hand, the suction nozzle 112d suctions the component 720d at a position shifted to the y-axis direction compared to the initially expected suction position of the component 720d. In this case, a gap 722 appears between the suction nozzle 112d and the component 720d, and therefore air leakage is occurred causing a decrease in the suction pressure of the component. Therefore, in the following description, a "misalignment amount" indicates an amount of misalignment toward the y-axis direction.

When the suction nozzles 112a to 112d suction respective components, the transportability judgment unit 706 judges whether or not the misalignment amount of any of the components is equal to or greater than the predetermined transportable misalignment amount (S56). Here, the "transportable misalignment amount" is an upper limit of the suction pressure within which the suction nozzles do not drop the components even when the mounting head 112 moves at a current speed. Specifically, when the misalignment amount exceeds the transportable misalignment amount, the component is dropped unless the transportation speed of the mounting head 112 is decreased.

When the misalignment amounts of all components are less than the transportable misalignment amount (NO in S56), the mounting control unit 604 controls the mechanism unit 602 to continue mounting components onto the circuit board 20 (S52).

If any of the misalignment amounts of the components exceed the transportable misalignment amount (YES in S56), the suction possibility judgment unit 708 judges whether or not any of the misalignment amounts of the components caused when the suction nozzles 112a to 112d suction the respective components exceeds the predetermined suction-possible misalignment amount (S58). Here, the "suction-possible misalignment amount" is a value which is greater than the transportable misalignment amount, and indicates an upper limit of the misalignment amount within which the suction nozzles do not drop the components if the mounting head 112 moves at a decreased speed. Specifically, when the misalignment amount exceeds the suction-possible misalignment amount, the suction nozzles drop the components even when the mounting head 112 moves at the decreased speed.

When any of the misalignment amounts of the components exceeds the suction-possible misalignment amount (YES in S58), the component discard instruction unit 614 instructs the mounting control unit 604 to discard such component. The mounting control unit 604, which received the instruction, controls the mechanism unit 602 to discard the last suctioned component (S60).

When the misalignment amounts of all components are less than the suction-possible misalignment amount (NO in S58), the mounting control unit 604 controls the mounting head 112 to decrease its transportation speed as much as the predetermined value (S62).

After the component discard process (S60), the task reconfiguration unit 610 reconfigures the task so that the component whose misalignment amount exceeds the suction-possible misalignment amount is to be mounted by a subsequent or later task, and stores the reconfigured task into the task data 612a (S64). The task reconfiguration process (S64) is the same as the task reconfiguration process (S44) described in the sixth embodiment. Specifically, the task reconfiguration unit 610 determines a task which only includes components whose misalignment amounts exceed the suction-possible misalignment amount, reconfigures the task, and updates the task data 612a.

After the task reconfiguration process (S64) or the speed decreasing process (S62), the mounting control unit 604 judges whether or not the production of the circuit board 20 has been completed (S66), and when the production has not been completed (NO in S66), continues the production of the board in accordance with the task data 612a (S52). Here, in the case where the task has been reconfigured, the circuit board 20 is produced in accordance with the reconfigured task data 612a.

As described in the above, in the present embodiment, a misalignment amount of the component is dynamically measured when the component is mounted, and the transportation speed of the mounting head is decreased when necessary. Furthermore, when the misalignment amount of the component is significantly large, the component is discarded. Therefore, even in the case where a misalignment is occurred when the component is suctioned from the component cassette 114 and the component suction pressure is decreased due to air leakage, components can be mounted while maintaining the correct positional precision.

Furthermore, the task is dynamically reconfigured in accordance with the component misalignment occurred when the component is suctioned. Therefore, a circuit board which is to be produced next is produced in accordance with the reconfigured task. Consequently, it is possible to produce a circuit board while maintaining a correct positional precision and shortening the mounting time. Whereas the component mounting system and component mounter according to embodiments of the present invention were described in the above, the present invention is not restricted to the disclosure of the embodiments.

For example, whereas the calculated maximum number of suction components is stored in the maximum suction component number table 319a in the second and third embodiments, it may be stored in a component library. The component library is a library in which information unique to each type of components available for the component mounter is collected, and includes, for each component type, a component size, a tact (a tact unique to each component type under a specific condition), and other pieces of constraint information (an available suction nozzle type, a recognition method by the component recognition camera 116, a speed level of the mounting head 112, and the like). FIG. 49 is a diagram showing an example of the component library. The right column of the diagram indicates the maximum number of suction components. In this diagram, an external view of each component type is also shown as a reference.

Whereas a suction nozzle automatically suctions a component when a suction pressure or weight of a component is measured in the second and third embodiments, the component may be manually suctioned to the suction nozzle in order to prevent the component from being misaligned when being suctioned.

Whereas the decreased suction pressure measurement unit 311 calculates a decreased suction pressure in the second embodiment, the suction pressure sensor 412 may calculate the decreased suction pressure and transmit the calculated decreased suction pressure to the mounting condition determination apparatus 300.

Furthermore, the estimation formula used to obtain a decreased suction pressure according to the third embodiment is not restricted to the formula (I), but may be other formulas, or may be the method of estimating the decreased suction pressure by referring to a table, which is previously prepared and identifies a relationship between the weight and decreased suction pressure of the component.

Whereas, in the sixth and seventh embodiments, a new task is determined by collecting only the components that were stopped from being suctioned or were discarded as shown in the task data 612a in FIG. 45 when the task is reconfigured, the method of reconfiguring the task is not necessarily restricted to this method. For example, the component may be inserted into an existing task so as to be suctioned by the suction nozzle to which a component has not been assigned.

Furthermore, whereas judging whether or not the currently suctioned component can be transported at a current transportation speed based on the suction power or the misalignment amount, the transportability judgment unit 606 (706) described in the sixth and seventh embodiments may perform such judgment based on other physical values. For example, other physical values include a component weight, a component shape, a shape of the suction nozzle 112a, and a gap amount between the component and the suction nozzle 112a.

Furthermore, whereas judging whether or not the currently suctioned component can be transported while being suctioned by the suction nozzle based on the suction power or the misalignment amount, the suction possibility judgment unit 608 (708) described in the sixth and seventh embodiments may perform such judgment based on other physical values. For example, other physical values include a component weight, a component shape, a shape of the suction nozzle 112a, and a gap amount between the component and the suction nozzle 112a.

Eighth Embodiment

The configuration of the component mounting system according to the eighth embodiment is the same as the one shown in FIG. 5.

The configuration of the component mounter 100 is the same as the configuration shown in FIGS. 6 and 7.

Also, the positional relationship between the mounting head 112 and component cassettes 114 is the same as the one shown in FIG. 7.

Figure 50:
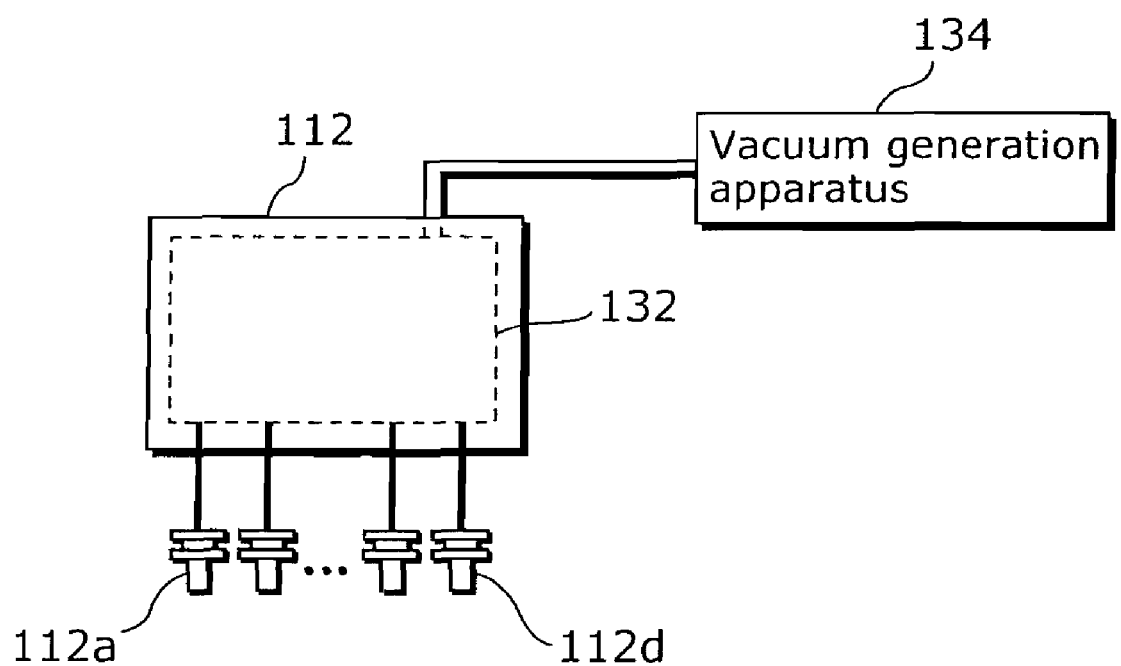
FIG. 50 is a schematic diagram of a mounting head.

FIG. 50 is a schematic diagram of the mounting head 112. The mounting head 112 equips the ten suction nozzles 112a to 112d as described above, and internally has a vacuum room 132 which is connected to the suction nozzles 112a to 112d. The vacuum room 132 is connected to a vacuum generation apparatus 134 which is placed in the component mounter 100. The vacuum generation apparatus 134 suctions air in the vacuum room 132 so as to make the vacuum room 132 in an air-vacuumed state. Accordingly, the suction nozzles 112a to 112d connected to the vacuum room 132 can suction the components by air-vacuum.

Figure 51:
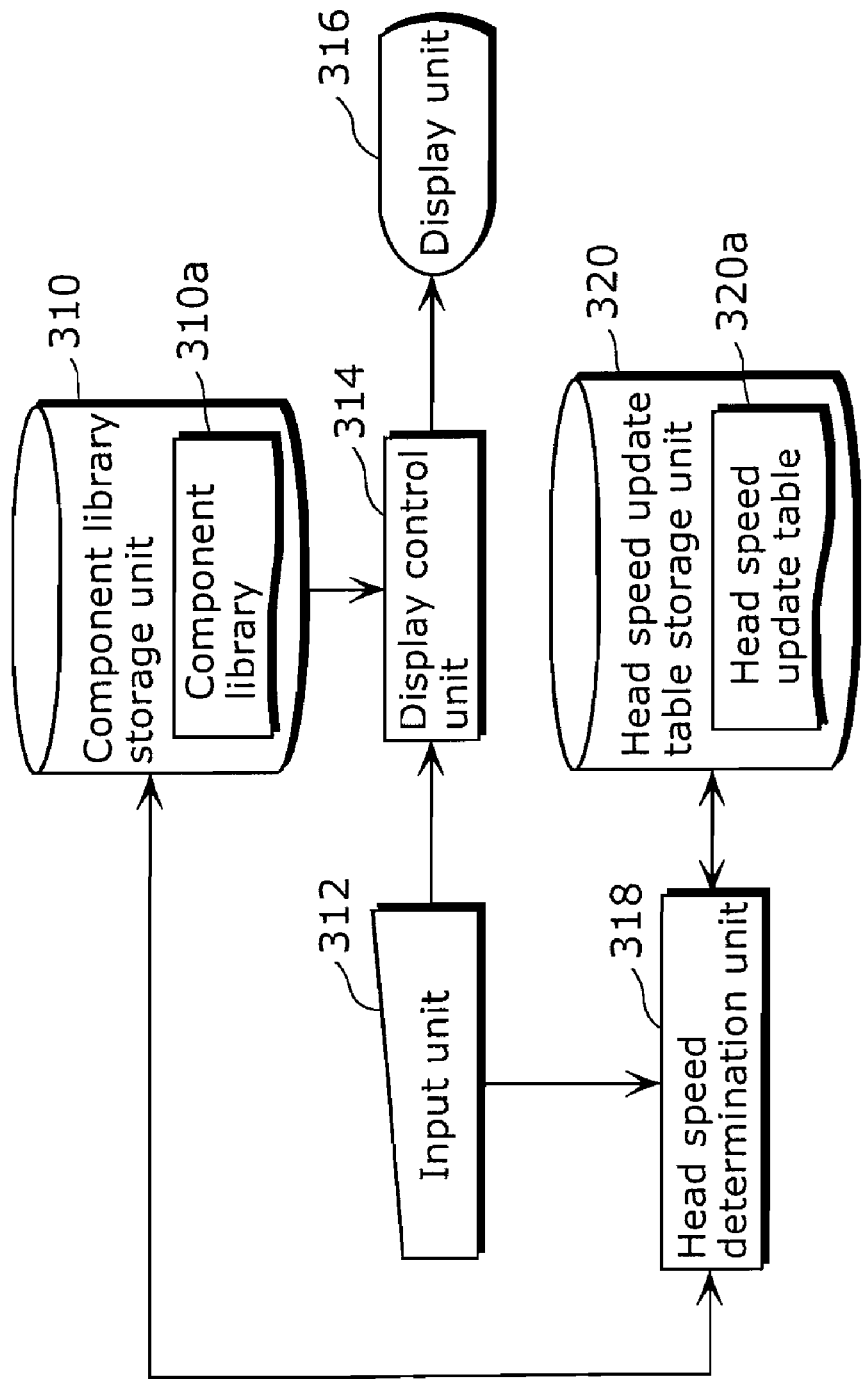
FIG. 51 is a block diagram which shows an internal configuration of the component mounting condition determination apparatus.

FIG. 51 is a block diagram which shows an internal configuration of the component mounting condition determination apparatus 300.

The mounting condition determination apparatus 300 is an apparatus which determines a transportation speed of the mounting head 112 included in the component mounter 100, and includes a component library storage unit 310, an input unit 312, a display control unit 314, a display unit 316, a head speed determination unit 318, and a head speed update table storage unit 320.

The component library storage unit 310 is a storage apparatus which stores a component library 310a. An example of the component library 310a is the same as the one shown in FIG. 19.

The display unit 316 is an apparatus such as a liquid-crystal display for displaying letters, images and the like.

The input unit 312 is an apparatus such as a keyboard, mouse, and the like for a user to input various types of data.

The display control unit 314 is a processing unit which controls the display unit 316 to display data included in the component library 310a and the data inputted by the input unit 312.

The head speed update table storage unit 320 is a storage apparatus in which a head speed update table 320a for determining a transportation speed of the below-mentioned mounting head 112 is stored.

The head speed determination unit 318 is a processing unit which determines a transportation speed of the mounting head 112, based on the data inputted by the input unit 312 and the head speed update table 320a.

FIG. 52 is a diagram showing an example of the head speed update table 320a. The head speed update table 320a includes a leakage parameter which indicates a degree of air leakage from the suction nozzles and a degree of head speed change which indicates a degree of change in a transportation speed of the mounting head 112 determined based on the leakage parameter. For example, when the leakage parameter is "0", the speed of the mounting head 112 does not change, and however, when the leakage parameter is "1", the speed of the mounting head 112 is reduced to ten percent from the current head speed.

The air leakage phenomenon is as described in FIGS. 22 to 33.

Figure 53:
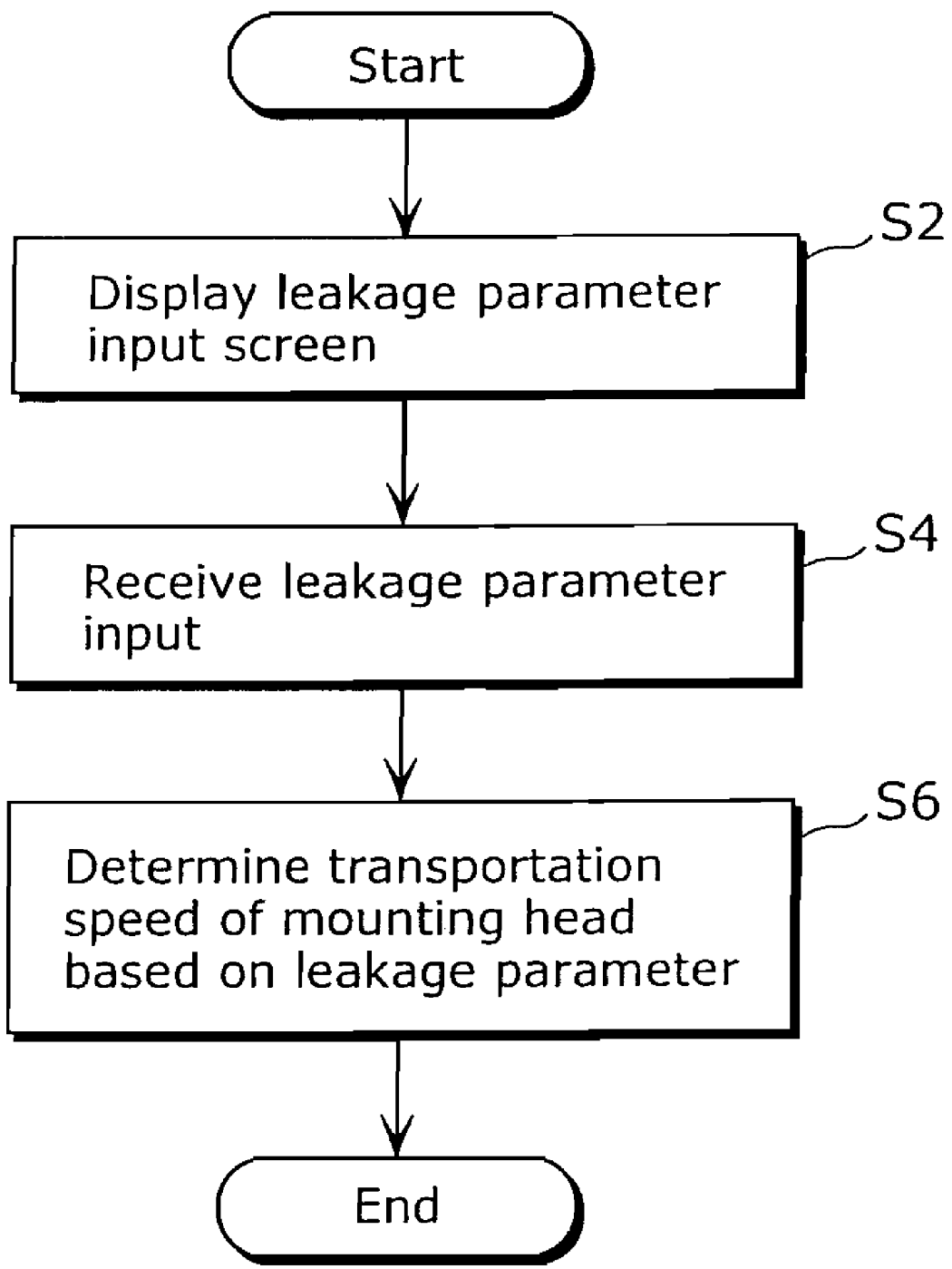
FIG. 53 is a flowchart showing a process executed by the component mounting condition determination apparatus.

Next, the process executed by the mounting condition determination apparatus 300 shall be described. FIG. 53 is a flowchart showing a process executed by the component mounting condition determination apparatus 300.

The display control unit 314 displays, for each type of component, an input screen for a leakage parameter, with reference to the component library 310a (S2). An example of the input screen for a leakage parameter is the same as shown in FIG. 35.

When an operator inputs a leakage parameter into the input column 372 (S4), the head speed determination unit 318 obtains a degree of head speed change corresponding to an input leakage parameter by referring to the head speed update table 320a shown in FIG. 52. Furthermore, the head speed determination unit 318 determines the transportation speed of the mounting head 112 by changing the transportation speed indicated by the head speed level set for a target component type, based on the obtained degree of head speed change (S6). For example, on the input screen 370 shown in FIG. 35, "1" is set as a leakage parameter. Here, the head speed level is "1". As shown in FIG. 52, when the leakage parameter is "1", the transportation speed of the mounting head 112 is decreased to ten percent. Therefore, the head speed determination unit 318 determines the transportation speed decreased to ten percent from the transportation speed whose head speed level of the mounting head 112 is "1", as a new transportation speed of the mounting head 112.

The transportation speed of the mounting head 112 is thus determined for each component type. When the mounting head 112 mounts a component onto the circuit board 20, the mounting head 112 moves based on the transportation speed determined in the transportation speed determination process (S6). Since the mounting head 112 can suction plural components, the mounting head 112 moves at a minimum speed out of the plural transportation speeds corresponding to the respective components that are currently being suctioned, when the mounting head 112 moves.

As described in the above, in the eighth embodiment, the transportation speed of the mounting head 112 can be determined considering the air leakage from the gap between the component and the suction nozzle, by setting a leakage parameter. Accordingly, the component can be mounted onto a board at a correct positional precision.

Ninth Embodiment

Next, the component mounter according to the ninth embodiment of the present invention shall be described.

The present embodiment is different from the eighth embodiment in that an image of a suction plane of the component suctioned by the suction nozzle is captured with a camera, and the transportation speed of the mounting head 112 is determined based on the captured image.

Figure 54:
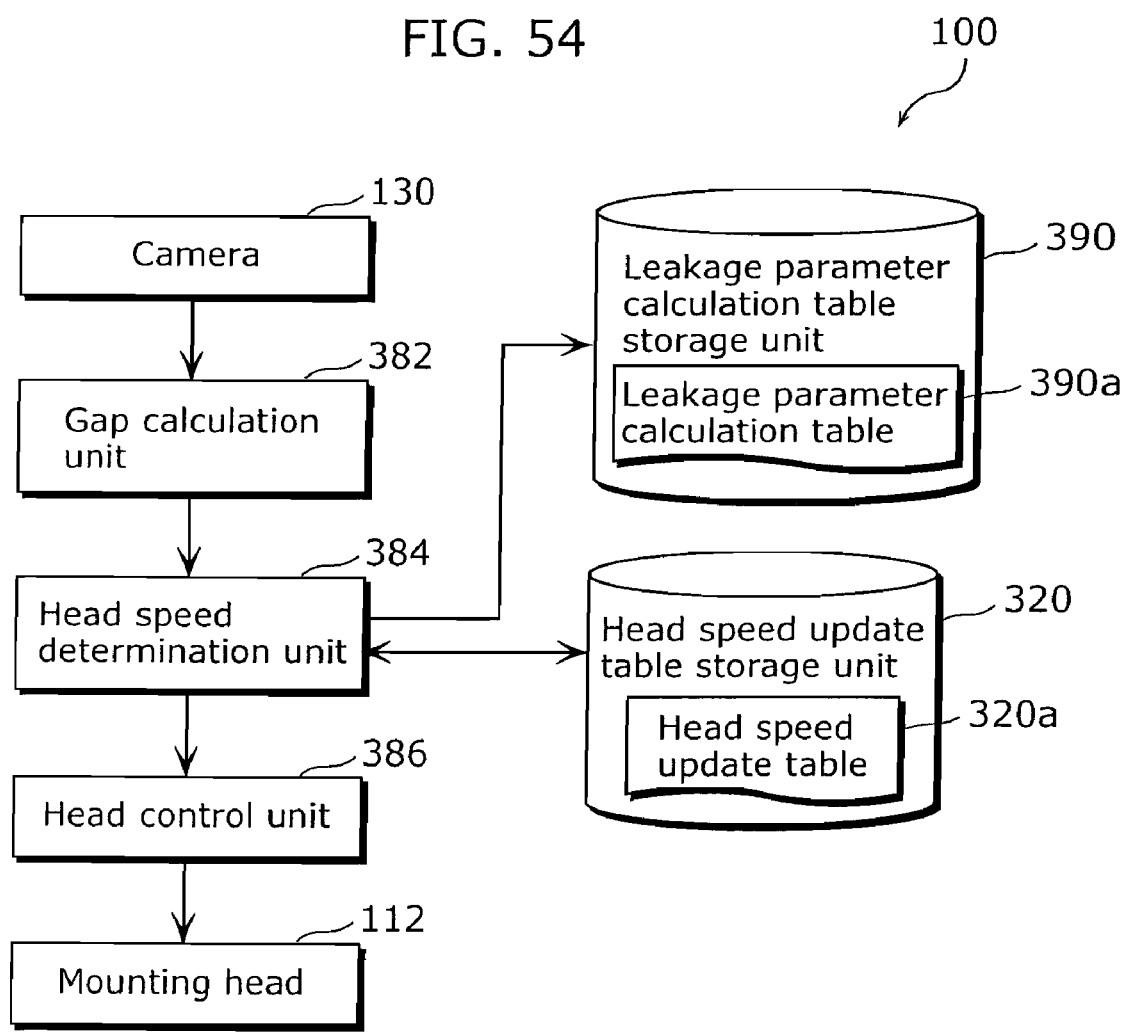
FIG. 54 is a diagram showing a configuration of a processing unit which is further included in the component mounter.

The configuration of the component mounter 100 according to the present embodiment is the same as the configuration shown in the eighth embodiment. However, as shown in FIG. 54, the configuration of the component mounter 100 according to the present embodiment is different from the component mounter 100 shown in the eighth embodiment in that the a processing unit for determining a mounting condition of a component is further included. As shown in FIG. 54, the component mounter 100 includes a camera 130, a gap calculation unit 382, a head speed determination unit 384, a head control unit 386, a mounting head 112, a leakage parameter calculation table storage unit 390, and a head speed update table storage unit 320.

The camera 130, the mounting head 112, and the head speed update table storage unit 320 are the same as those described in the eighth embodiment, and therefore the detailed description thereof are not repeated.

The gap calculation unit 382 is a processing unit which obtains a size of the component from an image of the component captured with the camera 130, and calculates an amount of gap appeared between the component and the suction nozzle 112a based on the size and an inner diameter of the suction nozzle 112a.

The leakage parameter calculation table storage unit 390 is a storage apparatus which stores a leakage parameter calculation table 390a for calculating a below-mentioned leakage parameter. An example of the leak parameter calculation table 390a is the same as shown in FIG. 37.

The head speed determination unit 384 is a processing unit which determines a transportation speed of the mounting head 112, based on the leakage parameter calculation table 390a obtained by the gap calculation unit 382 and the head speed update table 320a.

The head control unit 386 is a processing unit which controls the mounting head 112 to move based on the transportation speed determined by the head speed determination unit 384.

Figure 55:
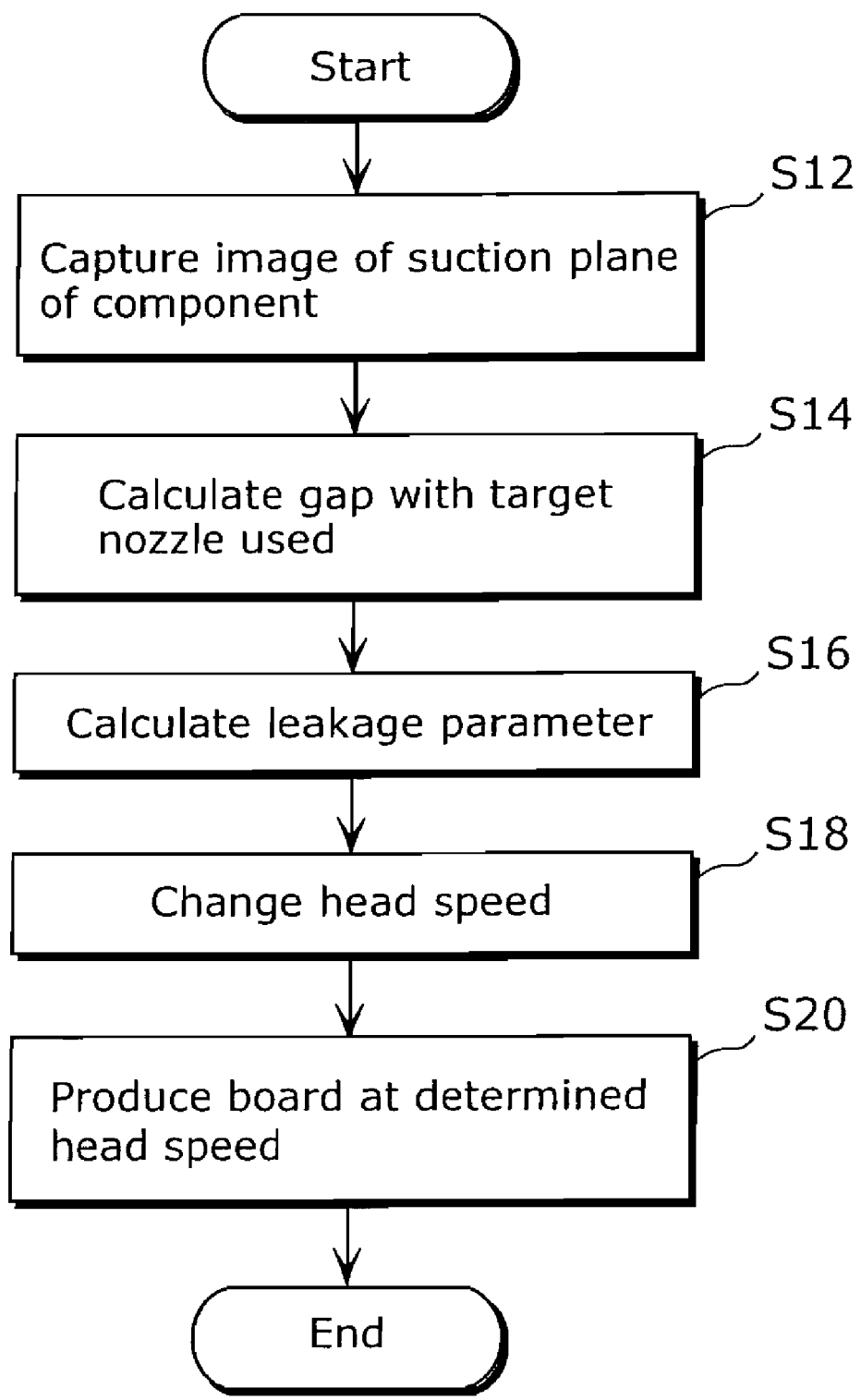
FIG. 55 is a flowchart showing a process executed by the component mounter.

Next, the process executed by the component mounter 100 shall be described. FIG. 55 is a flowchart showing a process executed by the component mounter 100.

When at least one component cassette 114 is changed by the component supply unit 115a or 115b, the component mounter 100 moves the camera 130 to a component suction port of the component cassette 114 so that the camera 130 captures an image of the suction plane of the component suctioned by the suction nozzle 112a (S12).

The gap calculation unit 382 calculates an area of a gap appeared when the component is suctioned by the suction nozzle 112a, based on an image of the component captured by the camera 130 and an inner diameter of the suction nozzle 112a used for suctioning the component (S14). The gap area "a" is calculated in accordance with the above-identified formula (I).

The head speed determination unit 384 extracts, from the leakage parameter calculation table 390a, a leakage parameter which corresponds to the gap area "a" calculated according to the formula (1) (S16). Note that, the head speed determination unit 384 may calculate a leakage parameter from the gap area "a" using a predetermined calculation.

Furthermore, the head speed determination unit 384 extracts, from the head speed update table 320a, a degree of head speed change corresponding to the extracted leakage parameter, and decreases the current transportation speed of the mounting head 112 based on the extracted degree of head speed change (S18).

The head control unit 386 moves the mounting head 112 at the decreased transportation speed so that the component 400 is mounted onto the circuit board 20 (S20).

As described in the above, in the ninth embodiment, an area of a gap appeared when a component is suctioned by a suction nozzle is calculated based on a captured image of the component, and the transportation speed of the mounting head is determined considering the air leakage due to the gap area. Therefore, it is prevented from the component being dropped or being misaligned from the suction position, when the mounting head moves. Accordingly, a component can be mounted onto a board at a correct positional precision.

Furthermore, the amount of air leakage changes in the case where the component mounter lacks a replacement component and a different type of component having the same characteristics as the original component to be replaced is used as the replacement component, because the gap area appeared between the suction nozzle and the newly replaced component is different from the gap between the suction nozzle and the original component. However, in the present embodiment, even when such a case occurs, the gap area is recalculated when the component is replaced. Therefore, an appropriate transportation speed for the mounting head can be determined.

Tenth Embodiment

Next, the component mounter according to the tenth embodiment of the present invention shall be described.

The present embodiment is different from the eighth and night embodiments in that a pressure (a vacuum pressure) in the vacuum room of the mounting head is detected by a sensor, and a transportation speed of the mounting head is determined based on the detected vacuum pressure.

The configuration of the component mounter 100 according to the present embodiment is the same as the configuration shown in the eighth embodiment. However, as shown in FIG. 56, the component mounter 100 of the present embodiment is different from the component mounter 100 of the eighth embodiment in that a processing unit for determining a mounting condition of a component is further included.

Figure 56:
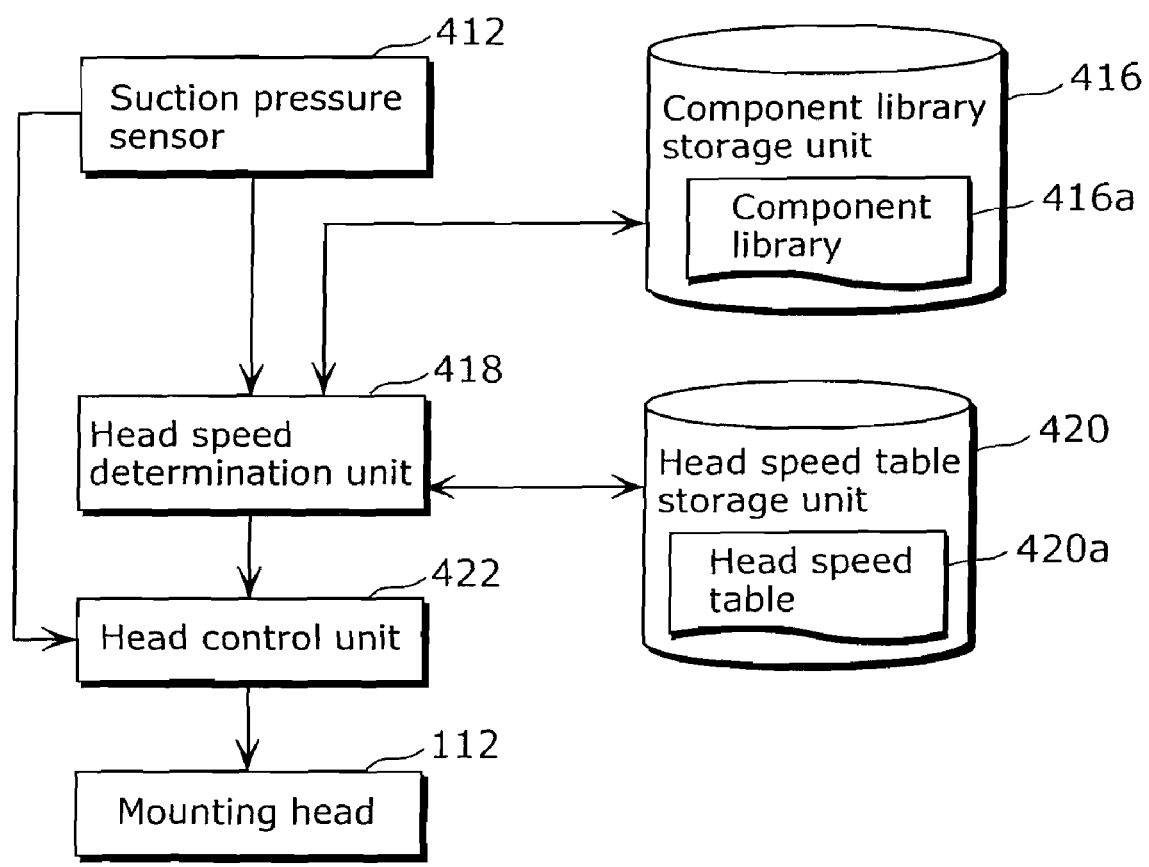
FIG. 56 is a diagram showing a configuration of a processing unit which is further included in the component mounter.

As shown in FIG. 56, the component mounter 100 includes a suction pressure sensor 412, a component library storage unit 416, a head speed determination unit 418, a head speed table storage unit 420, a head control unit 422, and a mounting head 112.

The suction pressure sensor 412 is a sensor which measures a pressure in the vacuum room 132 placed in the mounting head 112 as shown in FIG. 50. Note that, a "suction pressure" indicates an absolute value when a vacuum pressure is expressed by a gage pressure, hereinafter.

The component library storage unit 416 is a storage apparatus which stores a below-mentioned component library 416a.

The head speed table storage unit 420 is a processing unit which stores a below-mentioned head speed table 420a.

The head speed determination unit 418 is a processing unit which determines a transportation speed of the mounting head 112, based on the output value from the suction pressure sensor 412, the component library 416a, and the head speed table 420a.

The head control unit 422 is a processing unit which controls the mounting head 112 to move, based on the transportation speed determined by the head speed determination unit 418.

FIG. 57 is a diagram showing an example of the component library 416a. The component library 416a has a column of "post-change head speed level" for inputting a changed head speed level of the mounting head 112 determined by the head speed determination unit 418, in addition to the component library 310a shown in FIG. 19.

FIG. 58 is a diagram showing an example of the head speed table 420a. The head speed table 420a is a table which indicates a relationship among the suction pressure measured by the suction sensor 412, the current head speed level of the mounting head 112, and the changed head speed level of the mounting head 112. For example, when the suction pressure p is 35 kPa, and the current head speed level of the mounting head 112 is "1", the changed head speed level of the mounting head 112 is "2". Here, "NA" in the diagram indicates that a component is not suctioned because the suction pressure for suctioning the component is too small so that the head speed level cannot be decreased.

Figure 59:
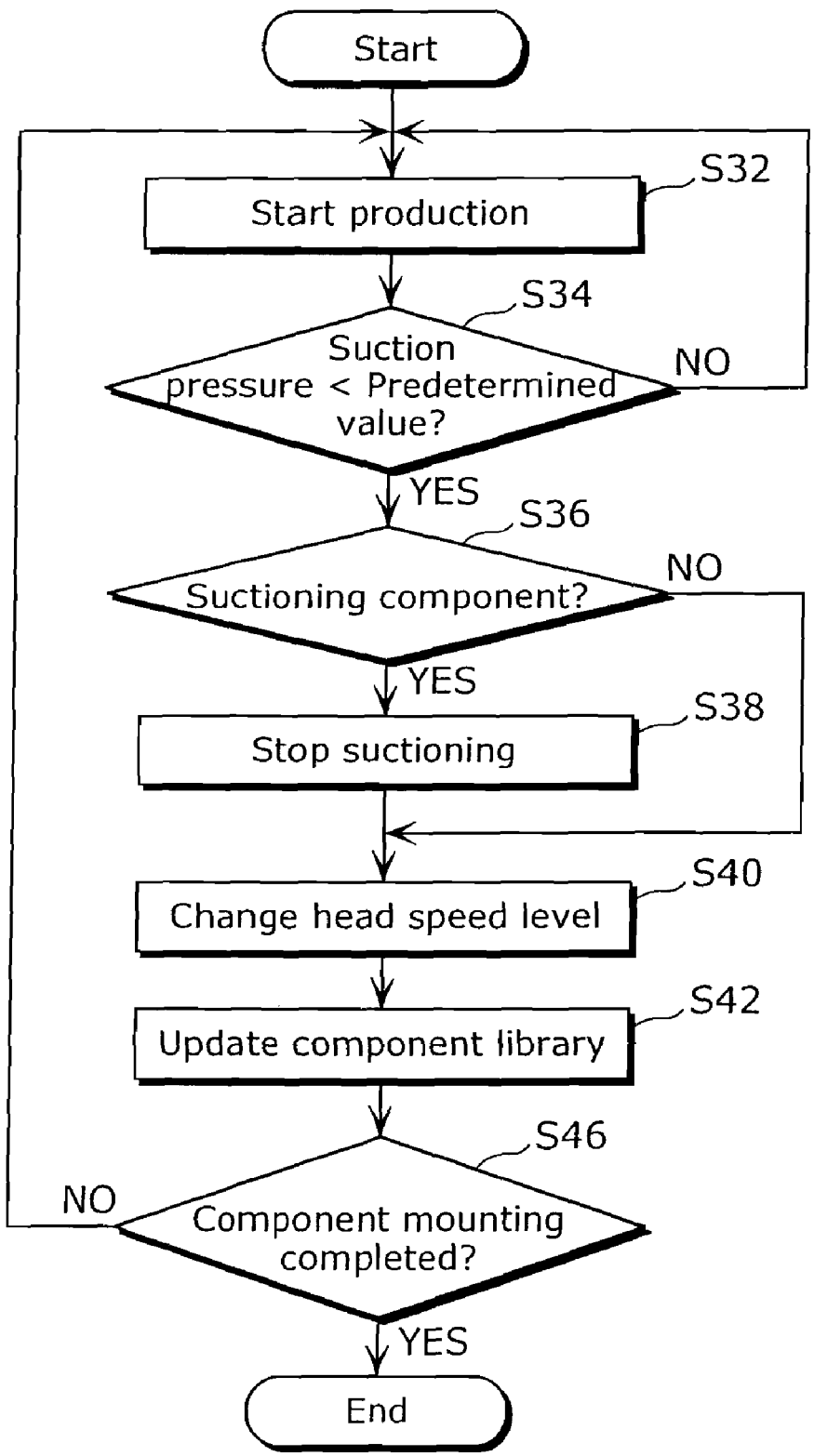
FIG. 59 is a flowchart showing a process executed by the component mounter.

Next, the process executed by the component mounter 100 shall be described. FIG. 59 is a flowchart showing a process executed by the component mounter 100.

The component mounter 100 starts producing a circuit board 20 (S32). During the production, the suction pressure sensor 412 always measures the vacuum pressure (a suction pressure) in the vacuum room 132. When the suction pressure is equal to or greater than a predetermined value (NO in S34), the production is continued (S32).

When the suction pressure is less than the predetermined value (YES in S34), the head control unit 422 judges whether or not the mounting head 112 is currently suctioning a component (S36), and if the mounting head 112 is suctioning the component, controls the mounting head 112 to stop the suctioning (S38).

After that, the head speed determination unit 418 calculates a changed head speed level from the current suction pressure and the head speed level of the mounting head 112, based on the head speed table 420a shown in FIG. 58. Furthermore, the head control unit 422 moves the mounting head 112 based on the changed head speed level (S40). For example, when the current suction pressure p is 25 kPa and the head speed level of the mounting head 112 is "2", the head speed level of the mounting head 112 is changed to "4".

Furthermore, the head speed determination unit 418 writes the calculated head speed level into the column of "post-change head speed level" in the component library 416a (S42). In the case where all components have been completely mounted onto the circuit board 20 (YES in S46), the process executed by the component mounter 100 is finished, and in the case where all components have not been completely mounted yet (NO in S46), the production is continued by the component mounter 100 (S32). As described in the above, in the tenth embodiment, it is possible to control the mounting head 112 to decrease the transportation speed when it is judged that the suction power of the suction nozzle is decreased from the predetermined value, based on the vacuum pressure in the vacuum room 132 in the mounting head 112. Therefore, it is prevented that the component is dropped or that the component is misaligned from the suction position, when the mounting head 112 moves. Accordingly, a component can be mounted onto a board at a correct positional precision.

Furthermore, the speed level calculated based on the suction pressure in the vacuum room 132 is written into the column of the "post-change head speed level" in the component library 416a, in the component library update process (S42 in FIG. 59). Accordingly, when the suction pressure is similarly decreased at the time of mounting a component, the transportation speed of the mounting head 112 to be decreased can be specified only by referring to the changed head speed level written in the component library 416a.

Whereas the component mounting system and component mounter according to the embodiments of the present invention were described in the above, the present invention is not restricted to the disclosure of the embodiments.

For example, the function of the component mounting condition determination apparatus 300 described in the eighth embodiment may be placed in the component mounter 100.

Furthermore, the function of the component mounter 100 to determine the transportation speed of the mounting head 112 described in the ninth and tenth embodiments may be placed in the component mounting condition determination apparatus which is different from the component mounter 100.

Figure 60:
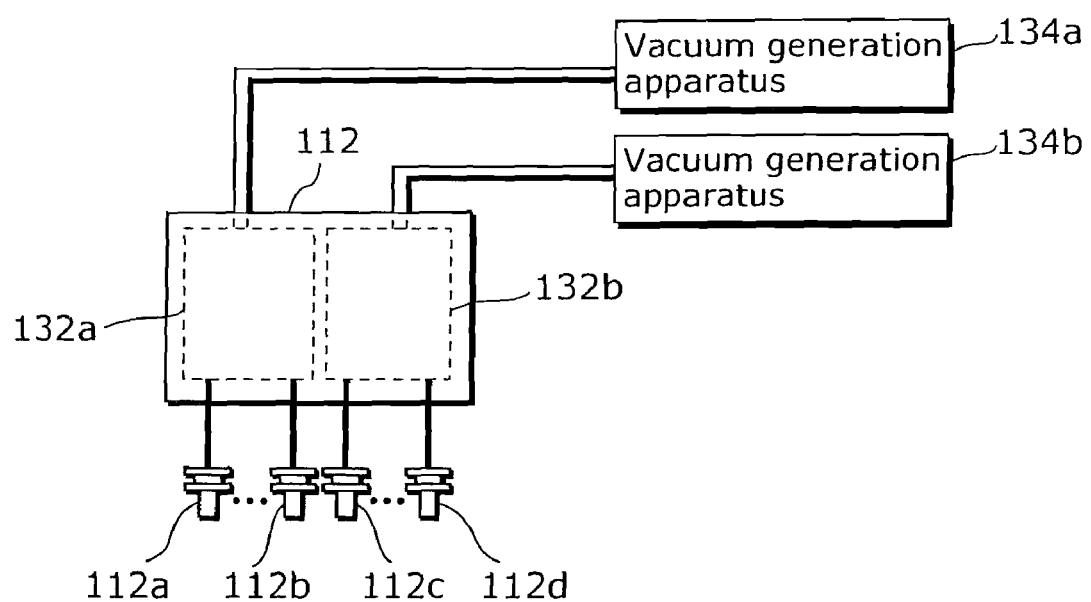
FIG. 60 is a diagram showing an example of one of other configurations of a mounting head.

As shown in FIG. 60, two vacuum rooms 132a and 132b may be placed in the mounting head 112. In this case, vacuum generation apparatuses 134a and 134b are placed for the respective vacuum rooms 132a and 132b. The five suction nozzles 112a to 112b are connected to the vacuum room 132a and five suction nozzles 112c to 112d are connected to the vacuum room 132b.

Figure 61:
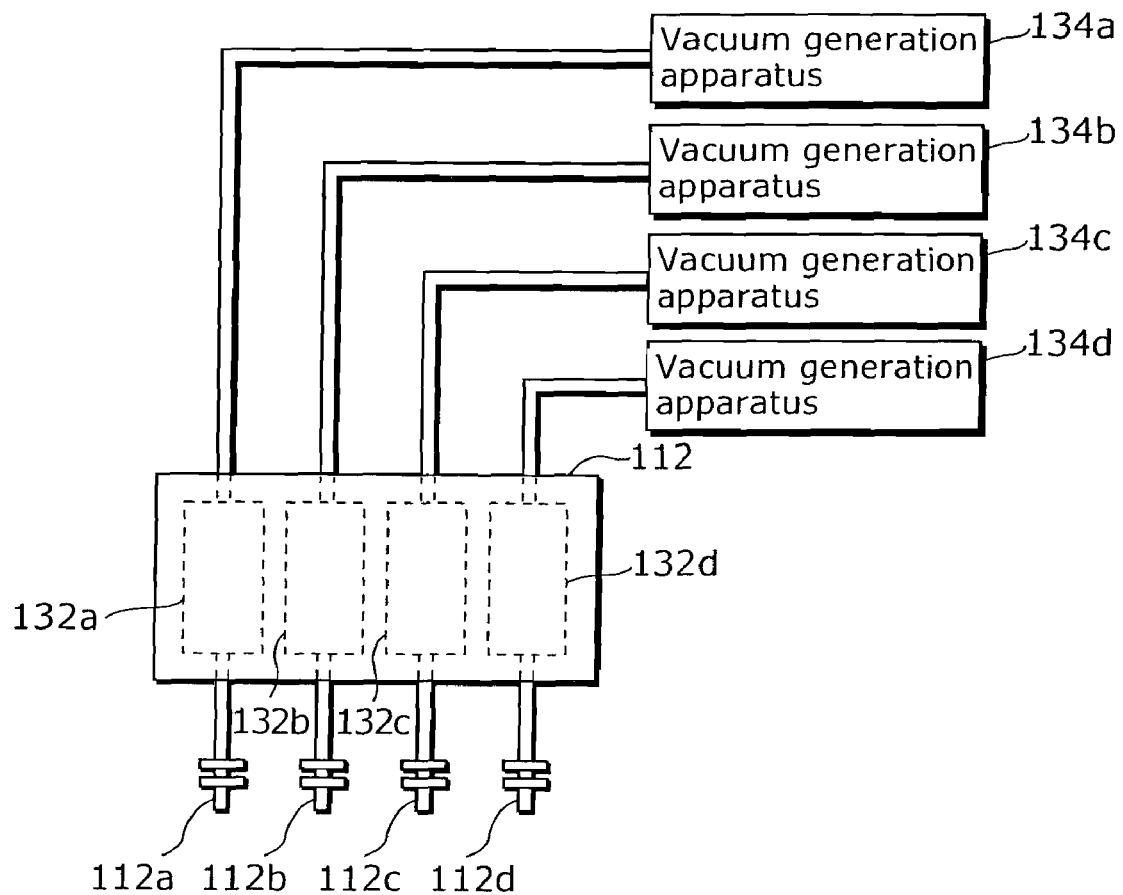
FIG. 61 is a diagram showing an example of one of other configurations of the mounting head.

Furthermore, as shown in FIG. 61, a vacuum room may be placed for each suction nozzle in the mounting head 112. Specifically, the vacuum rooms 132a to 132d are respectively placed for the corresponding suction nozzles 112a to 112d. The vacuum generation apparatuses 134a to 134d are placed for the respective vacuum rooms 132a to 132d.

Figure 62:
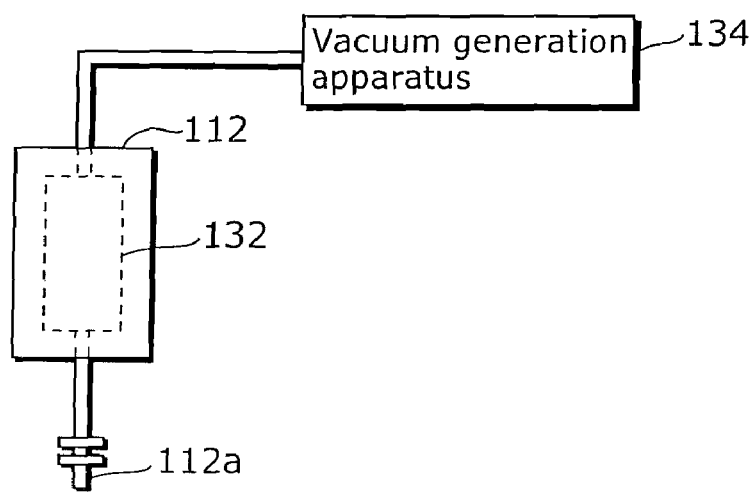
FIG. 62 is a diagram showing an example of one of other configurations of the mounting head.

In addition, as shown in FIG. 62, the mounting head 112 may have only one suction nozzle 112a. In this case, a vacuum room 132 is placed in the mounting head 112 for the suction nozzle 112a. Also, the vacuum generation apparatus 134 is placed for the vacuum room 132.

As shown in FIGS. 61 and 62, when a vacuum room is placed for each suction nozzle, the decrease in the suction power of one suction nozzle due to air leakage does not affect the suction powers of other suction nozzles. Therefore, in the flowchart of FIG. 59, even if the component suction power is decreased, only the speed of the mounting head is decreased without executing the process of stopping the component suction operation (S38).

Furthermore, whereas the gap calculation unit 382 of the component mounter 100 shown in FIG. 54 calculates an area of the gap appeared between the component and the suction nozzle 112a, a leakage parameter may be calculated by calculating a volume of the gap, using a camera for three-dimensional measurement in place of the camera 130, based on the table which indicates a correspondence between the volume of the gap and the leakage parameter.

Whereas the head speed determination unit 384 of the component mounter 100 shown in FIG. 54 calculates a leakage parameter from the area of the gap and determines the transportation speed of the mounting head 112 based on the calculated leakage parameter, the transportation speed of the mounting head 112 may be determined based on a head speed level by storing the correspondence table between the area of the gap and the head speed level as shown in FIG. 63 and obtaining the head speed level directly from the area of the gap.

Figure 64:
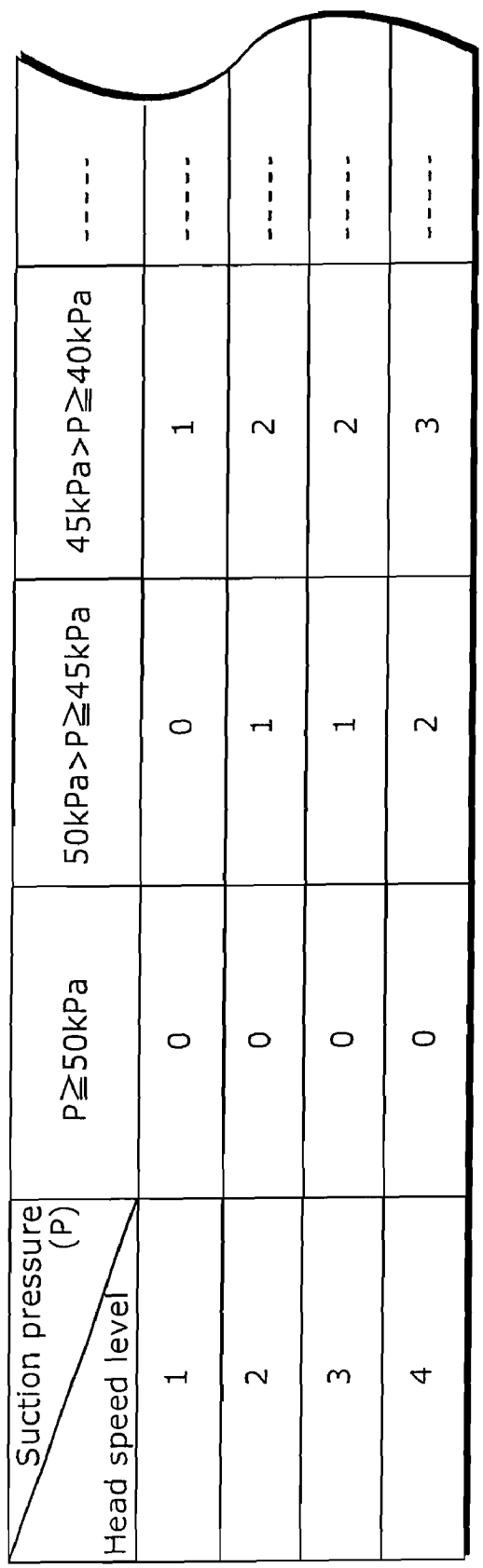
FIG. 64 is a diagram showing an example of a leakage parameter table.

In addition, the head speed determination unit 418 of the component mounter 100 shown in FIG. 56 may determine the speed of the mounting head 112 using the leakage parameter table shown in FIG. 64 instead of the head speed table 420a. The leakage parameter table shown in FIG. 64 is a table which indicates a relationship among the suction pressure measured by the suction pressure sensor 412, the current head speed level of the mounting head 112, and the leakage parameter. For example, when the current suction pressure p is 47 kPa and the head speed level of the mounting head 112 is "2", the leakage parameter is "1". Therefore, the head speed determination unit 418 determines the transportation speed decreased to ten percent from the transportation speed whose head speed level is "2", as a new transportation speed.

Here, the "speed" in the present specification includes "acceleration" so that "speed" may be replaced with "acceleration".

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to a component mounter which mounts components onto a circuit board, and the like.

The invention claimed is:

1. A component mounting condition determination method for use in a component mounter which mounts components, onto a board, using a mounting head having a plurality of suction nozzles, each of the components being one of a plurality of component types, said method comprising:

a condition determination step of obtaining parameters regarding a suction power of each of the suction nozzles to suction the components, and determining a component mounting condition so that the suction nozzles do not drop the components when suctioning the components with the suction power specified by the obtained parameters, and a component mounting step of mounting the components onto the board according to the component mounting condition determined in said condition determining step, by moving the mounting head having the suction nozzles, the board being stationary from a start to an end of the mounting of the components, wherein said condition determination step includes a maximum suction component number determination step of determining, for each of the plurality of component types, a maximum number of components capable of being suctioned by the mounting head to meet a condition that the suction power of each of the suction nozzles is equal to or greater than a transportable suction power, the transportable suction power being a suction power at which the suction nozzles do not drop the components even when the mounting head moves at a predetermined speed, and a leakage parameter input receiving step of receiving, for each of the plurality of component types, an input of a leakage parameter which indicates a degree of an air leakage from each of the suction nozzles, wherein in said maximum suction component number determination step, the maximum number of components capable of being suctioned which corresponds to the received leakage parameter is determined by referring to a maximum suction component number table which indicates a correspondence between the leakage parameter and the maximum number of components capable of being suctioned by the mounting head, and wherein in the component mounting step, the components are mounted onto the board using the mounting head such that an equal number of or a smaller number of components are mounted than the maximum number of components capable of being suctioned determined in the maximum suction component number determination step.

2. The component mounting condition determination method according to claim 1,
wherein said condition determination step further includes a group determination step of determining a group of components to be mounted in one iteration of a series of operations that includes suctioning, transporting, and mounting components by the mounting head, based on the maximum number of components that can be suctioned for each of the plurality of component types determined in said maximum suction component number determination step.

3. The component mounting condition determination method according to claim 1,
wherein said condition determination step includes
a transportation speed decreasing step of decreasing a transportation speed of the mounting head so as to be lower than a predetermined transportation speed, in the case where a suction power of the suction nozzles during component suctioning decreases to be less than a suction power of the suction nozzles in a stationary state.

4. The component mounting condition determination method according to claim 3,
wherein in said transportation speed decreasing step, the transportation speed of the mounting head is decreased in the case where a gap appears between one of the suction nozzles and the component being suctioned by the one of the suction nozzles.

5. The component mounting condition determination method according to claim 3,
wherein said transportation speed decreasing step includes:
a leakage parameter input receiving step of receiving, for each of the component types, an input of a leakage parameter which indicates a degree of a decrease in a transportation speed of the mounting head; and
a decreasing step of decreasing the transportation speed of the mounting head based on the received leakage parameter.

6. The component mounting condition determination method according to claim 3,
wherein said transportation speed decreasing step includes:
an imaging step of taking an image of a suction plane of a component being suctioned by one of the suction nozzles;
a gap calculating step of calculating an amount of a gap which appears between the one of the suction nozzles and the component being suctioned by the one of the suction nozzles;
a suction power obtainment step of obtaining a suction power of the one of the suction nozzles to suction the component, based on the calculated amount of the gap; and
a decreasing step of decreasing the transportation speed of the mounting head based on the obtained suction power.

* * * * *